(12) United States Patent
Lee

(10) Patent No.: US 9,600,122 B2
(45) Date of Patent: Mar. 21, 2017

(54) MOBILE TERMINAL AND METHOD FOR CONTROLLING THE SAME

(71) Applicant: LG ELECTRONICS INC., Seoul (KR)

(72) Inventor: Hanbin Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 47 days.

(21) Appl. No.: 14/506,240

(22) Filed: Oct. 3, 2014

(65) Prior Publication Data

US 2015/0296062 A1  Oct. 15, 2015

(30) Foreign Application Priority Data

Apr. 11, 2014 (KR) ........................ 10-2014-0043804

(51) Int. Cl.
*H04M 1/02* (2006.01)
*G06F 3/041* (2006.01)
(Continued)

(52) U.S. Cl.
CPC .......... *G06F 3/0418* (2013.01); *G02F 1/1368* (2013.01); *G02F 1/13338* (2013.01); *G02F 1/13439* (2013.01); *G02F 1/133345* (2013.01); *G02F 1/133514* (2013.01); *G02F 1/133528* (2013.01); *G06F 1/1643* (2013.01);
(Continued)

(58) Field of Classification Search
CPC .... H04M 1/0266; G06F 3/044; G06F 3/0418; G06F 1/1643; G06F 1/72583
See application file for complete search history.

(56) References Cited

U.S. PATENT DOCUMENTS 9,105,255 B2 *  8/2015  Brown ................. G06F 3/0416
9,158,407 B2 * 10/2015  Coulson ................ G06F 3/044
(Continued)

FOREIGN PATENT DOCUMENTS

EP  1674977 A2   6/2006
EP  1840715 A2  10/2007
(Continued)

OTHER PUBLICATIONS

U.S. Appl. No. 15/153,551, filed May 12, 2016.

*Primary Examiner* — Bobbak Safaipour
(74) *Attorney, Agent, or Firm* — Birch, Stewart, Kolasch & Birch, LLP

(57) ABSTRACT

A mobile terminal including a wireless communication unit configured to provide wireless communication; a body configured to form an external appearance of the terminal; and a touch display unit formed on the body. Further, the touch display unit includes a display panel configured to display screen information, a window formed on the display panel, a first sensing unit and a second sensing unit disposed below the window and configured to sense touch coordinates of a touch input on the window, a deformation region configured to deform with at least one region of the window where the touch input occurs on the window, and a third sensing unit separated from the first sensing unit by interposing the deformation region therebetween. The terminal also includes a controller configured to execute a specific control command based on the touch input sensed by the first through the third sensing units.

14 Claims, 36 Drawing Sheets

(51) Int. Cl.
  *G06F 3/044* (2006.01)
  *G06F 3/0488* (2013.01)
  *G06F 3/0484* (2013.01)
  *G06F 1/16* (2006.01)
  *H04M 1/725* (2006.01)
  *G02F 1/1333* (2006.01)
  *G02F 1/1335* (2006.01)
  *G02F 1/1343* (2006.01)
  *G02F 1/1368* (2006.01)
  *H01L 27/32* (2006.01)

(52) U.S. Cl.
  CPC ............ *G06F 3/044* (2013.01); *G06F 3/0412* (2013.01); *G06F 3/0414* (2013.01); *G06F 3/04847* (2013.01); *G06F 3/04883* (2013.01); *G06F 3/04886* (2013.01); *H01L 27/323* (2013.01); *H04M 1/0266* (2013.01); *H04M 1/72583* (2013.01); *G06F 2203/04102* (2013.01); *G06F 2203/04105* (2013.01); *G06F 2203/04806* (2013.01)

(56) References Cited

U.S. PATENT DOCUMENTS

| | | | |
|---|---|---|---|
| 9,207,818 B2 * | 12/2015 | Kang | ............... G06F 3/044 |
| 2007/0229464 A1 | 10/2007 | Hotelling et al. | |
| 2011/0069010 A1 * | 3/2011 | Yi | ............... G06F 3/0202 345/169 |
| 2012/0038583 A1 | 2/2012 | Westhues et al. | |
| 2013/0131994 A1 | 5/2013 | Birdwell et al. | |
| 2014/0035849 A1 | 2/2014 | Jung et al. | |
| 2014/0062934 A1 | 3/2014 | Coulson et al. | |
| 2014/0148130 A1 | 5/2014 | Rathus et al. | |
| 2014/0225859 A1 | 8/2014 | Badaye et al. | |

FOREIGN PATENT DOCUMENTS

| | | |
|---|---|---|
| EP | 2530677 A2 | 12/2012 |
| WO | WO 2006/013485 A2 | 2/2006 |

* cited by examiner

MOBILE TERMINAL AND METHOD FOR CONTROLLING THE SAME

CROSS-REFERENCE TO A RELATED APPLICATION

Pursuant to 35 U.S.C. §119(a), this application claims the benefit of earlier filing date and right of priority to Korean Application No. 10-2014-0043804, filed in the Republic of Korea on Apr. 11, 2014 the contents of which are incorporated by reference herein in its entirety.

BACKGROUND OF THE INVENTION

1. Field of the Invention

The present invention relates to a mobile terminal and corresponding method for controlling the mobile terminal based on a touch input applied to a display unit.

2. Description of the Related Art

Terminals may be divided into mobile/portable terminals and stationary terminals. Also, the mobile terminals may be classified into handheld terminals and vehicle mounted terminals. A mobile terminal can also capture still images or moving images, play music or video files, play games, receive broadcast and the like, so as to be implemented as an integrated multimedia player.

Further, the mobile terminal includes a touch screen display unit allowing the user to touch the display unit to input information. However, the related art touch input methods are limited in nature and often inconvenient to the user.

SUMMARY OF THE INVENTION

Accordingly, one object of the present invention is to provide a touch display unit for sensing touch coordinates and a touch pressure to more conveniently control various functions.

To achieve these and other advantages and in accordance with the purpose of the present invention, as embodied and broadly described herein, the present invention provides in one aspect a mobile terminal including a wireless communication unit configured to provide wireless communication a body configured to form an external appearance of the terminal a touch display unit formed on the body, wherein the touch display unit includes a display panel configured to display screen information, a window formed on the display panel, a first sensing unit and a second sensing unit disposed below the window and configured to sense touch coordinates of a touch input on the window, a deformation region configured to deform with at least one region of the window where the touch input occurs on the window, and a third sensing unit separated from the first sensing unit by interposing the deformation region therebetween and a controller configured to execute a specific control command based on the touch input sensed by the first through the third sensing units.

In still another aspect, the touch sensing unit includes a first sensing unit configured to receive a current, a second sensing unit configured to output a current delivered from the first sensing unit to sense touch coordinates according to a current change due to a touch input, and a third sensing unit disposed to be separated from the second sensing unit by interposing the deformation region therebetween to allow a current to flow through the seconding sensing unit so as to sense a touch pressure when a thickness of the deformation region is deformed.

The first and the third sensing unit serve as an input stage for receiving a current, and the second sensing unit selectively serves as an output stage for outputting a current from the third sensing unit when a thickness of the deformation region is decreased. In other words, the second sensing unit may be shared as an output stage, thereby sensing the touch coordinates and touch pressure.

In still another aspect, an output stage of the touch sensing unit may be provided therein and an input stage for sensing a touch pressure due to a deformation region which is deformed by an external force may be additionally provided therein, thereby sensing the touch coordinates and touch pressure at the same time.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1A:
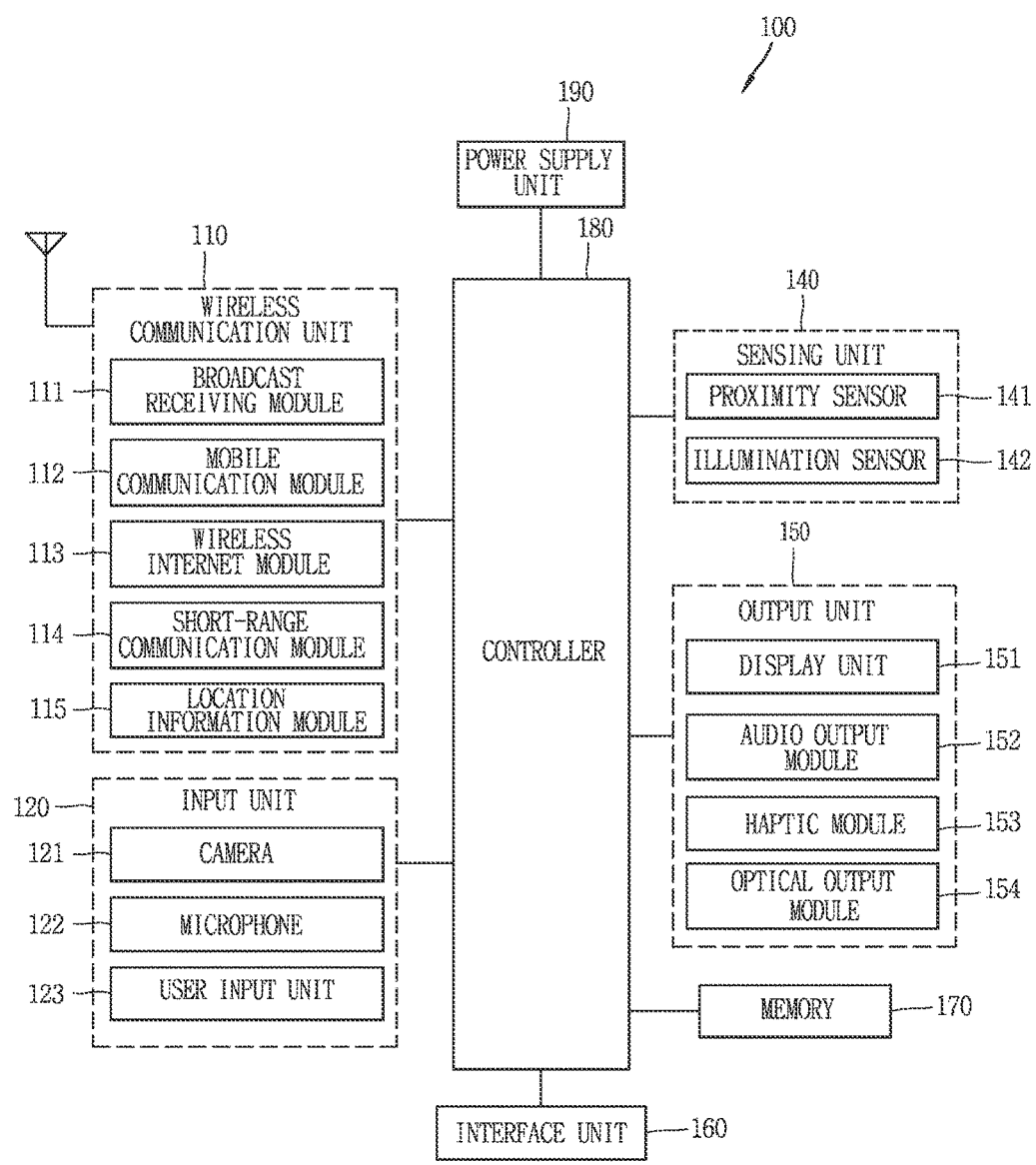
FIG. 1A is a block diagram illustrating a mobile terminal according to an embodiment of the present invention.

Hereinafter, preferred embodiments of the present invention will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. Also, it should be noted that the accompanying drawings are merely illustrated to easily explain the concept of the invention, and therefore, they should not be construed to limit the technological concept disclosed herein by the accompanying drawings.

Although the terms first, second, etc. may be used herein to describe various elements, these elements should not be limited by these terms. These terms are only used to distinguish one element from another. Further, when an element is referred to as being "connected with" another element, the element can be directly connected with the other element or intervening elements may also be present. In contrast, when an element is referred to as being "directly connected with" another element, there are no intervening elements present.

Mobile terminals described herein may include cellular phones, smart phones, laptop computers, digital broadcasting terminals, personal digital assistants (PDAs), portable multimedia players (PMPs), navigators, slate PCs, tablet PCs, ultra books, wearable devices (for example, smart watches, smart glasses, head mounted displays (HMDs)), and the like. However, the configuration according to the embodiments of this specification can also be applied to stationary terminals such as digital TV, desktop computers and the like, excluding a case of being applicable only to the mobile terminals.

Figure 1B:
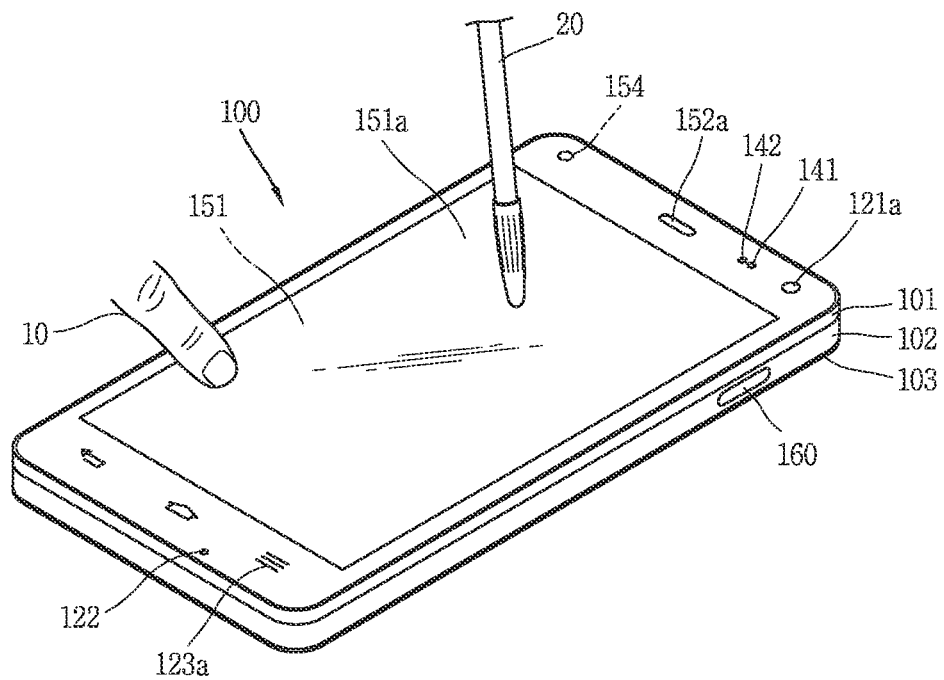
FIGS. 1B and 1C are overviews illustrating a mobile terminal according to an embodiment of the present invention as seen from different directions.
Figure 1C:
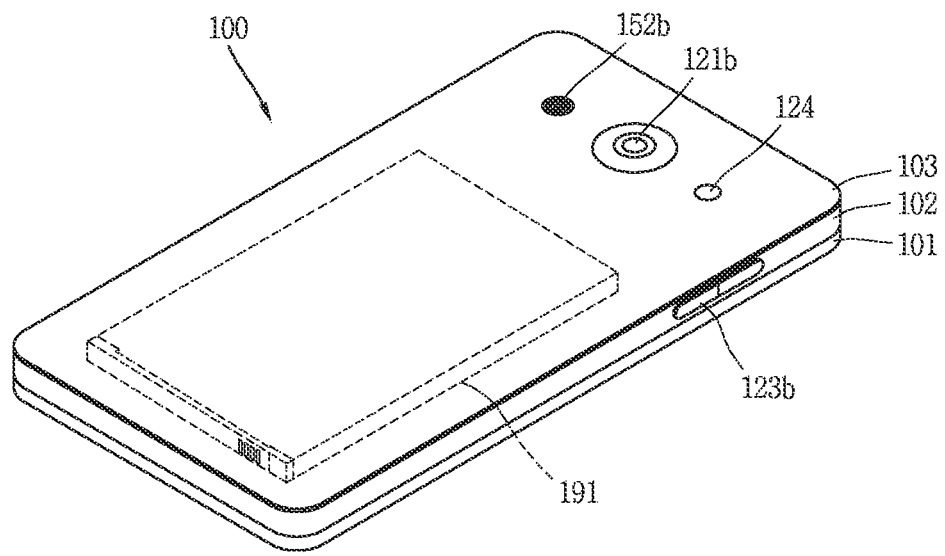

FIG. 1A is a block diagram of a mobile terminal according to an embodiment of the present invention, and FIGS. 1B and 1C are conceptual views of one example of the mobile terminal, viewed from different directions. As shown, the mobile terminal 100 may include components, such as a wireless communication unit 110, an input unit 120, a sensing unit 140, an output unit 150, an interface unit 160, a memory 170, a controller 180, a power supply unit 190 and the like. FIG. 1A illustrates the mobile terminal having various components, but implementing all of the illustrated components is not a requirement. Greater or fewer components may alternatively be implemented.

In more detail, the wireless communication unit 110 typically includes one or more modules which permit wireless communications between the mobile terminal 100 and a wireless communication system, between the mobile terminal 100 and another mobile terminal 100, or between the mobile terminal 100 and a network within which another mobile terminal 100 (or an external server) is located.

For example, the wireless communication unit 110 may include at least one of a broadcast receiving module 111, a mobile communication module 112, a wireless Internet module 113, a short-range communication module 114, a location information module 115 and the like.

The input unit 120 may include a camera 121 for inputting an image signal, a microphone 122 or an audio input module for inputting an audio signal, or a user input unit 123 (for example, a touch key, a push key (or a mechanical key), etc.) for allowing a user to input information. Audio data or image data collected by the input unit 120 may be analyzed and processed by a user's control command.

The sensing unit 140 may include at least one sensor which senses at least one of internal information of the mobile terminal, a surrounding environment of the mobile terminal and user information. For example, the sensing unit 140 may include a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, refer to the camera 121), a microphone 122, a battery gauge, an environment sensor (for example, a barometer, a hygrometer, a thermometer, a radiation detection sensor, a thermal sensor, a gas sensor, etc.), and a chemical sensor (for example, an electronic nose, a health care sensor, a biometric sensor, etc.). Further, the mobile terminal disclosed herein may utilize information in such a manner of combining information sensed by at least two sensors of those sensors.

The output unit 150 is configured to output an audio signal, a video signal or a tactile signal. The output unit 150 may include a display unit 151, an audio output module 152, a haptic module 153, an optical output module 154 and the like. The display unit 151 may have an inter-layered structure or an integrated structure with a touch sensor so as to implement a touch screen. The touch screen may provide an output interface between the mobile terminal 100 and a user, as well as functioning as the user input unit 123 which provides an input interface between the mobile terminal 100 and the user.

The interface unit 160 serves as an interface with various types of external devices connected with the mobile terminal 100. The interface unit 160, for example, may include wired or wireless headset ports, external power supply ports, wired or wireless data ports, memory card ports, ports for connecting a device having an identification module, audio input/output (I/O) ports, video I/O ports, earphone ports, or the like. The mobile terminal 100 may execute an appropriate control associated with a connected external device, in response to the external device being connected to the interface unit 160.

The memory 170 can store a plurality of application programs (or applications) executed in the mobile terminal 100, data for operations of the mobile terminal 100, instruction words, and the like. At least some of those application programs may be downloaded from an external server via wireless communication. Some others of those application programs may be installed within the mobile terminal 100 at the time of being shipped for basic functions of the mobile terminal 100 (for example, receiving a call, placing a call, receiving a message, sending a message, etc.). Further, the application programs may be stored in the memory 170, installed in the mobile terminal 100, and executed by the controller 180 to perform an operation (or a function) of the mobile terminal 100.

The controller 180 typically controls an overall operation of the mobile terminal 100 in addition to the operations associated with the application programs. The controller 180 can provide or process information or functions appropriate for a user by processing signals, data, information and the like, which are input or output by the aforementioned components, or activating the application programs stored in the memory 170.

The controller 180 can control at least part of the components illustrated in FIG. 1A, in order to drive the application programs stored in the memory 170. In addition, the controller 180 can drive the application programs by combining at least two of the components included in the mobile terminal 100 for operation.

The power supply unit 190 can receive external power or internal power and supply appropriate power required for operating respective elements and components included in the mobile terminal 100 under the control of the controller 180. The power supply unit 190 may include a battery, and the battery may be an embedded battery or a replaceable battery.

At least part of those elements and components may be combined to implement operation and control of the mobile terminal or a control method of the mobile terminal according to various embodiments described herein. Also, the operation and control or the control method of the mobile terminal may be implemented in the mobile terminal in such a manner of activating at least one application program stored in the memory 170.

Hereinafter, each aforementioned component will be described in more detail with reference to FIG. 1A, prior to explaining various embodiments implemented by the mobile terminal 100 having the configuration.

First, the wireless communication unit 110 will be described. The broadcast receiving module 111 of the wireless communication unit 110 may receive a broadcast signal and/or broadcast associated information from an external broadcast managing entity via a broadcast channel. The broadcast channel may include a satellite channel and a terrestrial channel. At least two broadcast receiving modules 111 may be provided in the mobile terminal 100 to simultaneously receive at least two broadcast channels or switch the broadcast channels.

The mobile communication module 112 may transmit/receive wireless signals to/from at least one of network entities, for example, a base station, an external mobile terminal, a server, and the like, on a mobile communication network, which is constructed according to technical standards or transmission methods for mobile communications (for example, Global System for Mobile Communication (GSM), Code Division Multi Access (CDMA), Wideband CDMA (WCDMA), High Speed Downlink Packet access (HSDPA), Long Term Evolution (LTE), etc.)

Here, the wireless signals may include audio call signal, video (telephony) call signal, or various formats of data according to transmission/reception of text/multimedia messages. The wireless Internet module 113 denotes a module for wireless Internet access. This module may be internally or externally coupled to the mobile terminal 100. The wireless Internet module 113 may transmit/receive wireless signals via communication networks according to wireless Internet technologies.

Examples of such wireless Internet access may include Wireless LAN (WLAN), Wireless Fidelity (Wi-Fi) Direct, Digital Living Network Alliance (DLNA), Wireless Broadband (Wibro), Worldwide Interoperability for Microwave Access (Wimax), High Speed Downlink Packet Access (HSDPA), Long Term Evolution (LTE), and the like. The wireless Internet module 113 may transmit/receive data according to at least one wireless Internet technology within a range including even Internet technologies which are not aforementioned.

From the perspective that the wireless Internet accesses according to Wibro, HSDPA, GSM, CDMA, WCDMA, LET and the like are executed via a mobile communication network, the wireless Internet module 113 which performs the wireless Internet access via the mobile communication network may be understood as a type of the mobile communication module 112.

The short-range communication module 114 denotes a module for short-range communications. Suitable technologies for implementing the short-range communications may include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, and the like. The short-range communication module 114 may support wireless communications between the mobile terminal 100 and a wireless communication system, between the mobile terminal 100 and another mobile terminal 100, or between the mobile terminal and a network where another mobile terminal 100 (or an external server) is located, via wireless personal area networks.

Here, the other mobile terminal 100 may be a wearable device, for example, a smart watch, a smart glass or a head mounted display (HMD), which can exchange data with the mobile terminal 100 (or to cooperate with the mobile terminal 100). The short-range communication module 114 can sense (recognize) a wearable device, which can communicate with the mobile terminal), near the mobile terminal 100. In addition, when the sensed wearable device is a device which is authenticated to communicate with the mobile terminal 100 according to the present invention, the controller 180 can transmit at least part of data processed in the mobile terminal 100 to the wearable device via the short-range communication module 114. Hence, a user of the wearable device can use the data processed in the mobile terminal 100 on the wearable device. For example, when a call is received in the mobile terminal 100, the user can answer the call using the wearable device. Also, when a message is received in the mobile terminal 100, the user can check the received message using the wearable device.

The location information module 115 denotes a module for detecting or calculating a position of the mobile terminal. An example of the location information module 115 may include a Global Position System (GPS) module or a Wi-Fi module. For example, when the mobile terminal uses the GPS module, a position of the mobile terminal may be acquired using a signal sent from a GPS satellite. As another example, when the mobile terminal uses the Wi-Fi module, a position of the mobile terminal may be acquired based on information related to a wireless access point (AP) which transmits or receives a wireless signal to or from the Wi-Fi module.

Hereinafter, the input unit 120 will be described in more detail. The input unit 120 may be configured to provide an audio or video signal (or information) input to the mobile terminal or information input by a user to the mobile terminal. For the input of the audio information, the mobile terminal 100 may include one or a plurality of cameras 121. The camera 121 may process image frames of still pictures or video obtained by image sensors in a video call mode or a capture mode. The processed image frames may be displayed on the display unit 151. Further, the plurality of cameras 121 disposed in the mobile terminal 100 may be arranged in a matrix configuration. By use of the cameras 121 having the matrix configuration, a plurality of image information having various angles or focal points may be input into the mobile terminal 100. Also, the plurality of cameras 121 may be arranged in a stereoscopic structure to acquire a left image and a right image for implementing a stereoscopic image.

The microphone 122 may process an external audio signal into electric audio data. The processed audio data may be utilized in various manners according to a function being executed in the mobile terminal 100 (or an application program being executed). Further, the microphone 122 may include assorted noise removing algorithms to remove noise generated in the course of receiving the external audio signal.

The user input unit 123 can receive information input by a user. When information is input through the user input unit 123, the controller 180 can control an operation of the mobile terminal 100 to correspond to the input information. The user input unit 123 may include a mechanical input element (or a mechanical key, for example, a button located on a front/rear surface or a side surface of the mobile terminal 100, a dome switch, a jog wheel, a jog switch, etc.), and a touch-sensitive input mechanism. As one example, the touch-sensitive input mechanism may be a virtual key, a soft key or a visual key, which is displayed on a touch screen through software processing, or a touch key which is disposed on a portion except for the touch screen. Further, the virtual key or the visual key may be displayable on the touch screen in various shapes, for example, graphic, text, icon, video or a combination thereof.

The sensing unit 140 can sense at least one of internal information of the mobile terminal, surrounding environment information of the mobile terminal and user information, and generate a sensing signal corresponding to it. The controller 180 can control an operation of the mobile terminal 100 or execute data processing, a function or an operation associated with an application program installed in the mobile terminal based on the sensing signal. Hereinafter, description will be given in more detail of representative sensors of various sensors which may be included in the sensing unit 140.

First, the proximity sensor 141 refers to a sensor to sense presence or absence of an object approaching to a surface to be sensed, or an object disposed near a surface to be sensed, by using an electromagnetic field or infrared rays without a mechanical contact. The proximity sensor 141 may be arranged at an inner region of the mobile terminal covered by the touch screen, or near the touch screen. The proximity sensor 141 may have a longer lifespan and a more enhanced utility than a contact sensor.

The proximity sensor 141, for example, may include a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and so on. When the touch screen is implemented as a capacitance type, the proximity sensor 141 may sense proximity of a pointer to the touch screen by changes of an electromagnetic field, which is responsive to an approach of an object with conductivity. In this instance, the touch screen (touch sensor) may be categorized into a proximity sensor.

Hereinafter, for the sake of brief explanation, a status that the pointer is positioned to be proximate onto the touch screen without contact will be referred to as 'proximity touch,' whereas a status that the pointer substantially comes in contact with the touch screen will be referred to as 'contact touch.' For the position corresponding to the proximity touch of the pointer on the touch screen, such position will correspond to a position where the pointer faces perpendicular to the touch screen upon the proximity touch of the pointer. The proximity sensor 141 can sense proximity touch, and proximity touch patterns (e.g., distance, direction, speed, time, position, moving status, etc.). Further, the controller 180 can process data (or information) corresponding to the proximity touches and the proximity touch patterns sensed by the proximity sensor 141, and output visual information corresponding to the process data on the touch screen. In addition, the controller 180 can control the mobile terminal 100 to execute different operations or process different data (or information) according to whether a touch with respect to the same point on the touch screen is either a proximity touch or a contact touch.

A touch sensor can sense a touch (or touch input) applied onto the touch screen (or the display unit 151) using at least one of various types of touch methods, such as a resistive type, a capacitive type, an infrared type, a magnetic field type, and the like.

As one example, the touch sensor can be configured to convert changes of pressure applied to a specific part of the display unit 151 or a capacitance occurring from a specific part of the display unit 151, into electric input signals. Also, the touch sensor may be configured to sense not only a touched position and a touched area, but also touch pressure. Here, a touch object is an object to apply a touch input onto the touch sensor. Examples of the touch object may include a finger, a touch pen, a stylus pen, a pointer or the like.

When touch inputs are sensed by the touch sensors, corresponding signals may be transmitted to a touch controller. The touch controller can process the received signals, and then transmit corresponding data to the controller 180. Accordingly, the controller 180 can sense which region of the display unit 151 has been touched. Here, the touch controller may be a component separate from the controller 180 or the controller 180 itself.

Further, the controller 180 can execute a different control or the same control according to a type of an object which touches the touch screen (or a touch key provided in addition to the touch screen). Whether to execute the different control or the same control according to the object which gives a touch input may be decided based on a current operating state of the mobile terminal 100 or a currently executed application program.

Meanwhile, the touch sensor and the proximity sensor may be executed individually or in combination, to sense various types of touches, such as a short (or tap) touch, a long touch, a multi-touch, a drag touch, a flick touch, a pinch-in touch, a pinch-out touch, a swipe touch, a hovering touch, and the like.

An ultrasonic sensor may be configured to recognize position information relating to a sensing object by using ultrasonic waves. The controller 180 can calculate a position of a wave generation source based on information sensed by an illumination sensor and a plurality of ultrasonic sensors.

Since light is much faster than ultrasonic waves, a time for which the light reaches the optical sensor may be much shorter than a time for which the ultrasonic wave reaches the ultrasonic sensor. The position of the wave generation source may be calculated using the fact. In more detail, the position of the wave generation source may be calculated by using a time difference from the time that the ultrasonic wave reaches based on the light as a reference signal.

The camera 121 constructing the input unit 120 may be a type of camera sensor. The camera sensor may include at least one of a photo sensor and a laser sensor. The camera 121 and the laser sensor may be combined to detect a touch of the sensing object with respect to a 3D stereoscopic image. The photo sensor may be laminated on the display device. The photo sensor may be configured to scan a movement of the sensing object in proximity to the touch screen. In more detail, the photo sensor may include photo diodes and transistors at rows and columns to scan content placed on the photo sensor by using an electrical signal which changes according to the quantity of applied light. Namely, the photo sensor may calculate the coordinates of the sensing object according to variation of light to thus obtain position information of the sensing object.

The display unit 151 can display information processed in the mobile terminal 100. For example, the display unit 151 can display execution screen information of an application program driven in the mobile terminal 100 or user interface (UI) and graphic user interface (GUI) information in response to the execution screen information.

The display unit 151 may also be implemented as a stereoscopic display unit for displaying stereoscopic images. The stereoscopic display unit may employ a stereoscopic display scheme such as stereoscopic scheme (a glass scheme), an auto-stereoscopic scheme (glassless scheme), a projection scheme (holographic scheme), or the like.

The audio output module 152 can output audio data received from the wireless communication unit 110 or stored in the memory 160 in a call signal reception mode, a call mode, a record mode, a voice recognition mode, a broadcast reception mode, and the like. Also, the audio output module 152 may also provide audible output signals related to a particular function (e.g., a call signal reception sound, a message reception sound, etc.) performed by the mobile terminal 100. The audio output module 152 may include a receiver, a speaker, a buzzer or the like.

A haptic module 153 can generate various tactile effects user may feel. A typical example of the tactile effect generated by the haptic module 153 may be vibration. Strength, pattern and the like of the vibration generated by the haptic module 153 may be controllable by a user selection or setting of the controller. For example, the haptic module 153 may output different vibrations in a combining manner or a sequential manner.

Besides vibration, the haptic module 153 can generate various other tactile effects, including an effect by stimulation such as a pin arrangement vertically moving with respect to a contact skin, a spray force or suction force of air through a jet orifice or a suction opening, a touch on the skin, a contact of an electrode, electrostatic force, etc., an effect by reproducing the sense of cold and warmth using an element that can absorb or generate heat, and the like.

The haptic module 153 may be implemented to allow the user to feel a tactile effect through a muscle sensation such as the user's fingers or arm, as well as transferring the tactile effect through a direct contact. Two or more haptic modules 153 may be provided according to the configuration of the mobile terminal 100.

An optical output module 154 can output a signal for indicating an event generation using light of a light source. Examples of events generated in the mobile terminal 100 include a message reception, a call signal reception, a missed call, an alarm, a schedule notice, an email reception, an information reception through an application, and the like.

A signal output by the optical output module 154 may be implemented so the mobile terminal emits monochromatic light or light with a plurality of colors. The signal output may be terminated as the mobile terminal senses a user's event checking.

The interface unit 160 serves as an interface with every external device connected with the mobile terminal 100. For example, the interface unit 160 may receive data transmitted from an external device, receive power to transfer to each element within the mobile terminal 100, or transmit internal data of the mobile terminal 100 to an external device. For example, the interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. In addition, the device having the identification module (referred to as 'identifying device', hereinafter) may take the form of a smart card. Accordingly, the identifying device may be connected with the terminal 100 via the interface unit 160.

When the mobile terminal 100 is connected with an external cradle, the interface unit 160 may serve as a passage to allow power from the cradle to be supplied to the mobile terminal 100 therethrough or may serve as a passage to allow various command signals input by the user from the cradle to be transferred to the mobile terminal therethrough. Various command signals or power input from the cradle may operate as signals for recognizing that the mobile terminal is properly mounted on the cradle.

The memory 170 can store programs for operations of the controller 180 and temporarily store input/output data (for example, phonebook, messages, still images, videos, etc.). The memory 170 may store data related to various patterns of vibrations and audio which are output in response to touch inputs on the touch screen.

The memory 170 may include at least one type of storage medium including a Flash memory, a hard disk, a multimedia card micro type, a card-type memory (e.g., SD or DX memory, etc), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, and an optical disk. Also, the mobile terminal 100 may be operated in relation to a web storage device that performs the storage function of the memory 170 over the Internet.

As aforementioned, the controller 180 can typically control the general operations of the mobile terminal 100. For example, the controller 180 can set or release a lock state for restricting a user from inputting a control command with respect to applications when a status of the mobile terminal meets a preset condition.

The controller 180 can also perform controlling and processing associated with voice calls, data communications, video calls, and the like, or perform pattern recognition processing to recognize a handwriting input or a picture drawing input performed on the touch screen as characters or images, respectively. In addition, the controller 180 can control one or a combination of those components in order to implement various embodiment disclosed herein on the mobile terminal 100.

The power supply unit 190 can receive external power or internal power and supply appropriate power required for operating respective elements and components included in the mobile terminal 100 under the control of the controller 180. The power supply unit 190 may include a battery. The battery may be an embedded battery which is rechargeable or be detachably coupled to the terminal body for charging.

The power supply unit 190 may also include a connection port. The connection port may be configured as one example of the interface unit 160 to which an external (re)charger for supplying power to recharge the battery is electrically connected. As another example, the power supply unit 190 may be configured to recharge the battery in a wireless manner without use of the connection port. Here, the power supply unit 190 may receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable or its similar medium using, for example, software, hardware, or any combination thereof.

Referring to FIGS. 1B and 1C, the mobile terminal 100 disclosed herein may be provided with a bar-type terminal body. However, the present invention is not limited to this, but is also applicable to various structures such as watch type, clip type, glasses type or folder type, flip type, slide type, swing type, swivel type, or the like, in which two and more bodies are combined with each other in a relatively movable manner.

The mobile terminal 100 may include a case (casing, housing, cover, etc.) forming the appearance of the terminal. In this embodiment, the case may be divided into a front case 101 and a rear case 102. Various electronic components may be incorporated into a space formed between the front case 101 and the rear case 102. At least one middle case may be additionally disposed between the front case 101 and the rear case 102.

A display unit 151 may be disposed on a front surface of the terminal body to output information. As illustrated, a window 151a of the display unit 151 may be mounted to the front case 101 so as to form the front surface of the terminal body together with the front case 101.

In some instances, electronic components may also be mounted to the rear case 102. Examples of those electronic components mounted to the rear case 102 may include a detachable battery, an identification module, a memory card and the like. Here, a rear cover 103 for covering the electronic components mounted may be detachably coupled to the rear case 102. Therefore, when the rear cover 103 is detached from the rear case 102, the electronic components mounted to the rear case 102 may be externally exposed.

As illustrated, when the rear cover 103 is coupled to the rear case 102, a side surface of the rear case 102 may be partially exposed. In some cases, upon the coupling, the rear case 102 may also be completely shielded by the rear cover 103. Further, the rear cover 103 may include an opening for externally exposing a camera 121b or an audio output module 152b. The cases 101, 102, 103 may be formed by injection-molding synthetic resin or may be formed of a metal, for example, stainless steel (STS), titanium (Ti), or the like.

Unlike the example which the plurality of cases form an inner space for accommodating such various components, the mobile terminal 100 may be configured such that one case forms the inner space. In this example, a mobile terminal 100 having a uni-body formed so synthetic resin or metal extends from a side surface to a rear surface may also be implemented.

Further, the mobile terminal 100 may include a waterproofing unit for preventing an introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The mobile terminal 100 may include a display unit 151, first and second audio output modules 152a and 152b, a proximity sensor 141, an illumination sensor 142, an optical output module 154, first and second cameras 121a and 121b, first and second manipulation units 123a and 123b, a microphone 122, an interface unit 160 and the like.

Hereinafter, description will be given of a mobile terminal 100 that the display unit 151, the first audio output module 152a, the proximity sensor 141, the illumination sensor 142, the optical output module 154, the first camera 121a and the first manipulation unit 123a are disposed on the front surface of the terminal body, the second manipulation unit 123b, the microphone 122 and the interface unit 160 are disposed on a side surface of the terminal body, and the second audio output module 152b and the second camera 121b are disposed on a rear surface of the terminal body, with reference to FIGS. 1B and 1C.

Here, those components are not limited to this arrangement, but may be excluded or arranged on another surface if necessary. For example, the first manipulation unit 123a may not be disposed on the front surface of the terminal body, and the second audio output module 152b may be disposed on the side surface other than the rear surface of the terminal body.

The display unit 151 can output information processed in the mobile terminal 100. For example, the display unit 151 may display execution screen information of an application program driven in the mobile terminal 100 or user interface (UI) and graphic user interface (GUI) information in response to the execution screen information.

The display unit 151 may include at least one of a liquid crystal display (LCD), a thin film transistor-liquid crystal display (TFT-LCD), an organic light emitting diode (OLED), a flexible display, a 3-dimensional (3D) display, and an e-ink display. The display unit 151 may be implemented in two or more in number according to a configured aspect of the mobile terminal 100. For instance, a plurality of the display units 151 may be arranged on one surface to be spaced apart from or integrated with each other, or may be arranged on different surfaces.

The display unit 151 may include a touch sensor which senses a touch onto the display unit so as to receive a control command in a touching manner. When a touch is input to the display unit 151, the touch sensor may be configured to sense this touch and the controller 180 can generate a control command corresponding to the touch. The content which is input in the touching manner may be a text or numerical value, or a menu item which can be indicated or designated in various modes.

The touch sensor may be configured in a form of film having a touch pattern. The touch sensor may be a metal wire, which is disposed between the window 151a and a display on a rear surface of the window 151a or patterned directly on the rear surface of the window 151a. Or, the touch sensor may be integrally formed with the display. For example, the touch sensor may be disposed on a substrate of the display or within the display.

The display unit 151 may form a touch screen together with the touch sensor. Here, the touch screen may serve as the user input unit 123 (see FIG. 1A). Therefore, the touch screen may replace at least some of functions of the first manipulation unit 123a.

The first audio output module 152a may be implemented in the form of a receiver for transferring voice sounds to the user's ear or a loud speaker for outputting various alarm sounds or multimedia reproduction sounds. The window 151a of the display unit 151 may include a sound hole for emitting sounds generated from the first audio output module 152a. Here, the present invention may not be limited to this. It may also be configured such that the sounds are released along an assembly gap between the structural bodies (for example, a gap between the window 151a and the front case 101). In this instance, a hole independently formed to output audio sounds may not be seen or hidden in terms of appearance, thereby further simplifying the appearance of the mobile terminal 100.

The optical output module 154 can output light for indicating an event generation. Examples of the event generated in the mobile terminal 100 include a message reception, a call signal reception, a missed call, an alarm, a schedule notice, an email reception, information reception through an application, and the like. When a user's event checking is sensed, the controller 180 can control the optical output unit 154 to stop the output of the light.

The first camera 121a can process video frames such as still or moving images obtained by the image sensor in a video call mode or a capture mode. The processed video frames may then be displayed on the display unit 151 or stored in the memory 170.

The first and second manipulation units 123a and 123b are examples of the user input unit 123, which may be manipulated by a user to input a command for controlling the operation of the mobile terminal 100. The first and second manipulation units 123a and 123b may also be commonly referred to as a manipulating portion, and may employ any method if it is a tactile manner allowing the user to perform manipulation with a tactile feeling such as touch, push, scroll or the like.

The drawings illustrate the first manipulation unit 123a is a touch key, but the present invention is not limited to this. For example, the first manipulation unit 123a may be configured with a mechanical key, or a combination of a touch key and a push key.

The content received by the first and second manipulation units 123a and 123b may be set in various ways. For example, the first manipulation unit 123a may be used by the user to input a command such as menu, home key, cancel, search, or the like, and the second manipulation unit 123b may be used by the user to input a command, such as controlling a volume level being output from the first or second audio output module 152a or 152b, switching into a touch recognition mode of the display unit 151, or the like.

Further, as another example of the user input unit 123, a rear input unit may be disposed on the rear surface of the terminal body. The rear input unit may be manipulated by a user to input a command for controlling an operation of the mobile terminal 100. The content input may be set in various ways. For example, the rear input unit may be used by the user to input a command, such as power on/off, start, end, scroll or the like, controlling a volume level being output from the first or second audio output module 152a or 152b, switching into a touch recognition mode of the display unit 151, or the like. The rear input unit may be implemented into a form allowing a touch input, a push input or a combination thereof.

The rear input unit may be disposed to overlap the display unit 151 of the front surface in a thickness direction of the terminal body. As one example, the rear input unit may be disposed on an upper end portion of the rear surface of the terminal body such that a user can easily manipulate it using a forefinger when the user grabs the terminal body with one hand. However, the present invention may not be limited to this, and the position of the rear input unit may be changeable.

When the rear input unit is disposed on the rear surface of the terminal body, a new user interface can be implemented using the rear input unit. Also, the aforementioned touch screen or the rear input unit can substitute for at least part of functions of the first manipulation unit 123a located on the front surface of the terminal body. Accordingly, when the first manipulation unit 123a is not disposed on the front surface of the terminal body, the display unit 151 may be implemented to have a larger screen.

Further, the mobile terminal 100 may include a finger scan sensor which scans a user's fingerprint. The controller 180 can use fingerprint information sensed by the finger scan sensor as an authentication mechanism. The finger scan sensor may be installed in the display unit 151 or the user input unit 123.

The microphone 122 may be formed to receive the user's voice, other sounds, and the like. The microphone 122 may be provided at a plurality of places, and configured to receive stereo sounds. Further, the interface unit 160 may serve as a path allowing the mobile terminal 100 to exchange data with external devices. For example, the interface unit 160 may be at least one of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b may be further mounted to the rear surface of the terminal body. The second camera 121b may have an image capturing direction, which is substantially opposite to the direction of the first camera unit 121a. The second camera 121b may include a plurality of lenses arranged along at least one line. The plurality of lenses may also be arranged in a matrix configuration. The cameras may be referred to as an 'array camera.' When the second camera 121b is implemented as the array camera, images may be captured in various manners using the plurality of lenses and images with better qualities may be obtained.

A flash 124 may be disposed adjacent to the second camera 121b. When an image of a subject is captured with the camera 121b, the flash 124 may illuminate the subject. The second audio output module 152b may further be disposed on the terminal body. The second audio output module 152b may implement stereophonic sound functions in conjunction with the first audio output module 152a (refer to FIG. 1A), and may be also used for implementing a speaker phone mode for call communication.

At least one antenna for wireless communication may be disposed on the terminal body. The antenna may be installed in the terminal body or formed on the case. For example, an antenna which configures a part of the broadcast receiving module 111 may be retractable into the terminal body. Alternatively, an antenna may be formed in a form of film to be attached onto an inner surface of the rear cover 103 or a case including a conductive material may serve as an antenna.

A power supply unit 190 for supplying power to the mobile terminal 100 may be disposed on the terminal body. The power supply unit 190 may include a batter 191 which is mounted in the terminal body or detachably coupled to an outside of the terminal body.

The battery 191 may receive power via a power source cable connected to the interface unit 160. Also, the battery 191 may be (re)chargeable in a wireless manner using a wireless charger. The wireless charging may be implemented by magnetic induction or electromagnetic resonance.

Further, the drawing illustrates that the rear cover 103 is coupled to the rear case 102 for shielding the battery 191, so as to prevent separation of the battery 191 and protect the battery 191 from an external impact or foreign materials. When the battery 191 is detachable from the terminal body, the rear case 103 may be detachably coupled to the rear case 102.

An accessory for protecting an appearance or assisting or extending the functions of the mobile terminal 100 may further be provided on the mobile terminal 100. As one example of the accessory, a cover or pouch for covering or accommodating at least one surface of the mobile terminal 100 may be provided. The cover or pouch may cooperate with the display unit 151 to extend the function of the mobile terminal 100. Another example of the accessory may be a touch pen for assisting or extending a touch input onto a touch screen.

Figure 1D:
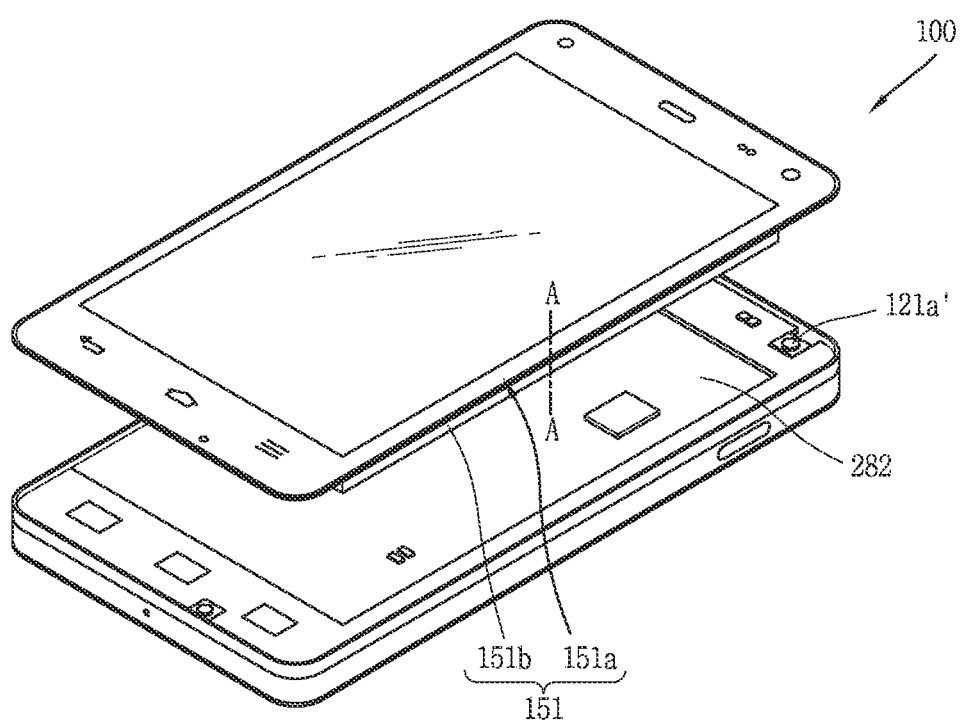
FIG. 1D is an exploded view of FIG. 1B.

Referring to FIG. 1D, a unit capable of creating the touch display unit 151 may be formed on the front case 101. The display unit 151 may be formed in a plate shape corresponding to the unit. The display unit 151 according to an embodiment of the present invention may include a transparent window unit 151a formed with a tempered glass or the like to constitute an external appearance of the mobile terminal 100, and a display unit 151b formed at a lower portion of the window unit to display visual information through the window unit. The touch display unit 151 may further include a touch sensing unit for sensing a user's touch input.

A printed circuit board is mounted within the terminal body, and a plurality of electronic components for operating the functions of the mobile terminal are mounted on the printed circuit board. A region of the window unit 151a for displaying the visual information of the display unit 151b may be formed in a transparent manner, and is defined as a display region of the display. The remaining region surrounding the display region may be formed in a non-transparent manner to hide the mounted components therein and is defined as a surrounding region.

An audio output hole through which audio output from the first audio output unit 153a passes and a camera hole 121a' through which capture information passes toward the first camera 121a are formed on the surrounding region. A printed circuit board 282 is also shown.

The touch sensing unit contained in the touch display unit 151 senses a user's touch input applied to the window unit 151a of the touch display unit 151. The touch sensing unit may sense a touch pressure pressing the touch display unit 151 along with a region (i.e., touch coordinates) on which the touch input is applied to the window unit 151a.

Hereinafter, the configuration of a touch sensing unit formed to sense touch coordinates and a touch pressure according to a user's touch input will be described with reference to FIG. 2.

FIG. 2(a) is a conceptual view illustrating a touch sensing method of a touch sensing unit for sensing touch coordinates and a touch pressure according to an embodiment. As shown, the touch sensing unit according to an embodiment includes a first input electrode pattern (Tx_XY), a second input electrode pattern (Tx_Z) and an output electrode pattern (Rx). The first input electrode pattern (Tx_XY), second input electrode pattern (Tx_Z) and output electrode pattern (Rx) are formed to constitute different layers, and the output electrode pattern (Rx) is formed between the first and the second input electrode pattern (Tx_XY, Tx_Z).

A current delivered from the first and the second input electrode pattern (Tx_XY, Tx_Z) is output. The current is delivered to the circuit board 282 via a flexible circuit board 283 to generate a control signal. Accordingly, it is possible to sense a touch input according to a change of current being output to the output electrode pattern (Rx).

For example, referring to FIG. 1B, when a conductor such as a finger 10 (or touch pen) is located adjacent to the touch display unit 151, a partial current of the first input electrode pattern (Tx_XY) is delivered to the finger or the like, thereby varying a current value being output by the output electrode pattern (Rx). However, a current is unable to flow through a non-conductor 20, and thus the touch sensing unit cannot calculate the touch coordinates of the non-conductor 20.

The first input electrode pattern (Tx_XY) may be formed with a plurality of electrode lines extended in a first direction (D1), and the output electrode pattern (Rx) may be formed with a plurality of electrode lines extended in a second direction (D2). The first and the second direction (D1, D2) are substantially perpendicular to each other, and thus the touch sensing unit can calculate touch coordinates using the first input electrode pattern (Tx_XY) and the output electrode pattern (Rx).

Further, the second input electrode pattern (Tx_Z) is formed of a plurality of electrode lines extended in the first direction (D1). Here, the electrode lines are formed by depositing indium tin oxide (ITO) on one surface of a base substrate or another constituent element constituting the touch display unit 151. The electrode patterns may be formed with a sputtering technique.

The second input electrode pattern (Tx_Z) is disposed to vary a distance to the output electrode pattern (Rx) by an external force delivered from the window unit 151a. Referring to FIGS. 2(a) and 2(b), when a distance between the second input electrode pattern (Tx_Z) and the output electrode pattern (Rx) is relatively farther away, current is not output through the output electrode pattern (Rx) from the second input electrode pattern (Tx_Z). However, when the second input electrode pattern (Tx_Z) is close to the output electrode pattern (Rx), the current of the second input electrode pattern (Tx_Z) as well as the current of the first input electrode pattern (Tx_XY) are output through the output electrode pattern (Rx). Accordingly, when the current of the first and the second input electrode pattern (Tx_XY, Tx_Z) is output using the output electrode pattern (Rx), the touch sensing unit can sense the touch coordinates and touch pressure of the touch input.

Further, to the extent that the second input electrode pattern (Tx_Z) is close to the output electrode pattern (Rx), an amount of current output through the output electrode pattern (Rx) increases, thereby allowing the touch sensing unit to sense a level of the touch pressure and a change of the touch pressure. In other words, according to an embodiment of the present embodiment, the output electrode pattern (Rx) is formed to output both currents of the first and the second input electrode pattern (Tx_XY, Tx_Z). However, the touch sensing unit may include one input electrode pattern and two output electrode patterns. In other words, two output electrode patterns may be disposed by interposing the input electrode pattern therebetween.

Referring to FIG. 1B, the touch sensing unit may sense a touch pressure applied to the touch display unit using the non-conductor 20. Accordingly, a mobile terminal according to the present embodiment can sense a touch pressure using a non-conductor as well as touch coordinates and a touch pressure sensed by a conductor. A touch sensing unit according to the present invention is also applicable to various types of touch display units.

Figure 3A:
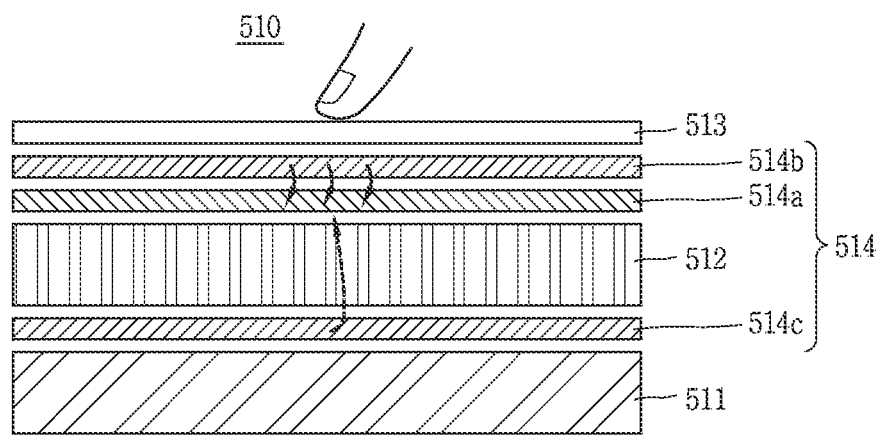
FIGS. 3A and 3B are partial cross-sectional views of FIG. 2 cut along line A-A to illustrate the structure of a touch display unit according to an embodiment.

Hereinafter, the structure and control method of a touch display unit for sensing a touch input according to the present invention will be described. In particular, FIG. 3A is a partial cross-sectional view illustrating the structure of a touch display unit 510 according to an embodiment. Here, the touch display unit 510 may include a display unit for displaying visual information and a touch sensing unit for sensing a user's touch input. The display unit and the touch sensing unit may be formed in one configuration or integrally formed by an adhesive member.

Figure 3B:
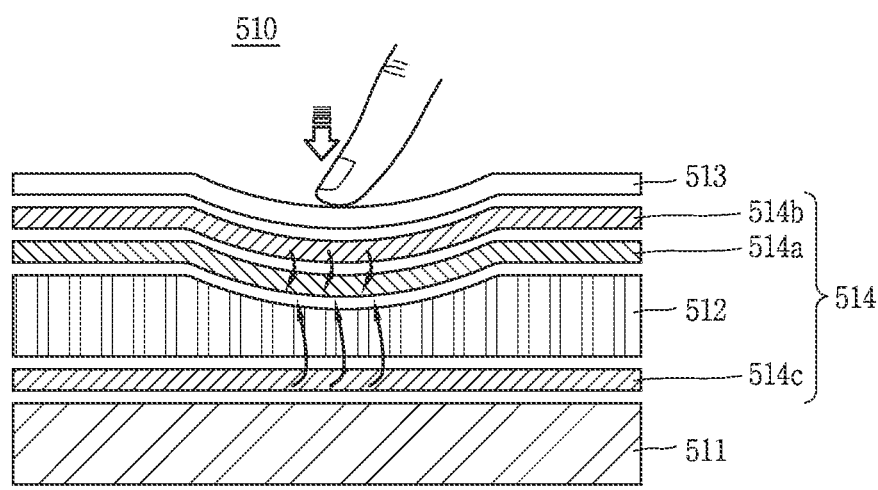

Referring to FIGS. 3A and 3B, the touch display unit 510 includes a display panel 511, a deformation region 512, a window 513 and a touch sensing unit 514. The display panel 511 may be implemented with a liquid crystal display (LCD). The display panel 511 can also be disposed within the terminal body to emit light based on an electrical signal according to a user's control command. Visual information is displayed using the display panel 511.

The window 513 is formed on the display panel 511 to constitute an external appearance of the mobile terminal body. The window 513 may directly receive a user's touch input, and be made of a tempered glass. The window 513 is preferably formed of a material that can be deformed (or warped) when a pressure greater than a preset reference value is applied by the user.

The deformation region 512 is formed between the window 513 and the display panel 511. The deformation region 512 is formed such that part of the deformation region 512 is deformable by an external force applied to the window 513. The deformation region 512 may be formed of a liquid layer such as water, alcohol or the like, a gas layer such as helium, air or the like, or a gel. However, when the deformation region 512 is formed of a gas or the like, a space formed by the gas is compressed by the external force or the gas is leaked into a specific space, and thus the deformation of other constituent elements constituting the touch display unit 510 occurs in a relative manner by the external force. In particular, constituent elements (the window 513, a first and a second sensing layer 514a, 514b in FIG. 3A) disposed adjacent to a region (i.e., external appearance of the mobile terminal) to which the external force is applied are deformed based on the deformation region 512.

The touch sensing unit 514 may include a coordinate sensing unit for sensing a touch position (a coordinate point on the touch display unit 151) on the window 513 at which the capacitance is changed by a user's finger 10 applied to the window 513 and a pressure sensing unit for sensing a change of capacitance due to the deformation of the window 513 to recognize a touch pressure.

The touch sensing unit 514 includes a first sensing layer 514a, a second sensing layer 514b, and a third sensing layer 514c. The first sensing layer 514a serves as an output electrode pattern (Rx) which is a current output stage, and the second and the third sensing layer 514b, 514c functions as a touch layer (Tx) which is a current input stage. A current is applied to the second and the third sensing layer 514b, 514c and the applied current is output through the first sensing layer 514a.

The second sensing layer 514b is formed at a lower portion of the window 513, and the first sensing layer 514a is formed at a lower portion of the second sensing layer 514b. When the user's finger is touched on the window 513, an electric field is formed by the finger, and the formation of the electric field is sensed by a change of capacitance output through the first sensing layer 514a.

The first sensing layer 514a and the second sensing layer 514b are formed of a plurality of sensing lines, respectively, and the sensing lines of the first sensing layer 514a may be extended perpendicular to the sensing lines of the 514b. Accordingly, a capacitance is formed at each position at which the sensing lines are crossed with each other. The first and the second sensing layer 514a, 514b sense a touch position at which a change of capacitance has occurred. Consequently, the controller 180 can recognize touch coordinates that have received a user's touch input on the touch display unit 151.

The deformation region 512 and the third sensing layer 514c are disposed between the first sensing layer 514a and the display panel 511. The third sensing layer 514c is formed adjacent to the display panel 511, and the deformation region 512 is formed between the first and the second sensing layer 514a, 514b. The deformation region 512 is formed with a preset thickness. For example, the deformation region 512 is formed of a preset thickness when the deformation region 512 is formed of a solid, and a space between the first and the third sensing layer 514a, 154c is formed with a preset thickness when the deformation region 512 is formed of a liquid or gas.

Accordingly, the first and the second sensing layer 514a, 514b are adjacent to each other, and the first and the third sensing layer 514a, 154c are disposed to be separated from each other by the deformation region 512 in a relative manner. As a result, a current delivered from the second sensing layer 514b is output through the first sensing layer 514a, but most of the current delivered from the third sensing layer 514c is not delivered to the first sensing layer 514a.

In this instance, the third sensing layer 514c can function as a ground (GND) to reduce the noise of the touch sensing unit due to a current generated from the display panel 511. Accordingly, when an external force above a preset intensity threshold is not applied to the window 513 and thus the deformation region 512 is not deformed, only a change of capacitance on the first and the second sensing layer 514a, 514b occurs due to a thickness of the deformation region 512.

Further, referring to FIG. 3B, when an external force above a preset value is applied to the window 513, a region of the window 513 is deformed. As a result, a force is delivered to the deformation region 512 to deform one region of the deformation region 512, and reduce a thickness of said one region of the deformation region 512 due to the external force.

When the first and the second sensing layer 514a, 514b are deformed along with the deformation region 512 (meanwhile, if a thickness of the deformation region 512 is reduced when the deformation region 512 is formed of a solid), a distance between the first and the third sensing layer 514a, 154c decreases. As a result, a current is output through the first sensing layer 514a from the third sensing layer 514c.

As increasing the external force, one region of the first sensing layer 514a is deformed to draw close to the third sensing layer 514c along with the window 513. Accordingly, an amount of current being output from the third sensing layer 514c to the first sensing layer 514a increases. In other words, a change of touch pressure can be sensed according to an amount of current and a change of the amount of current being output from the third sensing layer 514c to the first sensing layer 514a.

Since a finger is continuously touched on the window 513 while sensing a current being output from the third sensing layer 514c to the 514a, the controller 180 can sense the touch coordinates and touch pressure of a touch input applied to the window 513 at the same time. In other words, the touch display unit 510 is formed such that the second sensing layer 514b senses the XY coordinates of the touch input along with the first sensing layer 514a (Tx-XY), and the third sensing layer 514c senses the Z coordinate of the touch input along with the first sensing layer 514a (Tx-Z). Accordingly, the touch sensing unit can sense a user's three-dimensional touch input.

Furthermore, according to the touch sensing unit according to the present invention, the deformation region 512 may be deformed in response to the external force, thereby sensing a change of the external force.

Further, referring to FIGS. 1B and 3A, even when the window 513 is pressurized by the non-conductor 20 that cannot change an amount of current being output through the first and the second sensing layer 514a, 514b, it is possible to sense the external force. Specifically, when the window 513 and the deformation region 512 are deformed by the non-conductor 20, the controller 180 can sense it due to a change of the amount of current delivered between the first and the third sensing layer 514a, 154c.

Further, the deformation region 512 is formed such that the shape is restored as releasing the external force. The deformation region 512 is restored to its original state by an elastic force to be restored to the original shape of the window 513 or an elastic force of the material itself constituting the deformation region 512. As a result, the user may exert a force while applying a touch input to one region to form various control commands based on the touch region and touch pressure.

Figure 4:
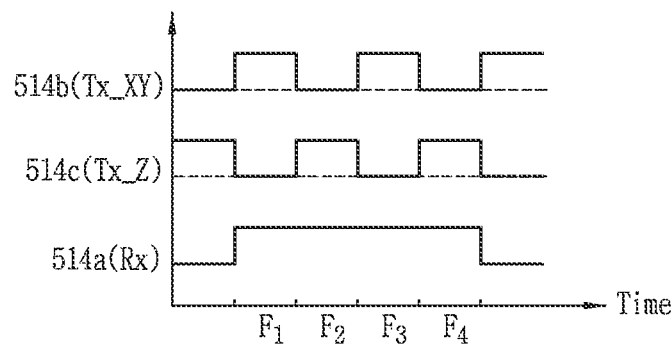
FIG. 4 is a graph illustrating a method of driving sensing layers alternately activated according to an embodiment.

Next, FIG. 4 is a graph illustrating a method of driving sensing layers alternately activated according to an embodiment. The first sensing layer 514a is activated all the time during the first through the fourth frames (F1, F2, F3, F4). The second sensing layer 514b is activated (ON) during the first and the third frame (F1, F3), and deactivated (OFF) during the second and the fourth frame (F2, F4). Meanwhile, the third sensing layer 514c is activated (ON) during the second and the fourth frame (F2, F4), and deactivated (OFF) during the first and the third frame (F1, F3).

In other words, the second and the third sensing layer 514b, 514c are alternately activated to output a current through the first sensing layer 514a. Accordingly, the first sensing layer 514a is driven to output a current through one of the second and the third sensing layer 514b, 514c for each frame. As a result, the confusion of a current delivered from the second and the third sensing layer 514b, 514c can be minimized.

Further, when the second and the third sensing layer 514b, 514c are in an inactive state, namely, when a signal based on the touch input is not generated, the second and the third sensing layer 514b, 514c may be connected to the ground (GND) to perform a function of blocking the noise of the display panel 511. Accordingly, the controller 180 can more accurately sense the touch coordinates and touch pressure, and form the resultant control command.

Figure 5A:
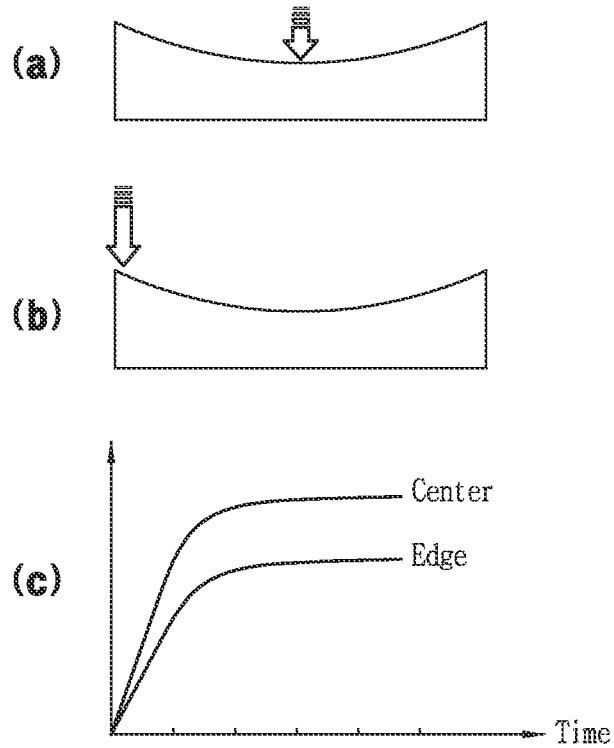
FIG. 5A is conceptual view and FIG. 5B is a flowchart illustrating a method of compensating a touch pressure based on a region to which a touch input is applied.
Figure 5B:
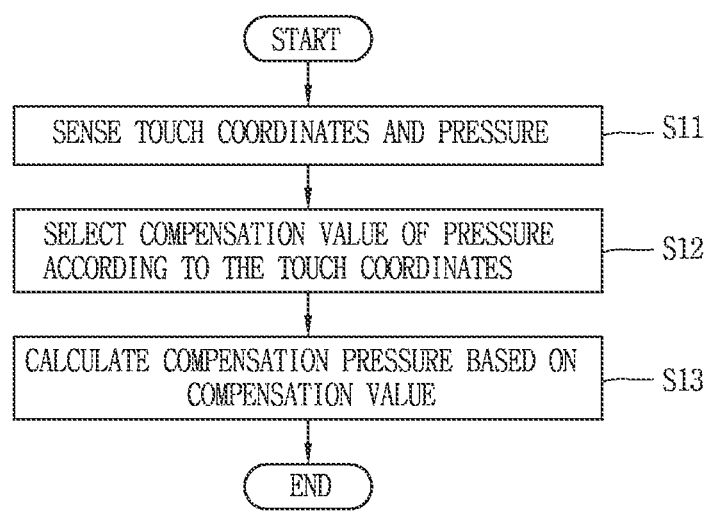

Next, FIGS. 5A and 5B are conceptual views illustrating a method of compensating a touch pressure based on a region to which a touch input is applied. In particular, FIG. 5A is a conceptual view illustrating touch input differences according to a region to which the touch input is applied.

For example, FIGS. 5A(a) and 5A(b) are conceptual views illustrating an external force applied to another region of the window to generate the same touch input. FIG. 5A(a) is a view illustrating a degree of deformation of the window 513 when a first force (F) is applied to a first region which is a central region of the window 513. FIG. 5A(b) is a view illustrating a degree of deformation of the window 513 when a second force (F) is applied to a second region which is adjacent to an edge of the window 513. The degree of deformation is substantially the same in FIGS. 5A(a) and 5A(b). However, the second force applied to the second region corresponds to a force greater than the first force applied to the first region. For example, the second force may correspond to a pressure which is two times greater than that of the first force.

As illustrated in FIG. 5A(c), even when substantially the same external force is applied to the window, the controller 180 can sense it as a larger touch pressure when an external force which is the same as that applied to the edge region is applied a central region thereof. According to the present embodiment, a control command is formed based on a compensation pressure for which the touch pressure is compensated according to a region to which the touch input is applied.

In more detail, FIG. 5B is a flow chart illustrating a method of calculating the compensation pressure. Referring to FIG. 5B, the touch sensing unit 514 senses a touch input applied to the window. The controller 180 senses touch coordinates and a touch pressure using the touch sensing unit 514 (S11).

The controller 180 selects a preset pressure compensation value corresponding to the touch coordinates (S12), and calculates a compensation pressure based on the pressure compensation value (S13). For example, the pressure compensation value may correspond to an increasing value as the touch coordinates are farther away from the central portion of the window, and the compensation pressure may correspond to a pressure value for which the pressure compensation value is added to the touch pressure. As a result, the touch pressure of a touch input for which substantially the same pressure is applied to different regions may be calculated in a substantially the same manner.

Accordingly, along with the touch coordinates of a touch input on the touch display unit 151, a touch pressure compensated by the touch coordinates is sensed at the same time, thereby generating an accurate control command using the touch coordinates and compensation pressure.

A touch display unit according to an embodiment for sensing a user's touch input containing the coordinate information and pressure information by the first through the third sensing layers 514a, 514b, 514c formed between the display panel 511, the deformation region 512 and the window 513, respectively, has been described. Hereinafter, a touch display unit including a configuration for sensing a change of capacitance according to the user's touch and sensing a pressure due to the deformation of a deformation region according to a pressure will be described according to another embodiment.

A mobile terminal according to an embodiment of the present invention may further include a driving circuit for generating a signal due to a touch input using the touch sensing unit. The driving circuit may include an input stage driving circuit and an output stage driving circuit. The input stage driving circuit transmits a channel signal to an input stage formed with the plurality of sensing lines. The driving circuit according to the present invention transmits the input stage channel signal to the plurality of sensing lines, respectively, at substantially the same time. The channel signal entered to the plurality of sensing lines, respectively, may correspond to a signal modulated according to each sensing line.

As a result, it is possible to sense a touch input at a faster speed than that of the technology in which channel signals are sequentially supplied to each sensing line to sense the touch input. Accordingly, even when the sensing layers are alternately activated, the sensing speed of a touch input is not delayed.

Figure 2:
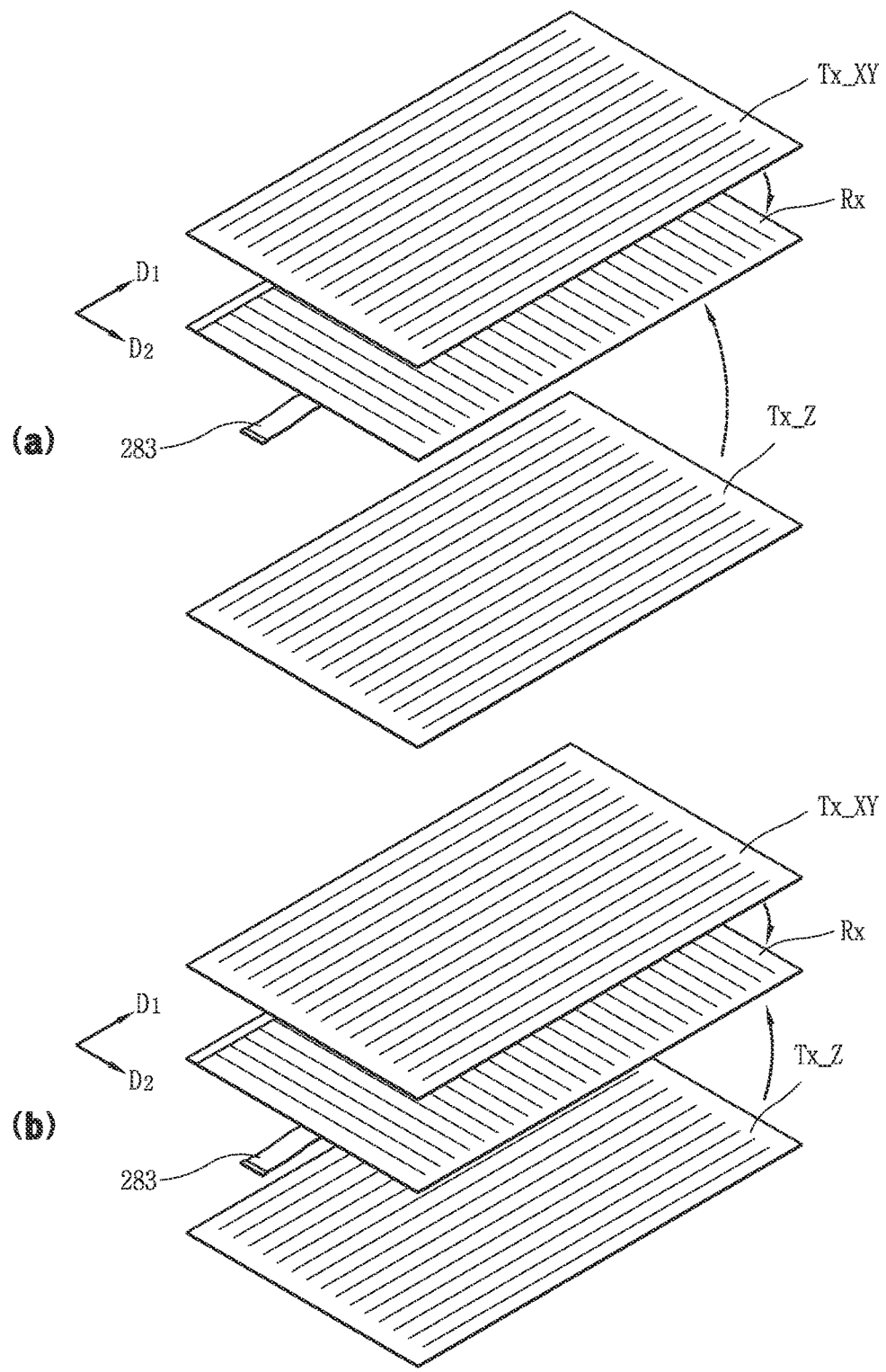
FIG. 2 is a conceptual view illustrating a touch sensing unit formed to sense the touch coordinates and touch pressure of a touch input.
Figure 6A:
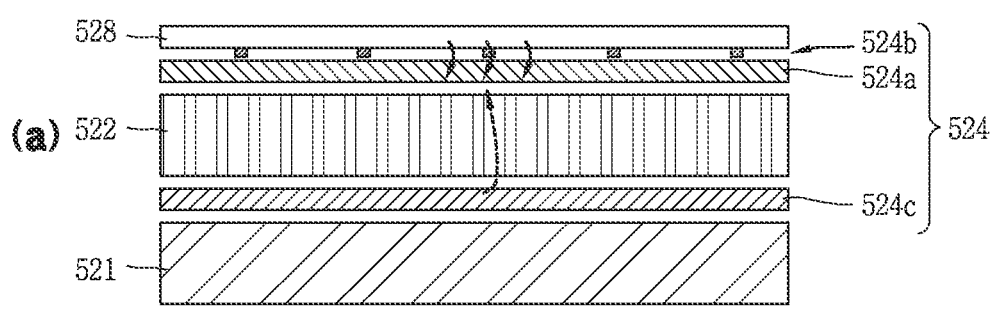
FIGS. 6A and 6B are partial cross-sectional views of FIG. 2, which are cut along line A-A to illustrate a touch display unit including a touch sensing unit formed on a liquid crystal display panel according to another embodiment.
Figure 6A:
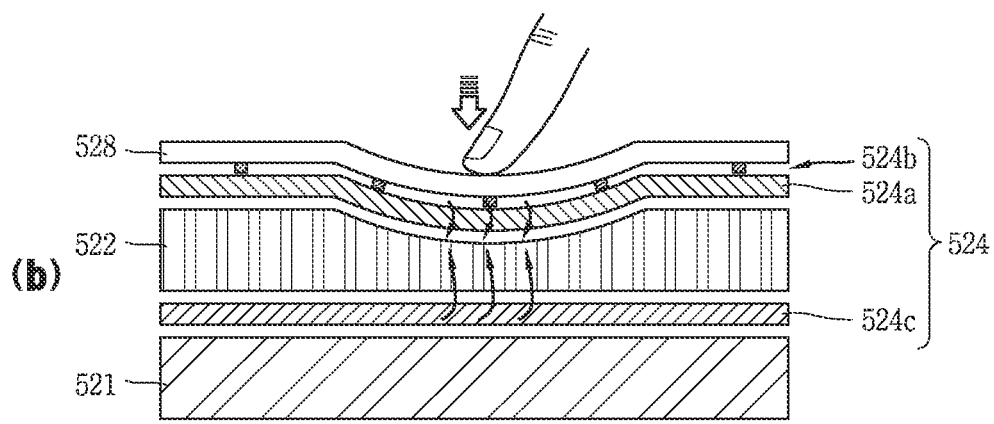
Figure 6B:
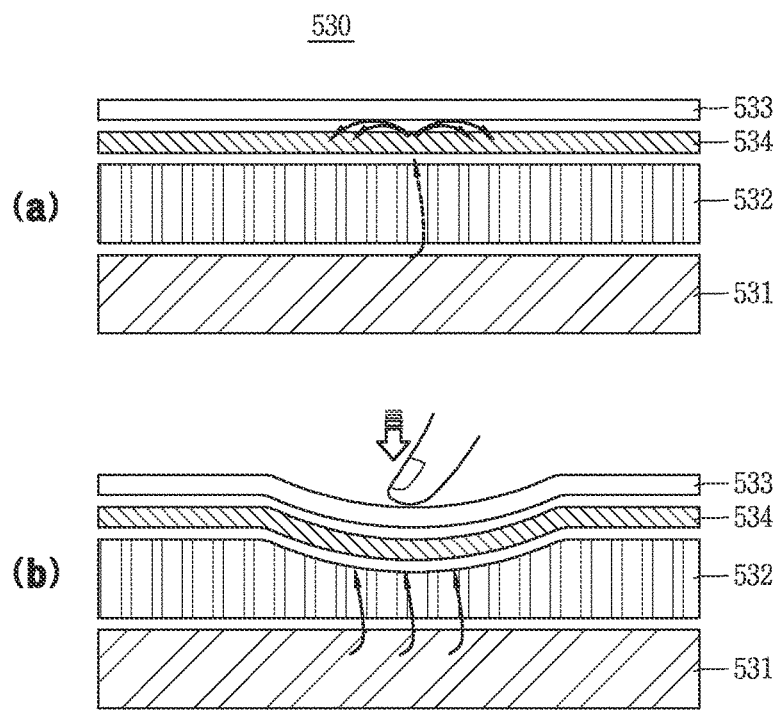

FIGS. 6A and 6B are partial cross-sectional views of FIG. 2, which are cut along line A-A to illustrate a touch display unit including a touch sensing unit formed on a liquid crystal display panel according to another embodiment. A touch display unit according to the present embodiment may be applicable to a touch display unit in which part of the touch sensing unit is integrally formed with the window corresponding to the a cover glass of the mobile terminal.

A touch display unit 520 according to FIG. 6A(a) and (b) includes a display panel 521, a deformation region 522, and a touch sensing unit 524. The display panel 521 and the deformation region 522 are substantially the same as the display panel 511 and the deformation region 512, respectively, in FIG. 3A. Accordingly, the description of the display panel 521 and the deformation region 522 will be substituted by the description of FIGS. 3A and 3B.

The deformation region 522 is formed on the display panel 521. The touch sensing unit 524 includes a first through a third sensing layer 524a, 524b, 524c. The first sensing layer 524a serves as a touch output layer (Rx) which is an output stage of current, and the second and the third sensing layer 524b, 524c serve as a touch input layer (Tx) which is an input stage of current.

The third sensing layer 524c is formed between the deformation region 522 and the display panel 521. The first sensing layer 524a is formed on the deformation region 522. Accordingly, a distance between the second and the third sensing layer 524b, 524c decreases as shown in FIG. 6A(b), and a current of the third sensing layer 524c is output to the first sensing layer 524a. In other words, the third sensing layer 524c senses the touch pressure along with the first sensing layer 524a.

The second sensing layer 524b includes a window and a touch sensing line constituting an external appearance of the terminal. In other words, a plurality of touch sensing lines are formed on one surface of the base substrate (glass substrate) constituting the window, facing the first sensing layer 524a. For example, for the second sensing layer 524b, a conductive material (for example, ITO) is deposited on the base substrate, and thus the touch sensing lines and window are formed into an integral body.

In other words, a current is output from the touch sensing line of the second sensing layer 524b to the first sensing layer 524a. In other words, the second sensing layer 524b can sense the touch coordinates of a user's touch input applied to the window along with the first sensing layer 524a.

The touch display unit 530 in FIG. 6B(a) and (b) includes a display panel 531, a deformation region 532, a window 533 and a touch sensing unit 534. The display panel 531, the window 533 and the touch sensing unit 534 are sequentially deposited. The display panel 531, the deformation region 532 and the window 533 are substantially the same as the display panel 511, the deformation region 512 and the deformation region 512 in FIG. 3A, and the description thereof will be substituted by the description of FIG. 3A.

The touch sensing unit 534 is formed between the window 533 and the deformation region 532. The touch sensing unit 534 includes a first and a second touch sensing line. The first and the second touch sensing line may be configured with a plurality of sensing lines formed in opposite directions to each other.

For example, the touch sensing unit 534 may include a base substrate, a first touch sensing line deposited in a first direction on one surface of the base substrate, and a second touch sensing line deposited in a second direction perpendicular to the first direction on the other surface of the base substrate. The first and the second touch sensing line may be formed of a metal material (ITO). However, the structure in which the first and the second touch sensing line are formed on the base substrate may not be necessarily limited to this.

In other words, the touch sensing unit 534 includes both a current output stage and a current input stage. The first touch sensing line may be a current output stage, and the second touch sensing line may be a current input stage. The touch sensing unit 534 senses the touch coordinates of a touch input applied to the touch display unit 530.

When an external force is applied to the touch display unit 530, the touch sensing unit 534 is deformed as shown in FIG. 6B(b). One region of the deformation region 532 is deformed by the touch sensing unit 534. When the thickness of the deformation region 532 decreases, a current generated from the display panel 531 is output through the output stage of the touch sensing unit 534. As decreasing the thickness of the deformation region 532, an amount of current being output to the output stage of the touch sensing unit 534 from the display panel 531 increases. Accordingly, the controller 180 can sense a change of touch pressure applied by an external force.

According to the present embodiment, a noise current generated from the display panel instead of a sensing line corresponding to the input stage may be sensed to sense the touch pressure. Accordingly, it is possible to decrease the thickness of the touch display unit.

Figure 7:
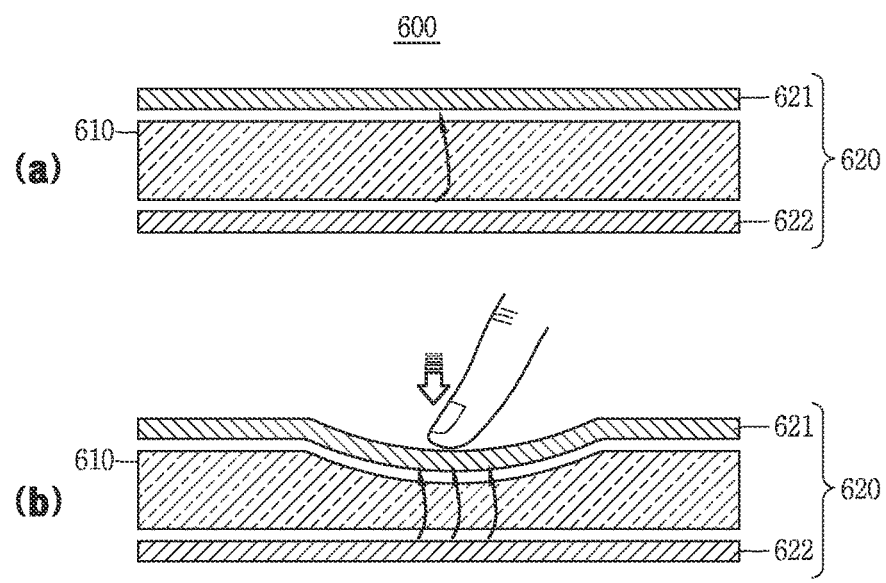
FIG. 7 is a conceptual view illustrating a touch display unit according to still another embodiment.

Next, FIG. 7 is a conceptual view illustrating the structure of a touch display unit according to still another embodiment. As shown in FIGS. 7(a) and (b), a touch display unit 600 includes a flexible display panel 610 and a touch sensing unit 620. The touch display unit 600 according to the present embodiment is configured to be deformable by an external force. Here, the deformation may be at least one of bending, warping, folding, twisting and curling.

The flexible display panel 610 may include a base substrate having a deformable glass material, and the thickness of the flexible display panel 610 decreases when an external force is applied in a direction perpendicular thereto. In other words, the flexible display panel 610 functions as the deformation region.

The touch sensing unit 620 includes a first sensing layer 621 and a second sensing layer 622. The first sensing layer 621 is formed on one surface of the flexible display panel 610, and the second sensing layer 622 is formed on the other surface of the flexible display panel 610. The first sensing layer 621 serves as a touch output layer (Rx) which is a current output stage, and the second sensing layer 622 serves as a touch input layer (Tx) which is a current input stage.

Further, the flexible display panel 610 may include a touch output stage. The output stage is formed adjacent to the first sensing layer 621. Accordingly, the touch coordinates of a touch input applied to the first sensing layer 621 is sensed. In addition, when the thickness of the flexible display panel 610 decreases by an external force, a distance between the first sensing layer 621 and the second sensing layer 622 decreases, and the current is output from the second sensing layer 622 to the first sensing layer 621. As a result, it is possible to sense the touch pressure.

If it is a display panel which is deformable by an external force, there is no restriction on the type of display panels. Accordingly, the flexible display panel 610 may be implemented with a liquid crystal display (LCD) or organic light emitting diode (OLED) panel. In other words, it includes a structure in which a sensing line may be formed on both surfaces of the display panel, and a window is formed on the sensing line.

Figure 8A:
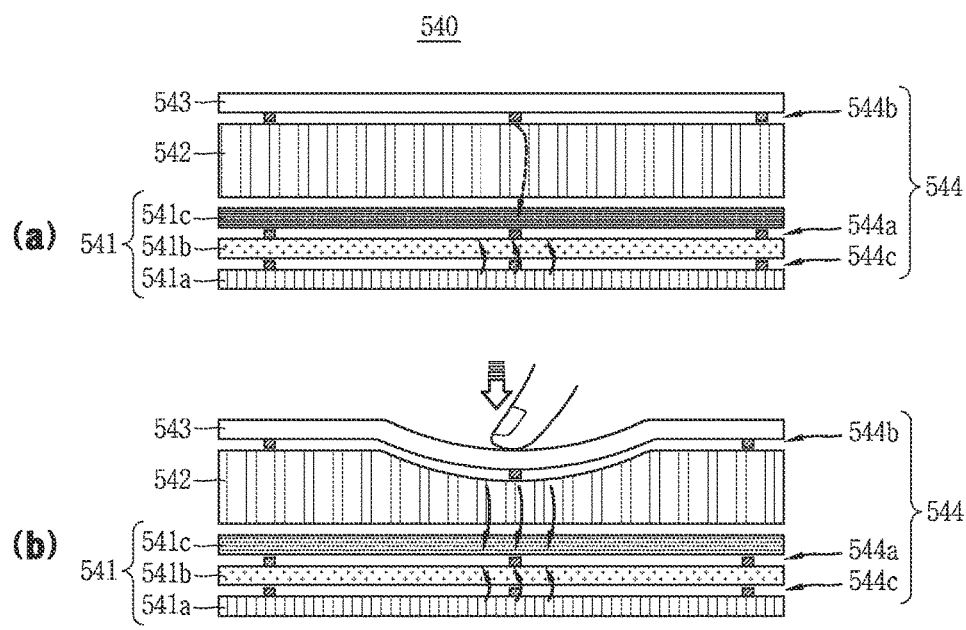
FIGS. 8A and 8B are conceptual views illustrating a touch display unit in which a touch sensing line is formed on a display panel.
Figure 8B:
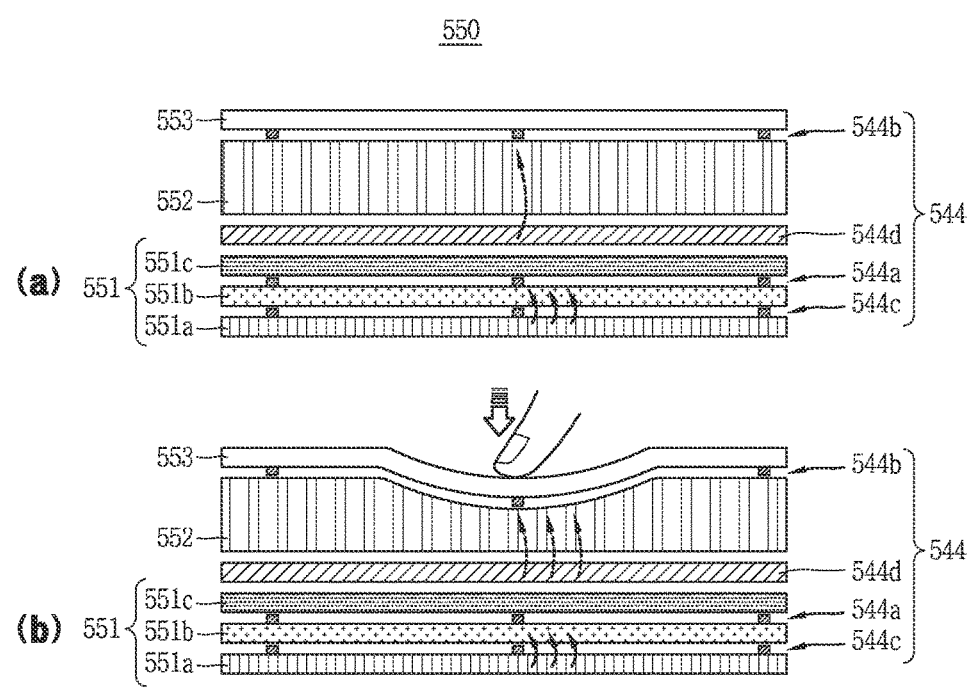

Next, FIGS. 8A and 8B are conceptual views illustrating the structure of a touch display unit in which a touch sensing line is formed on a display panel. A touch display unit according to the present embodiment may be applicable to a touch display unit where part of the touch sensing unit is formed on a constituent element of the display panel for displaying visual information. In particular, it may be applicable to a touch display unit where a touch sensing unit is formed on a cell for controlling the transmission of light based on a signal applied to the display panel.

As shown, a touch display unit 540 according to FIG. 8A(a) and (b) includes a display panel 541, a deformation region 542, a window 543 and a touch sensing unit 544. The window 543 and the deformation region 542 are substantially the same as the window 543 and deformation region 512 in FIG. 3A, and thus the redundant description will be substituted by the description of FIG. 3A. The display panel 541 may include a thin film transistor (TFT) layer 541a, a color filter layer 541b and a polarizer layer 541c.

The touch sensing unit 544 may include a first touch sensing line 544a, a second touch sensing line 544b, and a third touch sensing line 544c. The first touch sensing line 544a is formed on the color filter layer 541b. A metal layer (ITO) is deposited on one surface of the color filter layer 541b. The first touch sensing line 544a serves as a touch output layer (Rx) which is a current output stage.

The second touch sensing line 544b is formed on an inner surface of the display panel 541 with a method of depositing a metal layer (ITO). The second touch sensing line 544b serves as a touch input layer (Tx) which is the current input stage. The third touch sensing line 544c is formed on the TFT layer 541a. For example, the third touch sensing line 544c is formed on one surface of the TFT layer 541a facing the color filter layer 541b. The third touch sensing line 544c serves as a touch input layer (Tx) which is a current input stage.

According to the touch sensing unit 544 according to the present embodiment, the touch sensing lines are formed on a constituent element of the window and display panel and thus the touch sensing unit and display panel are formed into an integral body with no additional base substrate for forming touch sensing lines.

The deformation region 542 is disposed between the display panel 541 and the second touch sensing line 544b. A current is output from the third touch sensing line 544c to the first touch sensing line 544a. A small amount of current is output from the second touch sensing line 544b to the first touch sensing line 544a by a gap between the first touch sensing line 544a and the second touch sensing line 544b due to the deformation region 542.

Further, when part of the second touch sensing line 544b is deformed (moved) by an external force applied to the window 543, a gap between the first and the second touch sensing line 544a, 544b decreases (in other words, the thickness of one region of the deformation region 542 decreases). Accordingly, a current of the second touch sensing line 544b is output to the first touch sensing line 544a. As a result, the third touch sensing line 544c senses touch coordinates along with the first touch sensing line 544a, and the second touch sensing line 544b senses a touch pressure along with the first touch sensing line 544a.

A touch display unit 550 according to FIG. 8B(a) and (b) includes a display panel 551, a deformation region 552, a window 553 and a touch sensing unit 554, and the display panel 551 may include a TFT layer 551a, a color filter layer 551b and a polarizer layer 551c. The display panel 551, deformation region 552 and window 553 are substantially the same as the display panel 541, deformation region 542 and window 543.

The touch sensing unit 554 includes a first through a third touch sensing lines 554a, 554b, 554c and a sensing layer 544d. The first touch sensing line 554a is formed on the color filter layer 551b, and the second touch sensing line 554b is formed on an inner surface of the window 553, and the third touch sensing line 554c is formed on the TFT layer 551a. The first through the third touch sensing lines 554a, 554b, 554c may be formed on the color filter layer 551b, the window 553 and the TFT layer 551a with a method of depositing a conductive material (ITO).

The first and the second touch sensing line 554a, 554b serve as a touch output layer (Rx) which is a current output stage, and the third touch sensing line 554c and the sensing layer 544d serve as a touch input layer (Tx) which is a current input stage. The first and the third touch sensing line 554a, 554c sense the touch coordinates of a user's touch input.

The current output from the third touch sensing line 554c is output to the first touch sensing line 554a. Furthermore, a current coming out of the first sensing layer 544d is output to the first touch sensing line 554a disposed adjacent to the sensing layer 544d.

The sensing layer 544d is located adjacent to the second touch sensing line 554b by an external force applied to the window 553 (in other words, the thickness of the deformation region 552 is deformed by an external force). Accordingly, a current is output from the sensing layer 544d to the second touch sensing line 554b. As the sensing layer 544d draws close to the second touch sensing line 554b, a larger amount of current is output to the second touch sensing line 554b, and thus the controller 180 senses the touch pressure.

Figure 9A:
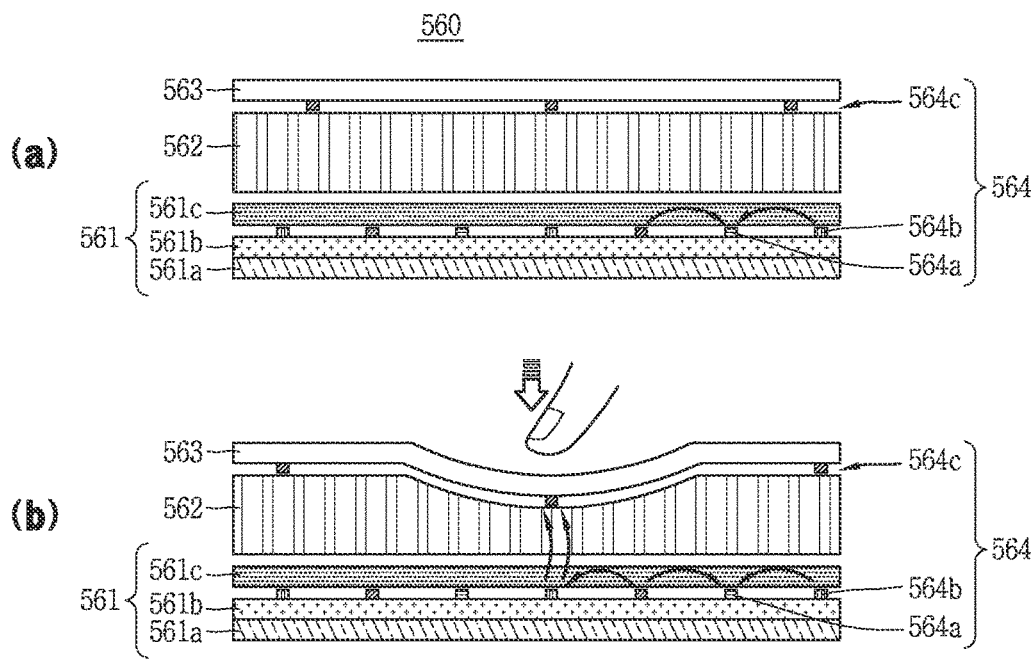
FIGS. 9A and 9B are conceptual views illustrating a touch display unit including a touch sensing unit formed on a display panel.
Figure 9B:
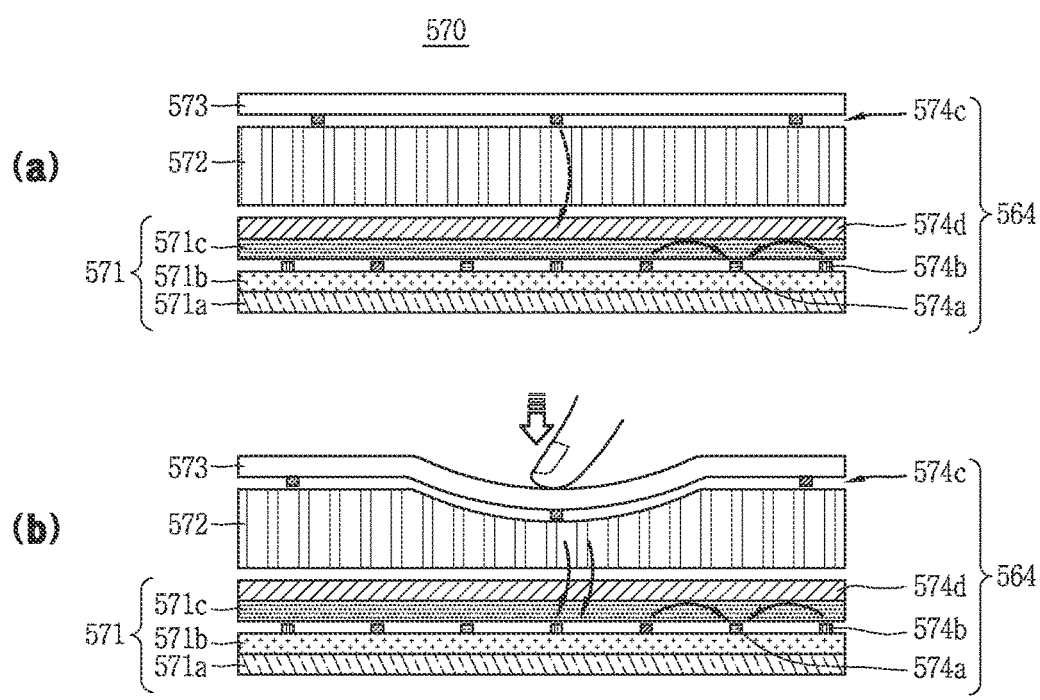

Next, FIGS. 9A and 9B are conceptual views illustrating a touch display unit including a touch sensing unit formed on a display panel. A touch display unit according to the present embodiment may be applicable to a touch display unit in such a type that a touch sensing unit is formed within a display panel for displaying visual information.

A touch display unit 560 in FIG. 9A(a) and (b) includes a display panel 561, a deformation region 562 and a window 563. The display panel 561 may be implemented with an LCD panel, and the display panel 561 may include a TFT layer 561*a*, a color filter layer 561*b* and a polarizer layer 561*c*. The display panel 561, the deformation region 562 and the window 563 are substantially the same as the display panel 541, deformation region 542 and window 543 in FIG. 8A, and thus the redundant description will be substituted by the description of FIG. 8A.

The first and the second touch sensing line 564*a*, 564*b* are formed on one surface of the color filter layer 561*b*. The first and the second touch sensing line 564*a*, 564*b* are configured with a plurality of sensing lines, respectively, and the first and the second touch sensing line 564*a*, 564*b* are formed in directions crossed with each other. An insulating layer for insulating the first and the second touch sensing line 564*a*, 564*b* may be further formed in a region at which the first and the second touch sensing line 564*a*, 564*b* are crossed and overlapped with each other.

The third touch sensing line 564*c* is formed at an inner surface of the window 563. The first through the third touch sensing lines 564*a*, 564*b*, 564*v* may be formed with a method of depositing a conductive material (ITO). The first touch sensing line 564*a* serves as a touch output layer (Rx) which is a current output stage, and the second and the third touch sensing line 564*b*, 564*c* serve as a touch input layer (Tx) which is the current input stage.

The third touch sensing line 564*c* is disposed to be separated from the first touch sensing line 564*a* due to the deformation region 562, and thus a current of the third touch sensing line 564*c* is not output to the first touch sensing line 564*a*. The first and the second touch sensing line 564*a*, 564*b* sense the touch coordinates of a user's touch input.

Further, a gap between the first and the third touch sensing line 564*a*, 564*c* decreases by an external force applied to the window 563 (in other words, the thickness of the deformation region 562 decreases). Accordingly, the current of the third touch sensing line 564*c* is output through the first touch sensing line 564*a* to sense a touch pressure of the touch input.

A touch display unit 570 in FIG. 9B(a) and (b) includes a display panel 571, a deformation region 572 and a window 573, and they are substantially the same as the display panel 561, deformation region 562 and window 563, and thus the redundant description will be substituted by the description of FIG. 9A.

A touch sensing unit 574 according to the present embodiment may include a first through a third touch sensing lines 574*a*, 574*b*, 574*c* and a sensing layer 574*d*. The first and the third touch sensing line 574*a*, 574*b* are substantially the same as the first through the third touch sensing lines 574*a*, 574*b*, 574*c*, and thus the redundant description will be omitted. The third touch sensing line 574*c* serves as a touch output layer (Rx) which is a current output stage.

Further, the sensing layer 574*d* is disposed on the polarizer layer 571*c*. The second sensing layer 574*d* may be formed by depositing a conductive material (ITO) on the base substrate. The sensing layer 574*d* serves as a touch input layer (Tx) which is a current input stage.

The first and the second touch sensing line 574*a*, 574*b* sense the touch coordinates of a touch input. The 574*c* and the sensing layer 574*d* are disposed to be separated from each other using the deformation region 572. Meanwhile, when thickness of the deformation region 572 is decreased by an external force applied to the window 573, a gap between the third touch sensing line 574*c* and sensing layer 574*d* decreases. A current is output from the sensing layer 574*d* to the third touch sensing line 574*c*, and accordingly, the controller 180 can sense the touch pressure.

Figure 10A:
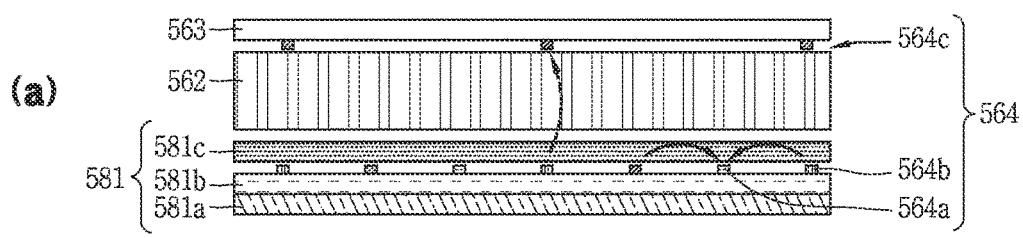
FIGS. 10A and 10B are partial cross-sectional views of FIG. 2 cut along line A-A to illustrate a touch display unit including an OLED panel.
Figure 10A:
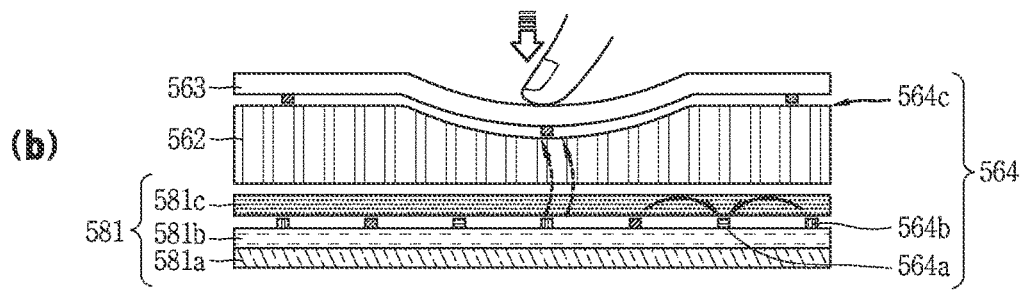
Figure 10B:
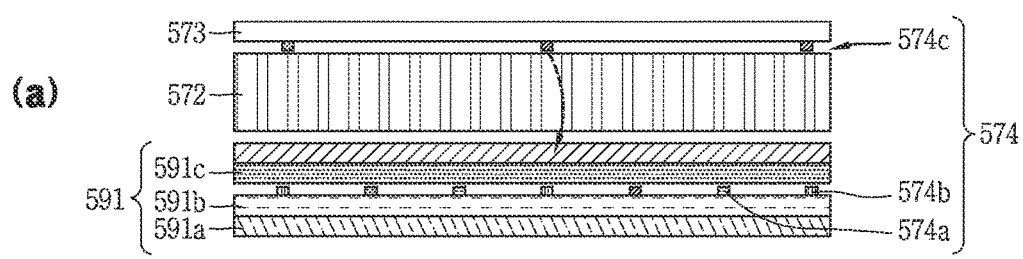
Figure 10B:
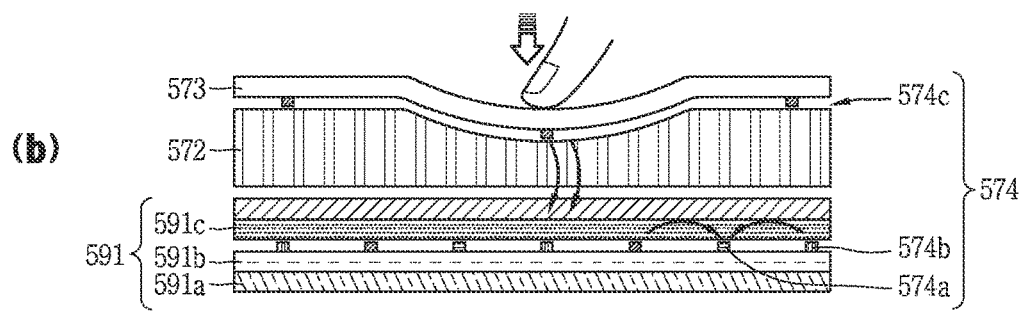

Next, FIGS. 10A and 10B are partial cross-sectional views of FIG. 2 cut along line A-A to illustrate a touch display unit including an OLED panel. A touch display unit according to the present embodiment may be applicable to a touch display unit in such a type that a touch sensing unit is formed within an OLED panel.

A touch display unit 580 according to FIG. 10A(a) and (b) includes a display panel 581, a deformation region 562, a window 563 and a touch sensing unit 564. A display panel 581 according to the present embodiment corresponds to a display panel for displaying visual information including organic light emitting diodes. The display panel 581 may include a TFT layer 581*a*, an organic material layer 581*b* and a color filter layer 581*c*. The organic material layer 581*b* is formed by a process of preventing an external contact to an OLED organic material layer using an encapsulation technology.

The constituent elements excluding the touch display unit 581 of the touch display unit 580 according to the present embodiment are substantially the same as those of the execution screen 560 in FIG. 9A. According to the present embodiment, the first and the second touch sensing line 564*a*, 564*b* sense touch coordinates and the third touch sensing line 564*c* and the first touch sensing line 564*a* sense a touch pressure.

A touch display unit 590 according to FIG. 10B(a) and (b) includes a display panel 591, a deformation region 572, a window 573 and a touch sensing unit 574. A display panel 591 according to the present embodiment corresponds to a display panel for displaying visual information including organic light emitting diodes. The display panel 591 may include a TFT layer 591*a*, an organic material layer 591*b* and a color filter layer 591*c*. The organic material layer 591*b* is formed by a process of preventing an external contact to an OLED organic material layer using an encapsulation technology.

The constituent elements excluding the touch display unit 591 of the touch display unit 590 according to the present embodiment are substantially the same as those of the execution screen 570 in FIG. 9B. According to the present embodiment, the first and the second touch sensing line 574*a*, 574*b* sense touch coordinates, and the sensing layer 574*d* and the third touch sensing line 574*c* sense a touch pressure.

Figure 11:
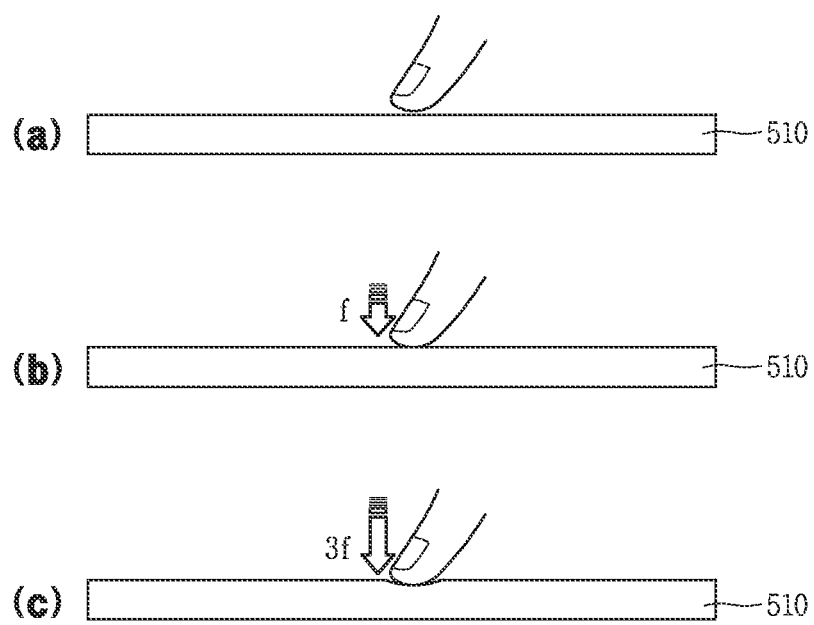
FIG. 11 is a conceptual view illustrating a method of sensing touch coordinates and a touch pressure to form a control command.

Next, FIG. 11 is a conceptual view illustrating a control method of sensing touch coordinates and a touch pressure to form a control command. Referring to FIG. 11(*a*), a user's touch applied to the touch display unit 510 at a pressure less than a first reference pressure is sensed as a touch for which the touch pressure is not sensed to form a first control command corresponding to the touch coordinates.

Referring to FIG. 11(*b*), for a user's touch applied to the touch display unit 510 at a touch pressure of the touch input which is greater than a first reference pressure but less than a second reference pressure, it may be possible to sense a touching period of time during which the touch is applied. In other words, when the touch input persists, the controller 180 senses it as a touch input in a long touch manner. Accordingly, the controller 180 forms a second control command based on a touch input in a long touch manner excluding the touch pressure.

Referring to FIG. 11(c), when the touch pressure of the touch input is greater than a second reference pressure, the controller 180 senses a reference pressure of the touch input. In other words, when the touch pressure is sensed as a value greater than that of the second reference pressure, the controller 180 can form a third control command based on the touch pressure and the touch coordinates.

In other words, the controller 180 can determine that an external force has been applied by a user only when a touch pressure greater than a preset second reference pressure, thereby forming a control command corresponding to the external force. Accordingly, a touch, a long touch input and a touch input due to an external force may be distinguished to form a more accurate control command.

When sensed that a pressure greater than the second force has been applied to the window 513, the touch sensing unit 514 can sense the gradual pressures of the touch pressure based on the deformation of the first sensing layer 514a due to the external force. For example, the touch sensing unit 514 can sense it by distinguishing a first through a third touch pressures. Accordingly, the controller 180 can execute a different function based on a different touch pressure of the touch input applied on specific touch coordinates.

Figure 12A:
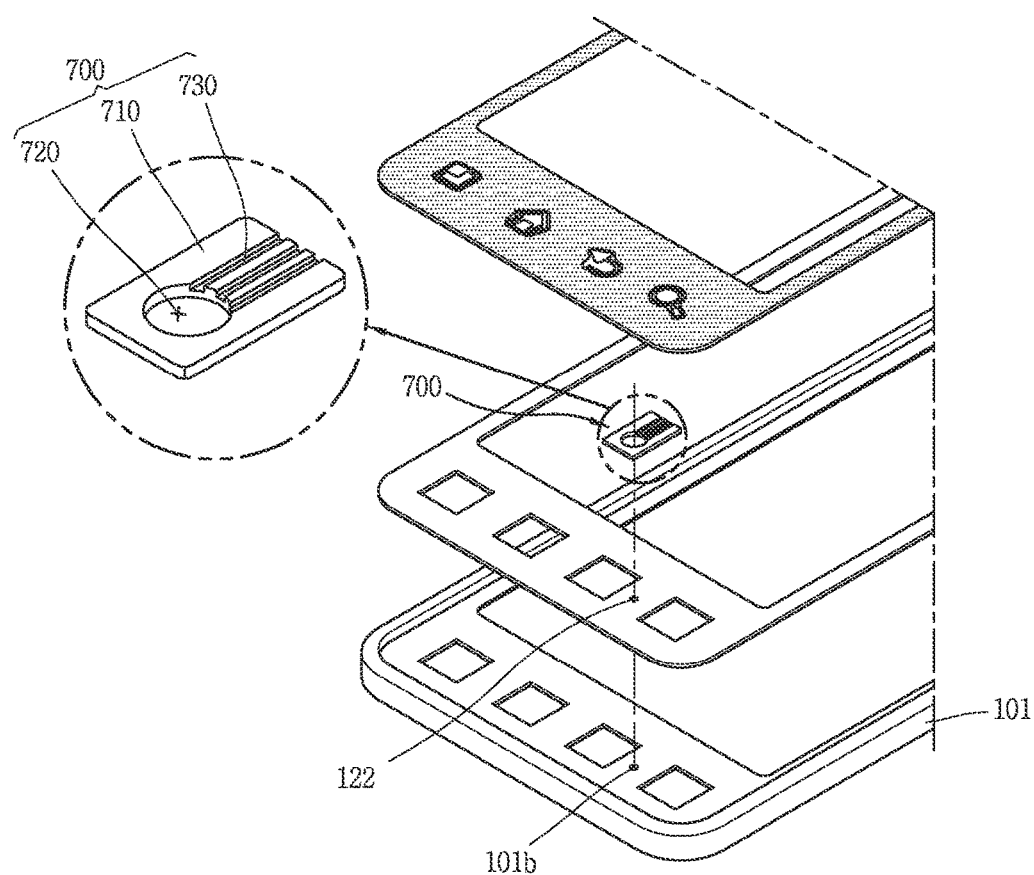
FIG. 12A is an exploded view illustrating an air hole for inflowing and outflowing air from a deformation region.
Figure 12B:
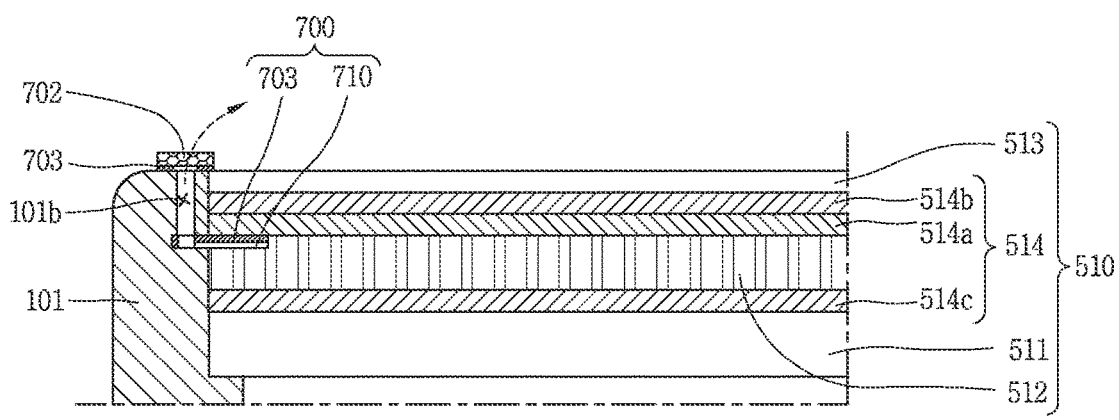
FIG. 12B is a cross-sectional view illustrating an air hole.

FIG. 12A is an exploded view illustrating an air hole for inflowing and outflowing air from a deformation region, and FIG. 12B is a cross-sectional view illustrating an air hole: Referring to FIGS. 12A and 12B, a through hole 101b is formed in a region adjacent to the touch display unit 510 of the front case 101. The deformation region 512 may be communicated with an assembly space within the terminal body by the through hole 101b, and communicated with an outside.

When the deformation region 512 is formed of a gas, the window 513 is deformed when an external force is applied on the window 513. When the window 513 is deformed but the display panel 511 is not deformed, a gas constituting the deformation region 512 is discharged through the through hole 101b. Accordingly, it may be possible to facilitate the deformation of the window 513 due to a user's pressure and allow the deformation (or movement) of the sensing layer of the touch sensing unit.

A channel film 700 may be formed between the touch display unit 510 and the front case 101. The channel film 700 communicates a space to the deformation region 512 of the touch display unit 510 with the through hole 101b. As a result, air flows into the space to restore the deformation of the deformation region 512. Accordingly, it will be in a state capable of receiving a touch pressure applied on the window again. Furthermore, dirt caused by the deformation can be prevented and removed due to the free flow of the gas or the like.

The channel film 700 may be made in a thin sheet shape, and formed on the deformation region 512. The channel film 700 may include a base 710, a hole 720 and a channel portion 730. For example, the channel film 700 may be formed on a lower surface of the first sensing layer 514a, but is not limited to this. In other words, if the channel film 700 is allowed to communicate with the deformation region 512, then it can be adhered to a constituent element of the touch display unit 510.

The base 710 may be formed to be extended toward the through hole 101b. The base 710 may be formed of a synthetic resin, for example, polyethylene terephthalate (PET), polypropylene (PP), polyethylene (PE), and the like. The base 710 may be formed in a transparent manner not to be exposed to the outside or formed with the same color as that constituting the edge region (S).

A hole 720 is formed at a portion corresponding to the through hole 101b of the base 710. The hole 720 may be formed adjacent to an end portion in the extension direction of the base 710. The size of the hole 720 may be preferably formed to be greater than that of the 101b to surround the through hole 101b.

The channel portion 730 is formed to be extended toward the hole 720 from an end portion of the base 710. A surface of the channel portion 730 facing the window 513 of the base 710 may be formed in an engraved (recessed) manner. A plurality of channel portions 730 may be formed to more quickly perform restoration due to the deformation of the window 513. The channel film 700 may be adhered to an adhesive film 701. The adhesive film itself 701 may be formed of a porous material capable of ventilating air.

A ventilation pad 702 of the front case formed with a porous material may be disposed to cover the through hole 101b. The ventilation pad 702 is configured to ventilate air, and formed to prevent foreign substances from infiltrating into a space between the display panel 511 and window 513, namely, the deformation region 512. A sponge may be understood as a kind of the ventilation pad 702.

An adhesive layer 703 is formed on one surface of the ventilation pad 702, and thus is configured so the ventilation pad 702 can be adhered to a rear surface of the front case. Here, the adhesive layer 703 may be formed without a portion corresponding to the through hole 101b to ventilate air. When the shape of the window 513 is restored by releasing an external force for deforming the window 513, external air flows into the deformation region 512 again through the ventilation pad 702.

When air flows into the deformation region 512 again through the ventilation pad 702, it is possible to prevent contaminants from flowing therein. Accordingly, the deformation of the deformation region may be more freely allowed, and the restoration of the deformation region may be facilitated, thereby enhancing the sensing quality of a touch pressure according to the deformation region.

In the above, the structure of a touch display unit for sensing touch coordinates and a touch pressure using a change of capacitance has been described. According to an embodiment of the present invention, the mobile terminal may be controlled in various ways based on the touch coordinates and touch pressure. A control method of a mobile terminal according to the present invention will be described below. Hereinafter, part of a front surface of the mobile terminal mounted on the mobile terminal body to display screen information and receive a touch input may be referred to as a display unit 151. In other words, the touch display unit corresponds to a constituent element which is substantially the same as the touch display unit 151.

Figure 13A:
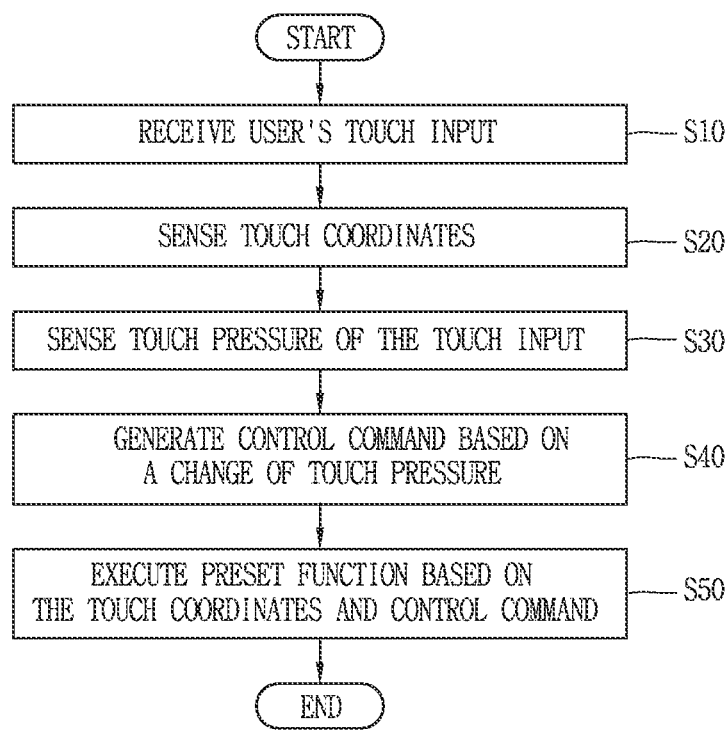
FIG. 13A is a flowchart and FIG. 13B through 13F are conceptual views illustrating a control method according to an embodiment of the present invention.

Referring to FIG. 13A, the touch display unit 510 receives a user's touch input (S10). The user's touch input corresponds to a touch applied on the window 513. The controller 180 senses the touch coordinates of the touch input applied on the window 513 (S20). Furthermore, the controller 180 senses the touch pressure of the touch input using the touch sensing unit 514 (S30). The step of sensing the touch pressure corresponds to the step of deforming one region of the touch display unit 510 (see FIG. 3A) by an external force contained in the touch input and sensing the deformation. In other words, the controller 180 can calculate a touch pressure according to a current change output due to the deformation of a partial constituent element of the touch display unit 510.

However, the step (S20) of sensing the touch coordinates and the step (S30) of sensing the touch pressure of the touch input may occur substantially at the same time. Accordingly, the steps S20 and S30 correspond to the steps that are exchangeable in their sequence or occur at the same time.

The controller 180 generates a control command based on the touch coordinates and a change of the touch pressure (S40), and executes a preset function in response to the control command (S50). Hereinafter, the detailed control method of a mobile terminal according to a control command based on the touch coordinates and touch pressure will be described.

Figure 13B:
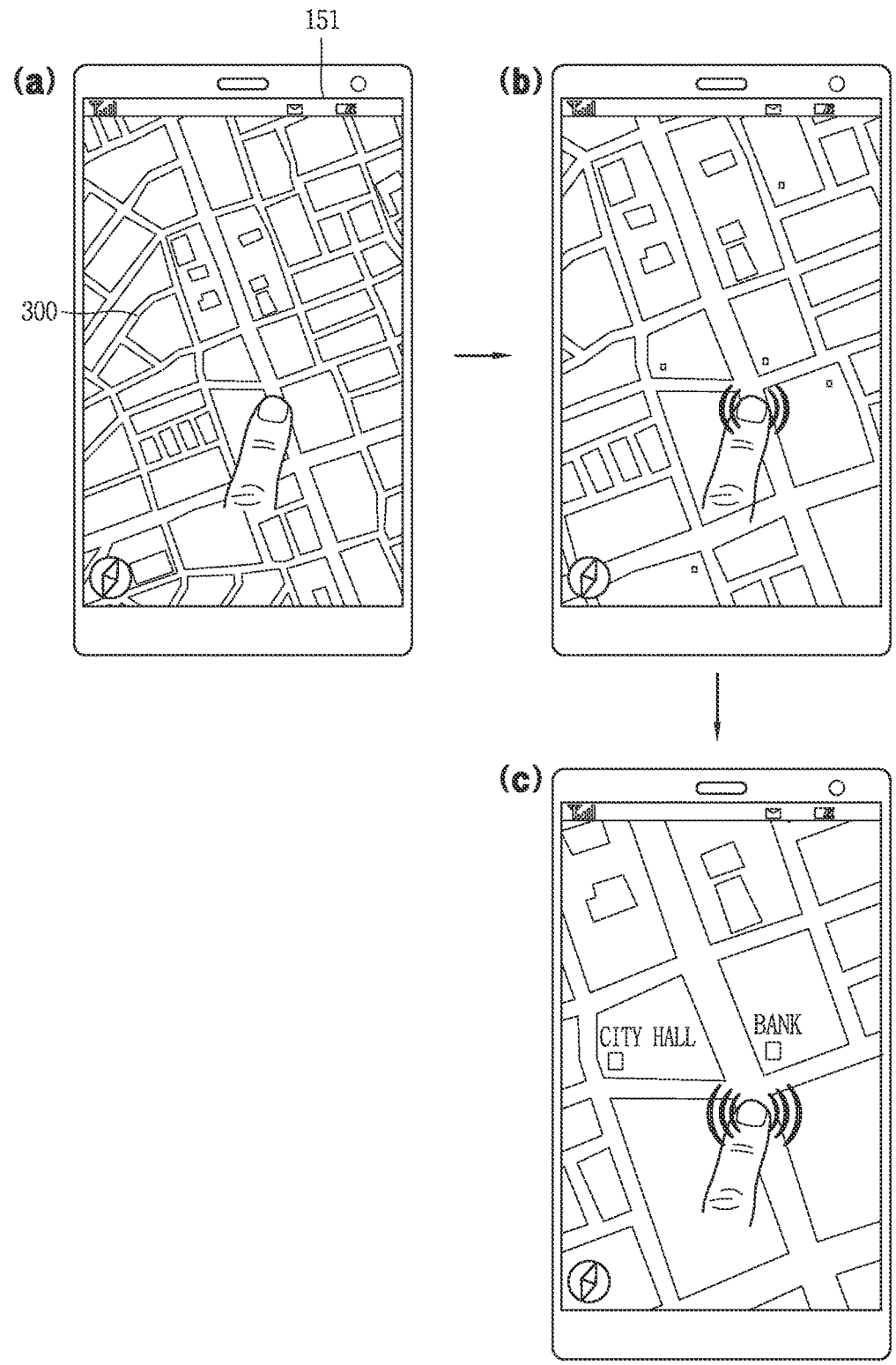
Figure 13C:
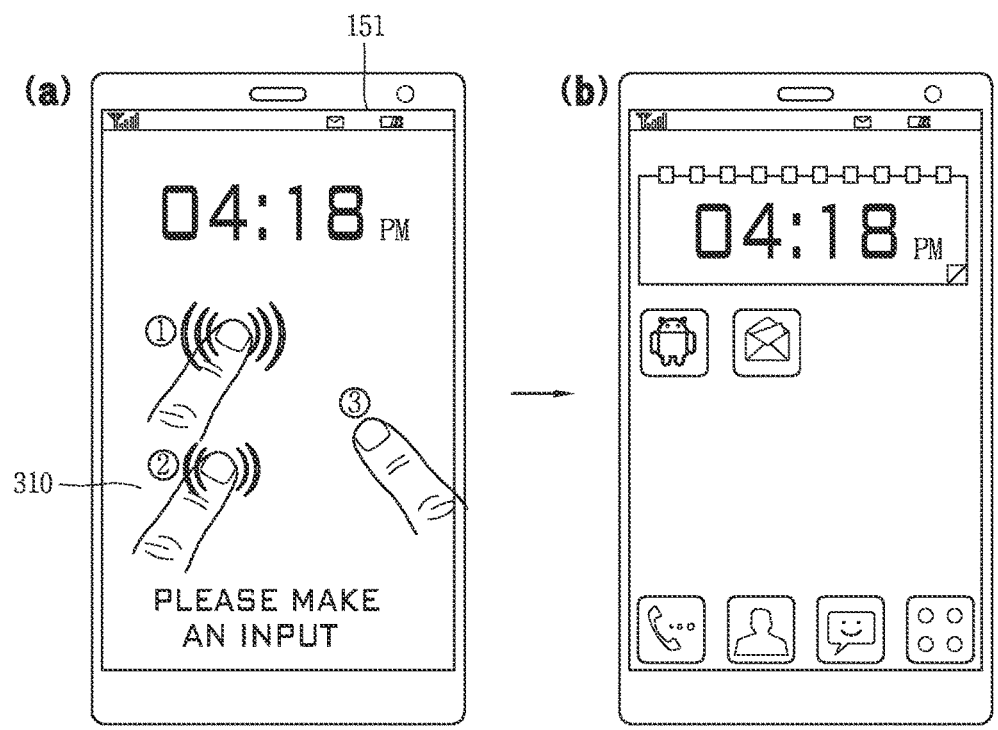
Figure 13D:
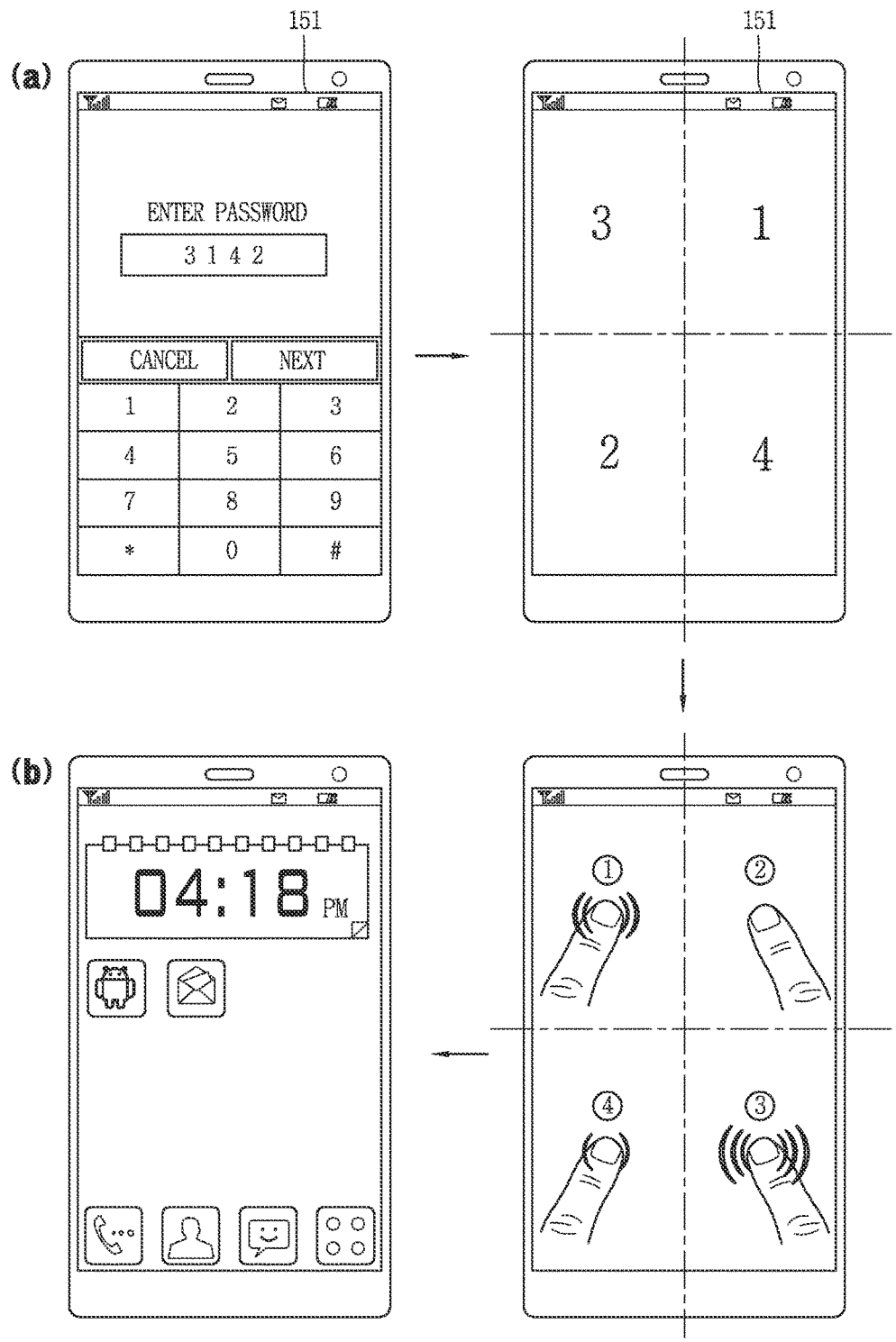

FIGS. 13B through 13D are conceptual views illustrating a control method of a mobile terminal based on the touch coordinates and touch pressure. FIG. 13B(a) illustrates the display unit 151 for displaying a map screen 300. The controller 180 senses a touch input applied to the display unit 151. The controller 180 senses the touch coordinates and touch pressure of the touch input. Hereinafter, it will be described that a display panel configured to sense touch coordinates and a touch pressure by the touch input and controlled by the touch input is referred to as a display unit 151.

Referring to FIG. 13B(b), the controller 180 senses first touch coordinates and a first touch pressure by the touch input. The controller 180 senses first touch coordinates and a first touch pressure based on the touch input. The controller 180 controls the display unit 151 to enlarge and display a region at a ratio corresponding to the first touch coordinates around one region of the map screen 300 as shown in FIG. 13B(c). In other words, a region to which the user's touch input is applied is enlarged and displayed at a preset ratio.

Further, the controller 180 senses first touch coordinates and a second touch pressure based on the touch input. The second touch pressure is defined as a pressure greater than the first touch pressure. In other words, the controller 180 senses the deformation of some constituent elements constituting the display unit 151 to calculate the first and the second touch pressure. According to the present embodiment, it is sensed such that the extent of the deformation of a partial constituent element of the display unit 151 corresponding to the second touch pressure is greater than that of the deformation of a partial constituent element of the display unit 151 corresponding to the first touch pressure.

Referring to FIGS. 3A and 3B along with FIG. 13B, the display panel 511 displays the map screen 300. The window 513 may be deformed based on a user's touch input. The first and the second sensing layer 514a, 514b sense the touch coordinates of the touch input.

Furthermore, referring to FIG. 13B(a) through 13B(c), the user's external force contained in the touch input gradually increases, and thus a gap between the window 513, the first and the second sensing layer 514a, 514b and the third sensing layer 514c gradually decreases. An amount of current output from the third sensing layer 514c to the first sensing layer 514a increases in going from FIG. 13B(a) to 13B(c), and thus the touch input is sensed at a larger touch pressure. Accordingly, when an external force for decreasing a distance between the third sensing layer 514c and the first sensing layer 514a is applied, the controller 180 can control the display panel 511 to enlarge and display the map screen 300 around a specific region of the map screen 300 corresponding to the touch coordinates.

In other words, the controller 180 controls the display unit 151 to enlarge and display one region of the map screen 300 corresponding to the first touch coordinates at a larger ratio, and controls the display unit 151 to further enlarge and display a region to which the user's hand is touched as increasing a touch pressure applied to the display unit 151.

Further, the controller 180 controls the display unit 151 to gradually reduce and display a map screen that has been enlarged when a touch input is applied to the display unit 151 so as to decrease the touch pressure. In other words, the user may enlarge or reduce and display the map screen around his or her desired region of the screen information using one finger.

FIG. 13C is a conceptual view illustrating a control method of releasing a lock mode based on a touch pressure sensed by a touch input. Here, the lock mode denotes a state in which the activation of the remaining functions excluding a preset function are restricted, and the controller 180 controls the mobile terminal to release a lock mode when receiving preset release information in the lock mode.

According to the present embodiment, the preset touch coordinates and touch pressure of the touch input may be set to release information for releasing the lock mode. Referring to FIG. 13C(a), the release information may include a first touch pressure applied to an upper left portion of the display unit 151, a second touch pressure applied to a lower left portion thereof, and a third touch pressure applied to a right side thereof. The first through the third touch pressure may be substantially the same or sensed by different external forces. Furthermore, the release information may not include information on the touch coordinates.

For example, referring to FIGS. 3A and 3B again, release information for releasing a lock mode may be configured with a plurality of touch inputs and a plurality of touch input sequence information including distinguishable touch coordinates and distinguishable touch inputs. The controller 180 determines whether or not a touch input contains touch coordinates corresponding to a sequence by the first and the second sensing layer 514a, 514b, and determines whether or not they contain a touch pressure corresponding to the sequence by the first and the third sensing layer 514a, 154c. Of course, the step of determining the touch pressure and the touch coordinates does not depend on a sequence.

Further, the release information may not include information on the sequence. In this instance, the controller 180 determines whether or not a touch pressure corresponding to the touch coordinates of a touch input applied to one region of the display panel 511 corresponds to preset release information. Accordingly, as shown in FIG. 13C(b), when sensing the preset touch coordinates and the touch pressure, the controller 180 controls the mobile terminal to release the lock mode.

According to the present embodiment, since the release information is set by a user's force pressing the display unit 151, other persons cannot recognize a touch pressure applied to the display unit due to the motion of the user's hand. Accordingly, it may be possible to enhance the security of release information.

Next, FIG. 13D is a conceptual view illustrating a control method of releasing a lock mode based on a touch pressure according to another embodiment. Referring to FIG. 13D(a) and (b), a touch pressure corresponding to each region of the display unit 151 defined to be divided can be set to a password. For example, a different touch pressure may correspond to each region of the display unit 151 divided into four regions.

A numeral illustrated in the drawing corresponds to a first through a fourth touch pressure, wherein the first through the fourth touch pressures correspond to cases with different extents of the deformation of a partial constituent element of the display unit 151 by different external forces. For example, the first touch pressure may correspond to a touch input when only touch coordinates to which a pressure is not applied by the user are sensed.

In other words, the user can apply a touch input having a touch pressure corresponding to each region to release a lock mode. In this instance, the input of a touch pressure corresponding to the each region may not depend on the input sequence. Furthermore, substantially the same touch pressure may correspond to different regions to form a password.

Figure 13E:
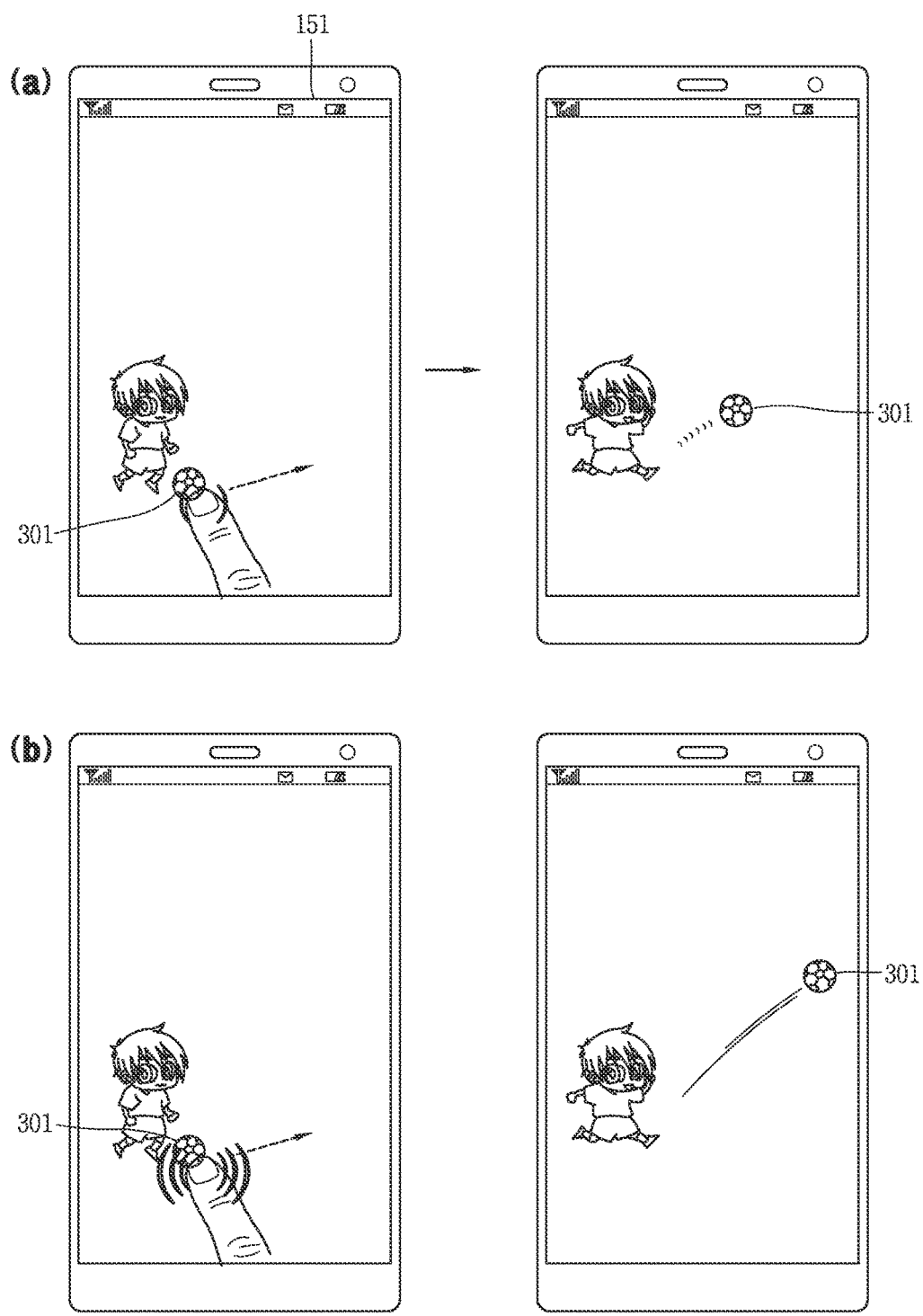

FIG. 13E is a conceptual view illustrating a control method of changing screen information according to a user's touch pressure. Referring to FIG. 13E, screen information displayed on the display unit 151 may include content controlled to receive a user's touch input so as to move it to another region of the display unit 151.

Referring to FIGS. 13E(a) and 13E(b), when touch coordinates are sensed using a flicking type touch input to the content 301, the controller 180 changes the display region of the content 301. As illustrated in the drawing, when the content is a graphic image corresponding to a ball, the display unit 151 may display screen information on which a ball flies through the air based on a touch input as shown in FIG. 13(a).

Further, when the touch coordinates and touch pressure are sensed by the touch input, the controller 180 selects content by the touch coordinates and move and display the content to correspond to the touch pressure. The degree of the movement of the content may correspond to the touch pressure. In other words, the controller 180 can display screen information on which a graphic image corresponding to the ball flies farther through the air as increasing the touch pressure as shown in FIG. 13(b).

For example, referring to FIGS. 3A and 3B, the controller 180 can determine the change extent of display region of the ball based on a current being output as the first and the third sensing layer 514a, 154c draw close to each other by the touch input. Furthermore, when the touch coordinates of the touch input are continuously varied by the first and the second sensing layer 514a, 514b, the controller 180 controls the display unit 151 to change the display region of the ball.

Figure 13F:
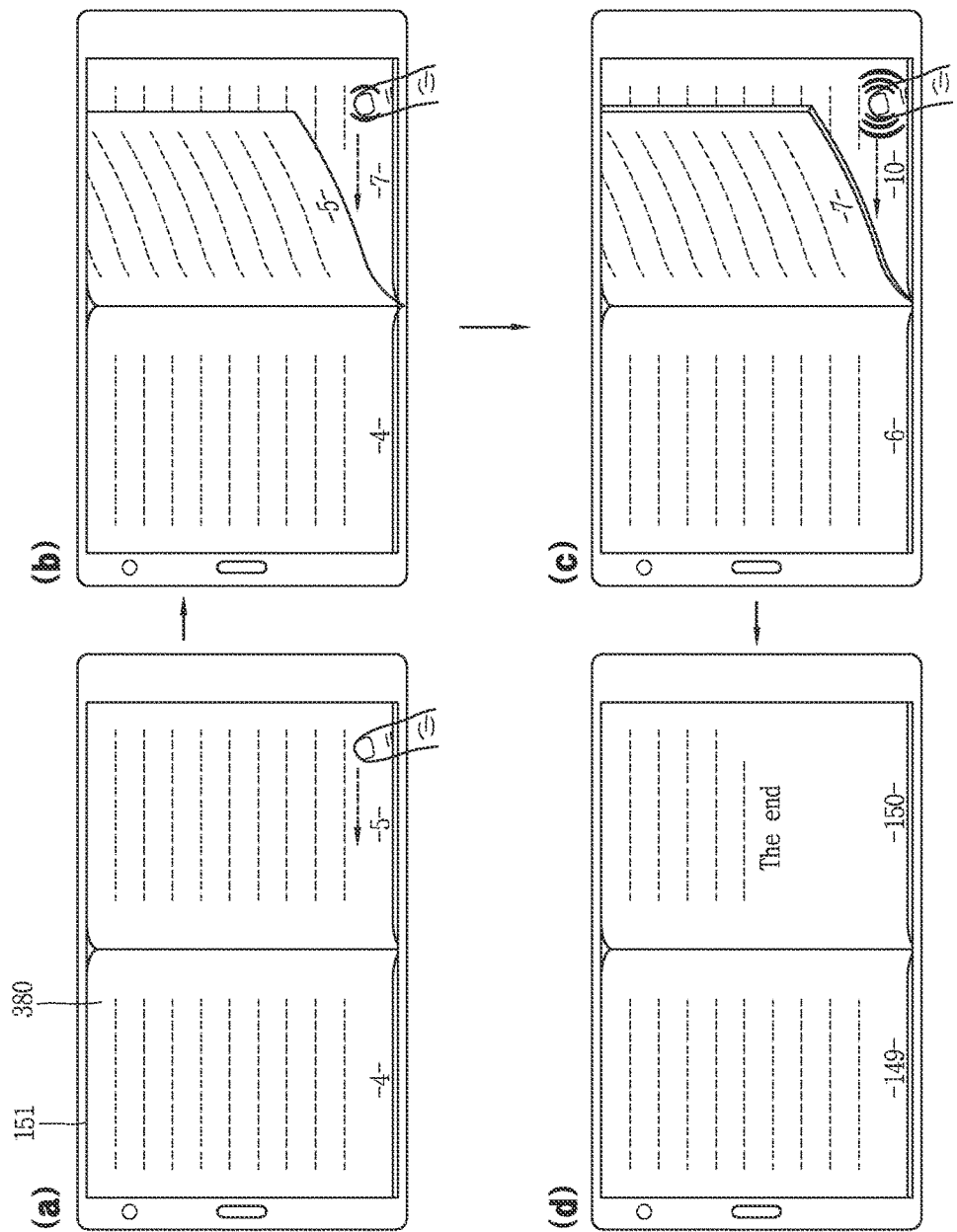

Next, FIG. 13F is a conceptual view illustrating a control method of generating a control command based on a change of a touch pressure being sensed. In particular, FIG. 13F(a) is a view illustrating the display unit 151 for displaying an e-book page 380. The e-book page may include sequentially listed page information. The display unit 151 displays one or two pages among a plurality of pages.

Further, the controller 180 controls the display unit 151 to display the previous or next page based on a consecutive touch input applied while being moved in one direction as shown in FIG. 13F(b). In other words, the controller 180 turns over a page based on a touch input. In other words, the controller 180 controls the display unit 151 to display the next page information of a current page among the page information sequentially listed based on a touch input. The sequentially displayed pages are defined to correspond to sequential frames.

Further, the controller 180 determines page information to be displayed in response to the touch pressure on the basis of a currently displayed page. In other words, the controller 180 can determine a frame to be displayed from a current frame based on the sensed touch pressure. Thus, the controller 180 can increase a current frame and the frames of pages to be displayed as increasing the touch pressure.

For example, page 10 may be displayed based on a touch input including a touch pressure when page 5 is currently displayed. When a touch input having a touch pressure greater than that of the touch input is applied, page 20 may be displayed as shown in FIG. 13F(b) and (c).

For example, referring to FIGS. 3A and 3B, the controller 180 determines the amount of frames to be moved based on a current output as the first and the third sensing layer 514a, 154c draw close to each other by the touch input. According to the present embodiment, as a distance between the first and the third sensing layer 514a, 154c decreases (i.e., as increasing the touch pressure), the controller 180 turns over a lot of pages. Furthermore, when touch coordinates sensed according to the movement of the touch input are continuously changed, the controller 180 controls the display unit to output a page corresponding to the touch pressure.

Further, referring to FIG. 13F(c) and (d), upon sensing a touch pressure above a preset pressure, the controller 180 can control the display unit 151 to display the last page corresponding to the last frame. Accordingly, the controller 180 can selectively receive sequentially listed information. Thus, content containing the screen information may be changed in response to a user's applied force, and thus the mobile terminal may be controlled in a more accurate manner by understanding the user's intention sensed by a touch input.

Figure 14A:
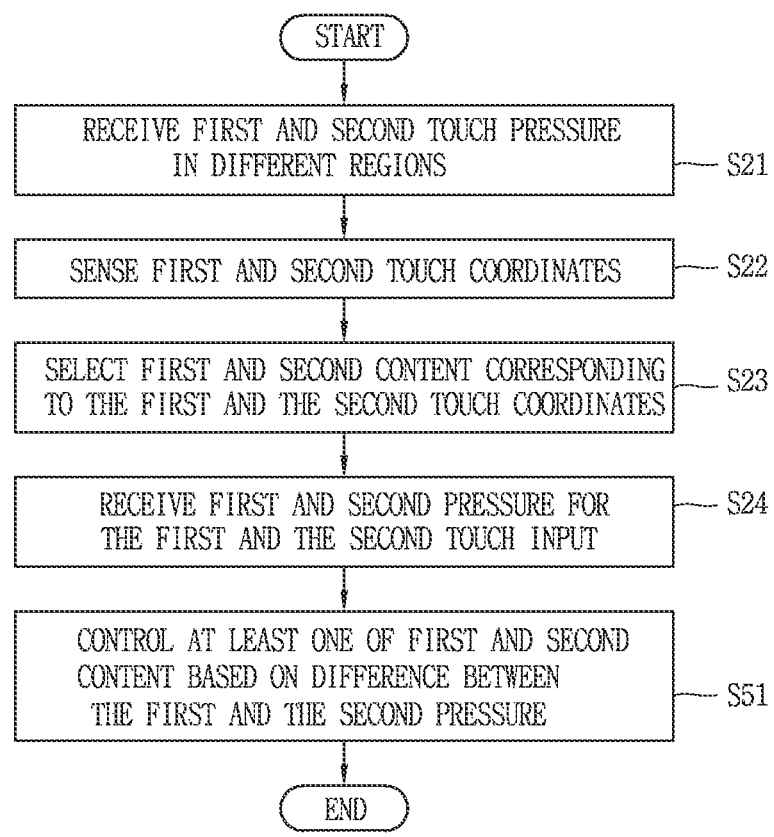
FIG. 14A is a conceptual view illustrating a control method of a mobile terminal using a plurality of touch inputs having different touch pressures.

Next, FIG. 14A is a flowchart illustrating a method of controlling a mobile terminal using a plurality of touch inputs having different touch pressures. The display unit 151 receives a first and a second touch input applied to different regions (S21). The display unit 151 senses the first and the second touch coordinates of the first and the second touch input (S22). However, the steps of sensing the first and the second touch input and the first and the second touch coordinates may be configured with substantially the same process, and the sequence of steps S21 and S22 may be reversed. The first and the second content according to the first and the second touch coordinates are selected (S23). Here, the first and the second content is included in screen information displayed on the display unit 151, and corresponds to a graphic image formed to receive a touch input.

The first and the second touch pressure of the first and the second touch input are sensed (S24). The controller 180 compares the first and the second touch pressure to control at least one of the first and the second content to be changed (S51). Here, at least one change of the first and the second content corresponds to a deletion of content, a movement of content display location, a store and deletion of content, a change of the storage space of content, and the like. Hereinafter, a control method of a mobile terminal based on the plurality of touch inputs will be described in detail.

Figure 14B:
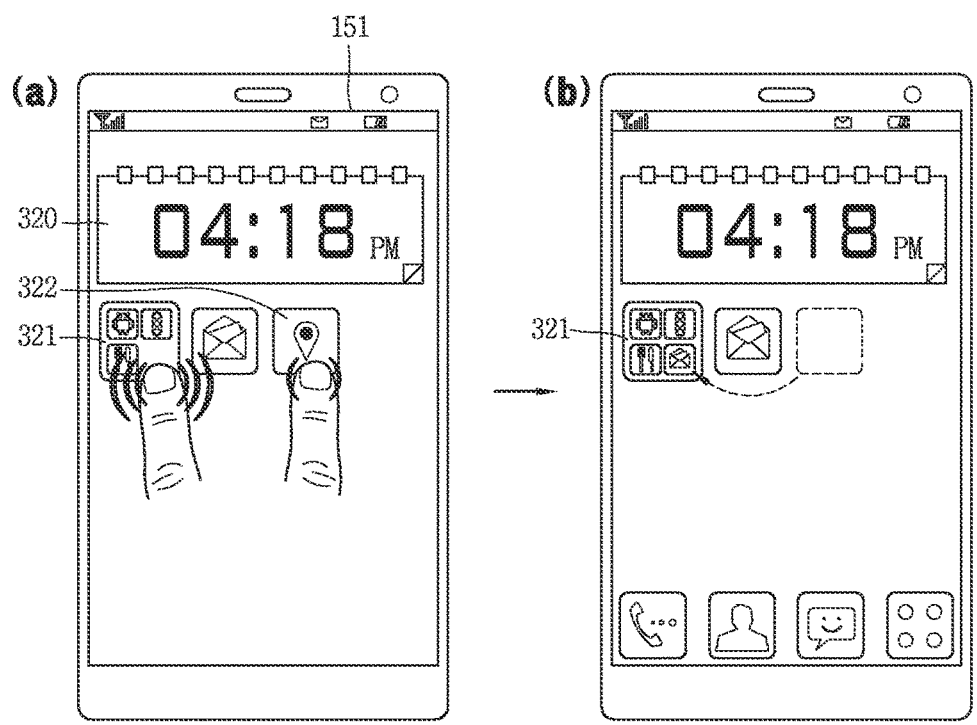
FIGS. 14B through 14G are conceptual views illustrating a control method based on a plurality of touch inputs.

FIGS. 14B through 14G are conceptual views illustrating a control method based on a plurality of touch inputs. FIG. 14B(a) illustrates the display unit 151 displaying screen information 320 containing a first and a second icon 321, 322. For example, the screen information 320 may correspond to a home screen page. The first icon 321 corresponds to a folder icon containing a plurality of icons corresponding to a plurality of applications, and the second icon 322 corresponds to an execution icon corresponding to an application. When a touch input is applied to the first icon 321, an execution icon corresponding to a plurality of applications contained in the first icon is displayed, and when a touch input is applied to the second icon 322, the corresponding application is executed to display an execution screen.

When the first and the second touch coordinates of the first and the second touch input are applied to the first and the second icon 321, 322, the controller 180 selects the first and the second icon 321, 322. The controller 180 senses the first and the second touch pressure of a touch input applied to the first and the second icon 321, 322 and compares them. For example, when the first touch pressure is greater than the second touch pressure, the controller 180 controls the display unit 151 to move the second icon to a folder which is the first icon as shown in FIG. 14B(b). Accordingly, the user can move the selected content to his or her desired region.

Further, the controller 180 can move the first icon 321 to which the first touch input with a larger pressure is applied to a region of the second icon 322. In other words, the controller 180 can change at least one of the first and the second icon 321, 322 based on the user's setting according to the comparison of touch pressures.

Referring to FIGS. 3A, 3B and 5A, when the first and the second touch input are applied different regions of the window 513, the controller 180 can recognize the first and the second touch coordinates through the first and the second sensing layer 514a, 514b, and recognize two touch pressures sensed by the movement extent of the touch sensing unit 514 and the first sensing layer 514a in the region of the first and the second touch coordinates based on the first and the third sensing layer 514a, 154c.

Further, the controller 180 forms a compensation pressure for which each compensation value corresponding to the first and the second touch coordinates is applied to each touch pressure according to a current value based on a distance between the first and the third sensing layer 514a, 154c as the first and the second touch pressure. In other words, the first and the second touch pressure may reflect a user's actually intended pressure difference between the first and the second touch input in a more accurate manner.

Figure 14C:
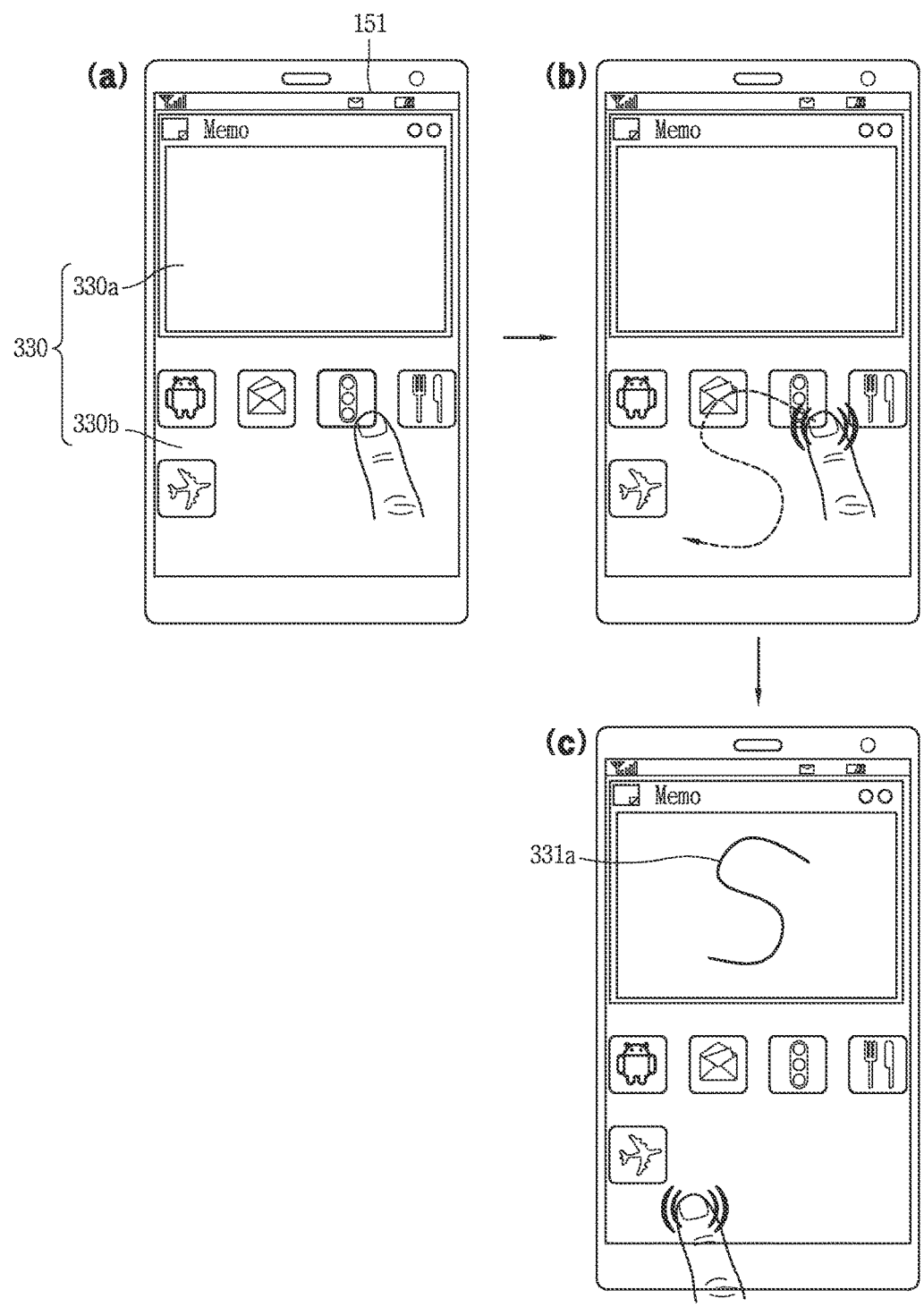

Referring to FIG. 14C(a)-(c), a method of generating a different control command due to a touch pressure will be described. FIG. 14C(a) is a view illustrating the display unit 151 for displaying screen information 330 containing a first and a second display region 330a, 330b distinguished from each other. For example, the first display region 330a may correspond to the execution screen of a memo application for displaying text or an image, and the second display region 330b may correspond to a home screen page containing a plurality of icons.

When a touch input is applied to the second display region 330b as shown in FIG. 14C(b), the controller 180 senses the touch coordinates and touch pressure of the touch input. A content (or icon) contained in the second display region 330b is selected by the touch coordinates. The controller 180 can execute an application corresponding to the content (icon) when the touch pressure is not sensed.

If a touch pressure corresponding to a preset reference pressure is sensed, then the controller 180 can control the first display region 330a even when the reference pressure is not sensed anymore. Furthermore, when a touch pressure corresponding to the preset reference pressure is sensed again, the controller 180 can control the second display region 330b using the touch input. However, the present invention is not limited to this, and may be configured to control the first display region 330a only using a touch input on which a touch pressure corresponding to the preset reference pressure is sensed.

Further, upon sensing a touch pressure of the touch input, the controller 180 restricts the control of the second display region 330b based on the touch input. Upon sensing the touch pressure, the controller 180 controls the first display region 330a using the touch input. For example, upon sensing a touch pressure of the touch input, the controller 180 controls the display unit 151 to display an image corresponding to the touch coordinates in the first display region 330a as shown in FIG. 14C(c). In other words, upon sensing the touch pressure, the controller 180 can control the second display region 330b to function as an input window of the first display region 330a.

Figure 14D:
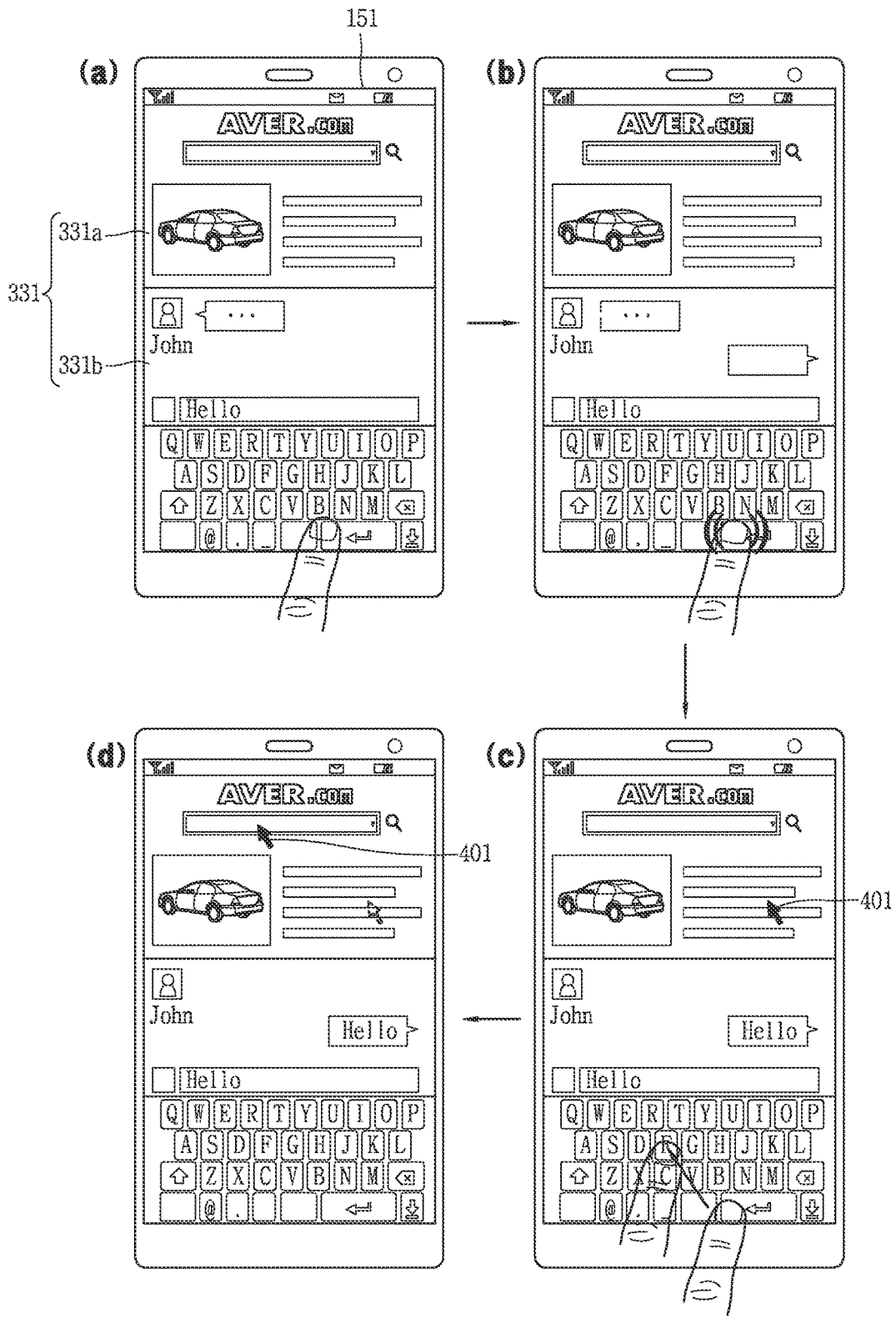

FIG. 14D is a conceptual view illustrating a method of generating a different control command using a distinguished touch pressure. FIG. 14D(a) is a view illustrating the display unit 151 for displaying screen information 331 containing a first and a second display region 331a, 331b distinguished from each other. For example, the first display region 331a corresponds to a web page, and the second display region 331b corresponds to the execution screen of a message application. The controller controls the display unit 151 to display text entered based on a touch input applied to a virtual keyboard displayed in the second display region 331b.

In this instance, the controller 180 can recognize touch coordinates and a touch pressure for a touch input applied to the second display region 331b. In other words, the controller 180 controls the display unit 151 to display text on a virtual keyboard corresponding to the touch coordinates.

When the touch pressure of the touch input does not correspond to the extent that an external force is intentionally applied by the user, in other words, referring to FIG. 11, when the touch input is determined to contain an external force less than the second force, the controller changes the second display region 331b by the touch input. In other words, the first display region 331a is not controlled by the touch input as shown in FIG. 14D(b).

Further, referring to FIGS. 14D(c) and 14D(d), when determined to contain an external force greater than the second force by the touch input, the controller 180 controls the first display region 331a based on the touch input. Specifically, the controller 180 controls the display unit to display a pointer 401 corresponding to the touch coordinates in the first display region 331a. The location of the pointer 401 displayed in the first display region 331a may correspond to touch coordinates on the second display region 331b.

The controller 180 controls the display unit 151 to move the location of the pointer 401 based on the touch coordinates changed by the movement of the touch input. While the touch coordinates are changed (namely, while a consecutive touch input is applied), the touch pressure may not be necessarily maintained above a preset pressure.

In addition, a touch pressure for controlling the first display region 331a is defined as a first touch pressure. When a second touch pressure greater than the first touch pressure is recognized while displaying the pointer 401, the controller can select content corresponding to the pointer 401 and displayed in the first display region 331a. For example, the controller may control the display unit to display another screen information linked to the content in the second display region 331b based on a touch input on the second display region 331b containing the second touch pressure.

Referring to FIGS. 3A and 3B, the controller 180 recognizes touch coordinates by the touch input and determines which one of the first and the second display region 331a, 331b the touch coordinates correspond to the touch coordinates. The controller 180 controls the display unit to sense a touch pressure of the touch input when the touch coordinates are contained in the second display region 331b, and display the pointer 401 in the first display region 331a when the touch pressure is determined to be greater than a preset reference pressure based on the first sensing layer 514a moving closer to the third sensing layer 514c.

Figure 14E:
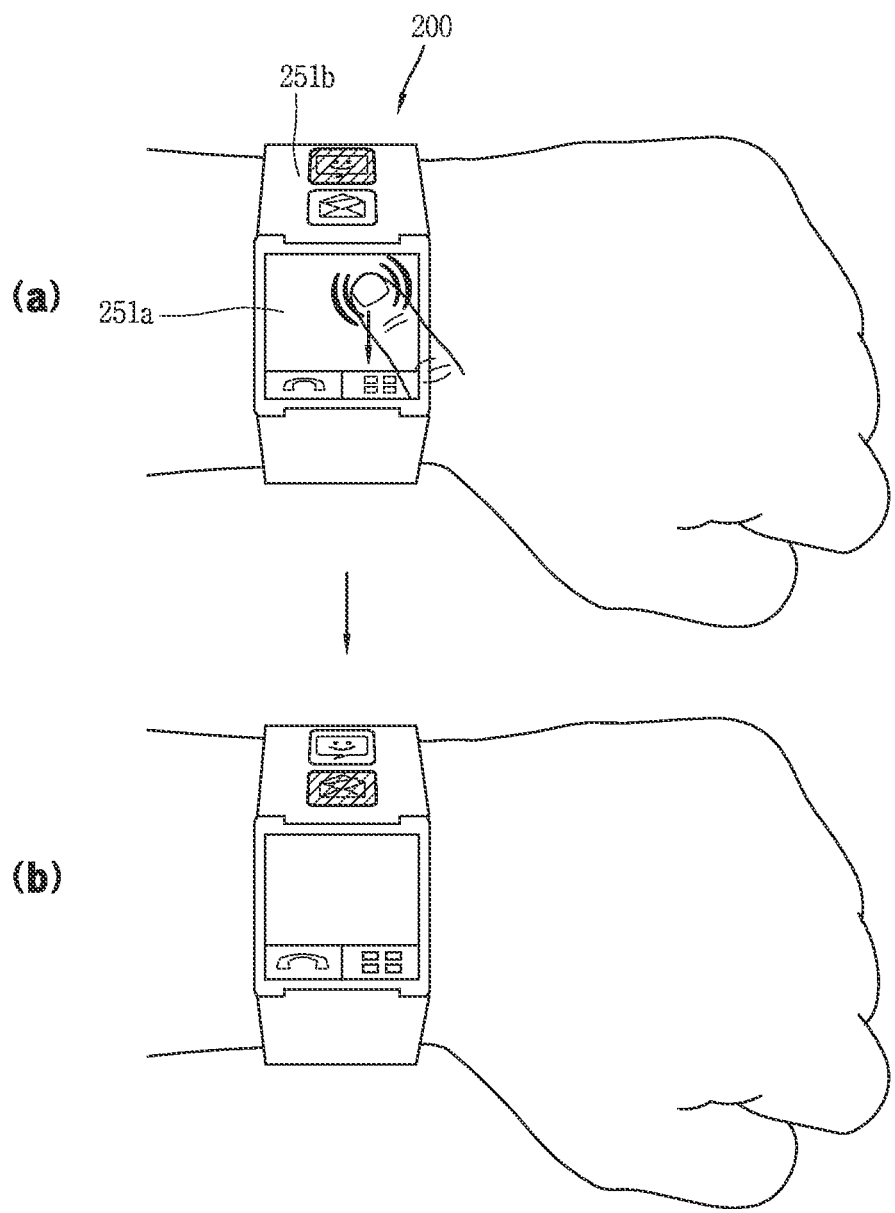

FIG. 14E is a conceptual view illustrating a control method using a touch input in a watch type mobile terminal 200. As shown in FIG. 14E(a), the watch type mobile terminal 200 includes a body having a first display unit 251*a* and a band configured to be wearable on a user's wrist to have a second display unit 251*b*. The first display unit 251*a* receives a user's touch input to control the mobile terminal 200. The second display unit 251*b* may display preset screen information. For example, the second display unit 251*b* can display an icon or the like corresponding to a specific application. The second display unit 251*b* may be configured to receive a user's touch input, but is not limited to this.

The controller 180 controls screen information displayed on the first display unit 251*a* based on a touch input applied to the first display unit 251*a*. However, as shown in FIG. 14E(b), when a touch pressure is sensed by the touch input, the controller 180 can control the second display unit 251*b* based on a touch input applied on the first display unit 251*a*. Upon sensing the touch pressure, the controller 180 can select one icon on the second display unit 251*b* based on the touch coordinates of the touch input.

In addition, when an icon displayed on the second display unit 251*b* is selected, the controller 180 can display the execution screen of an application corresponding to the icon on the first display unit 251*a*. Accordingly, a touch sensor may not be necessarily formed on a structure for fixing it to the user's wrist, and the controller can apply a touch input to the first display unit to control the display unit on the band when a touch is difficult in a used state of the watch type mobile terminal.

Figure 14F:
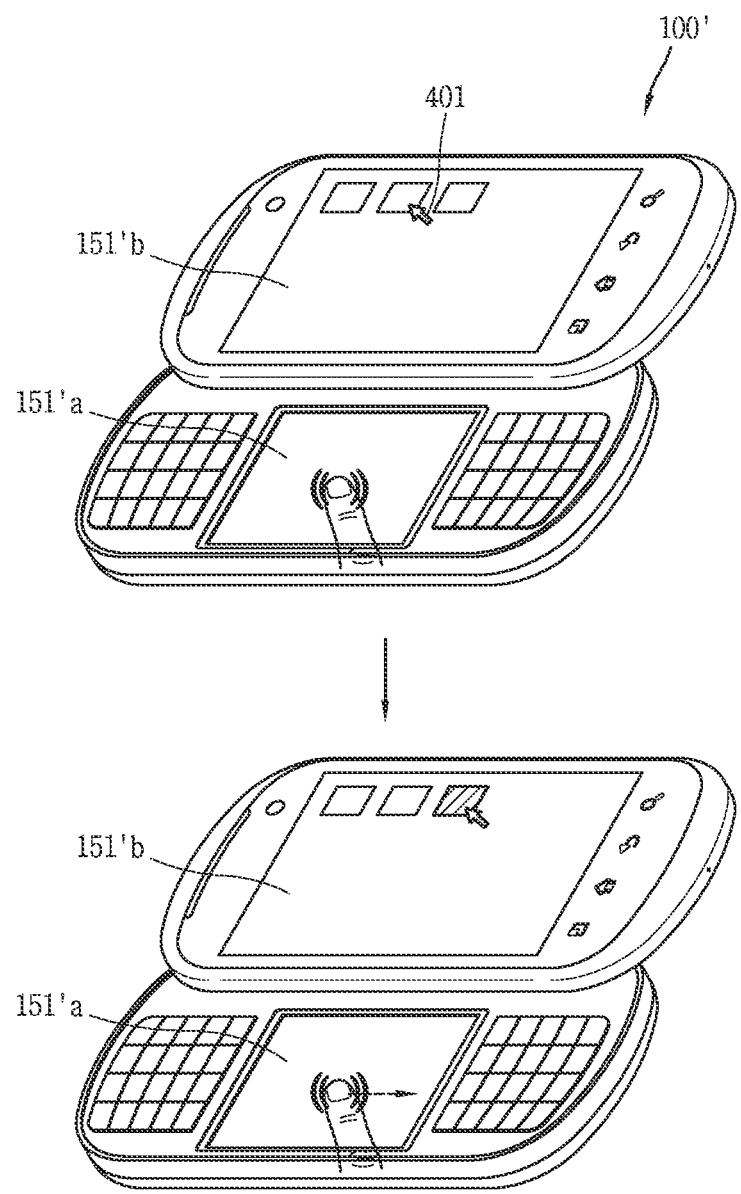

Next, FIG. 14F is a conceptual view illustrating a control method based on a touch pressure of the touch input in a mobile terminal 100' including a first and a second display unit 151'*a*, 151'*b*, which are distinguished from each other. The mobile terminal according to FIG. 14E includes a first and a second boy connected to each other in a movable manner. The first and the second bodies are coupled to each other in a slidable or foldable manner. The first and the second bodies may include a first and a second display unit 151'*a*, 151'*b*, which are distinguished from each other.

The controller 180 controls the first display unit 151'*a* based on a touch input applied to the first display unit 151'*a*. However, when the touch pressure of the touch input is sensed, the controller 180 restricts the control of the first display unit 151'*a* based on the touch input. In other words, the controller 180 controls the second display unit 151'*b* based on the touch pressure of the touch input as shown in FIG. 14F(a) and (b). Furthermore, the controller 180 can control the second display unit 151'*b* to display the pointer 401 corresponding to a touch input applied to the first display unit 151'*a* based on the touch pressure.

Figure 14G:
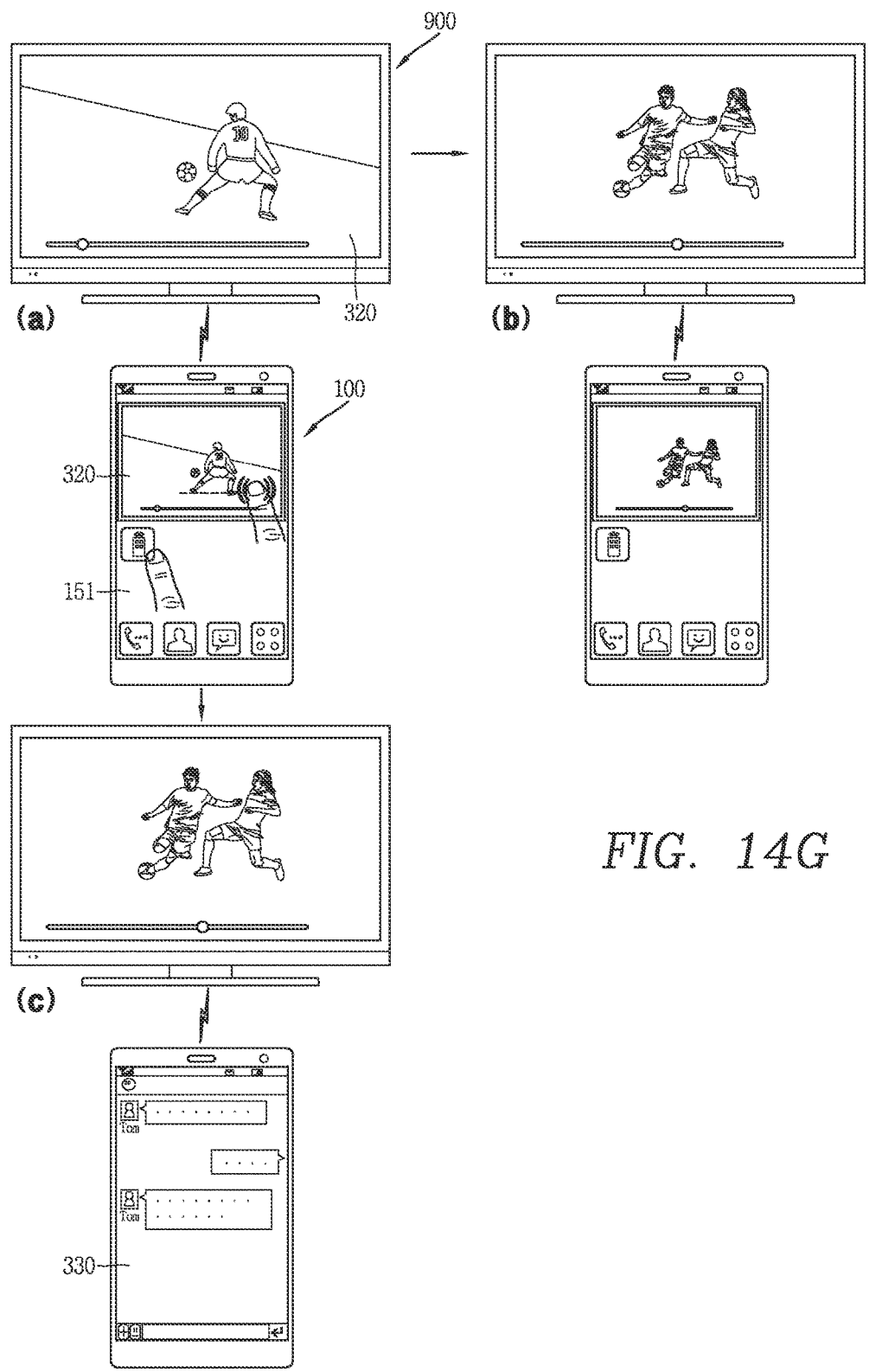

FIG. 14G is a conceptual view illustrating a control method of a mobile terminal connected to an external device. As shown in FIG. 14G(a), the mobile terminal 100 according to the present embodiment is linked to an external device 900. For example, a video image 320 displayed in one region of the display unit 151 can be displayed substantially in the same manner by the external device 900.

When a touch input is applied to the display unit 151 and a touch pressure corresponding to a reference pressure is not sensed by the touch input as shown in FIG. 14G(a) and (b), the controller 180 controls the mobile terminal based on the touch input. Referring to FIGS. 14G(a) and (c), the controller 180 can execute an application based on the touch input.

Further, when the touch pressure of the touch input corresponds to a reference pressure, the controller 180 can control the external device 900 based on the touch input. For example, when a touch input containing a touch pressure corresponding to the reference pressure is sensed, the controller 180 can control the wireless communication unit 110 to transmit a wireless signal for adjusting the screen of the external device.

Furthermore, as illustrated in the drawing, when a video image substantially the same as the external device is displayed on the display unit 151, the controller 180 can control the display unit 151 at the same time based on the touch input. However, the controller 180 can control the external device based on a touch input containing a touch pressure while the mobile terminal is connected to the external device even if the same image as that of the external device is not displayed on the mobile terminal.

Figure 15:
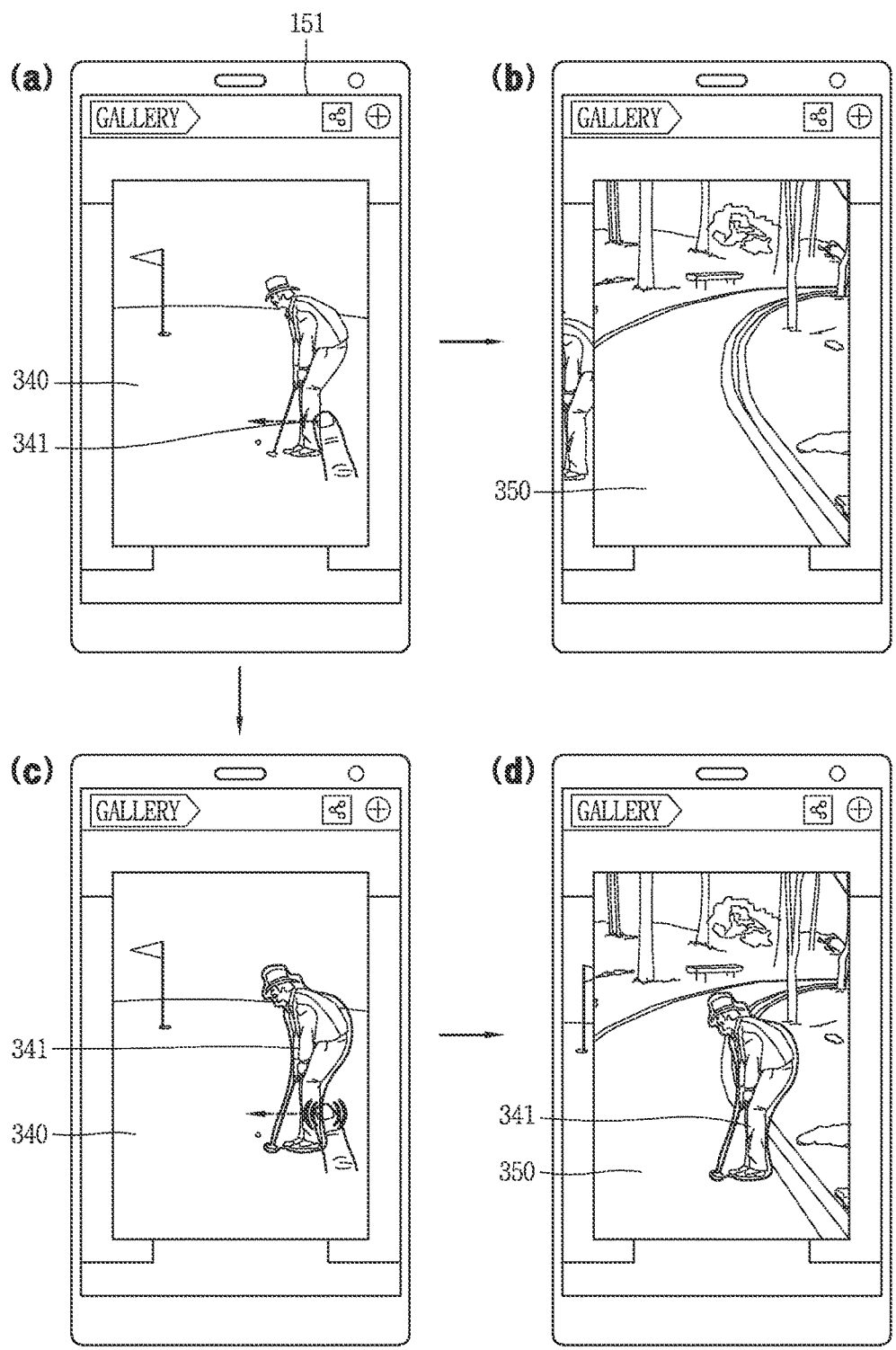
FIG. 15 is a conceptual view illustrating a control method for executing a preset function using a touch pressure.

Next, FIG. 15 is a conceptual view illustrating a control method of executing a preset function by a touch pressure. FIG. 15(*a*) is a conceptual view illustrating a display unit 151 for displaying screen information 340 containing an image stored in the memory 170. For example, the screen information may correspond to the execution screen of a gallery application, and one whole image may be displayed at the center of the display unit, and part of two images may displayed at the same time.

Referring to FIGS. 15(*a*) and 15(*c*), the controller 180 controls the display unit to display another image at the center based on a touch input applied to the display unit 151. Here, the touch input may correspond to a dragging type touch input for which a touch pressure is not sensed when the touch input contains a touch pressure less than a reference pressure (when a touch pressure is not sensed).

Referring to FIGS. 15(*a*), 15(*b*) and 15(*c*), the controller 180 selects content 341 corresponding to the touch coordinates when the touch pressure of the touch input is sensed (or a touch pressure above a recommended expiration date pressure is sensed). For example, the controller 180 selects content corresponding to the touch coordinates at the time of sensing the touch pressure.

The controller 180 controls the display unit 151 to apply and display the content 341 in a region to which a consecutive touch input is applied subsequent to selecting the content 341. For example, the controller 180 can separate the content from the image to temporarily store it (cut, partial copy). The display unit 151 displays the another image based on the consecutive touch input. When the touch input is released, the controller 180 controls the display unit 151 to display the content along with the another image as shown in FIG. 15(*d*).

Upon selecting the content 341, the controller 180 can control the display unit 151 to display the content 341 along a region to which the touch input is applied even if the touch pressure is released. In other words, when the touch pressure of the touch input is sensed, the controller 180 can control to temporarily store content corresponding to the touch coordinates so as to change the display location or storage location.

Thus, referring to FIGS. 3A and 3B in addition, when the deformation of the window 513 is sensed such that the first and the third sensing layer 514*a*, 154*c* draw close to each other, the controller 180 can select content corresponding to the touch coordinates and execute a function for temporarily storing the content.

Figure 16A:
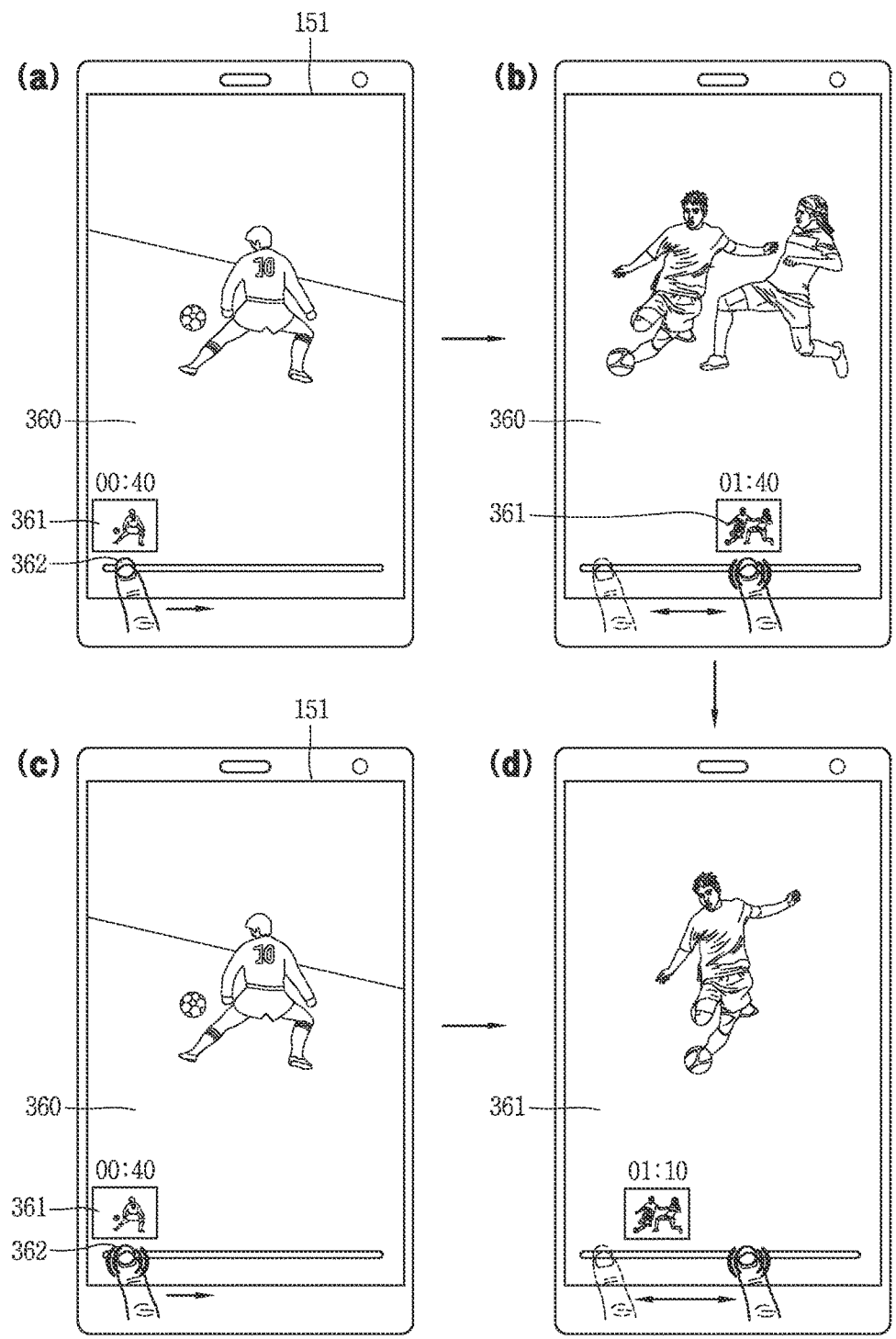
FIGS. 16A through 16C are conceptual views illustrating a method for executing another function based on a touch pressure.
Figure 16B:
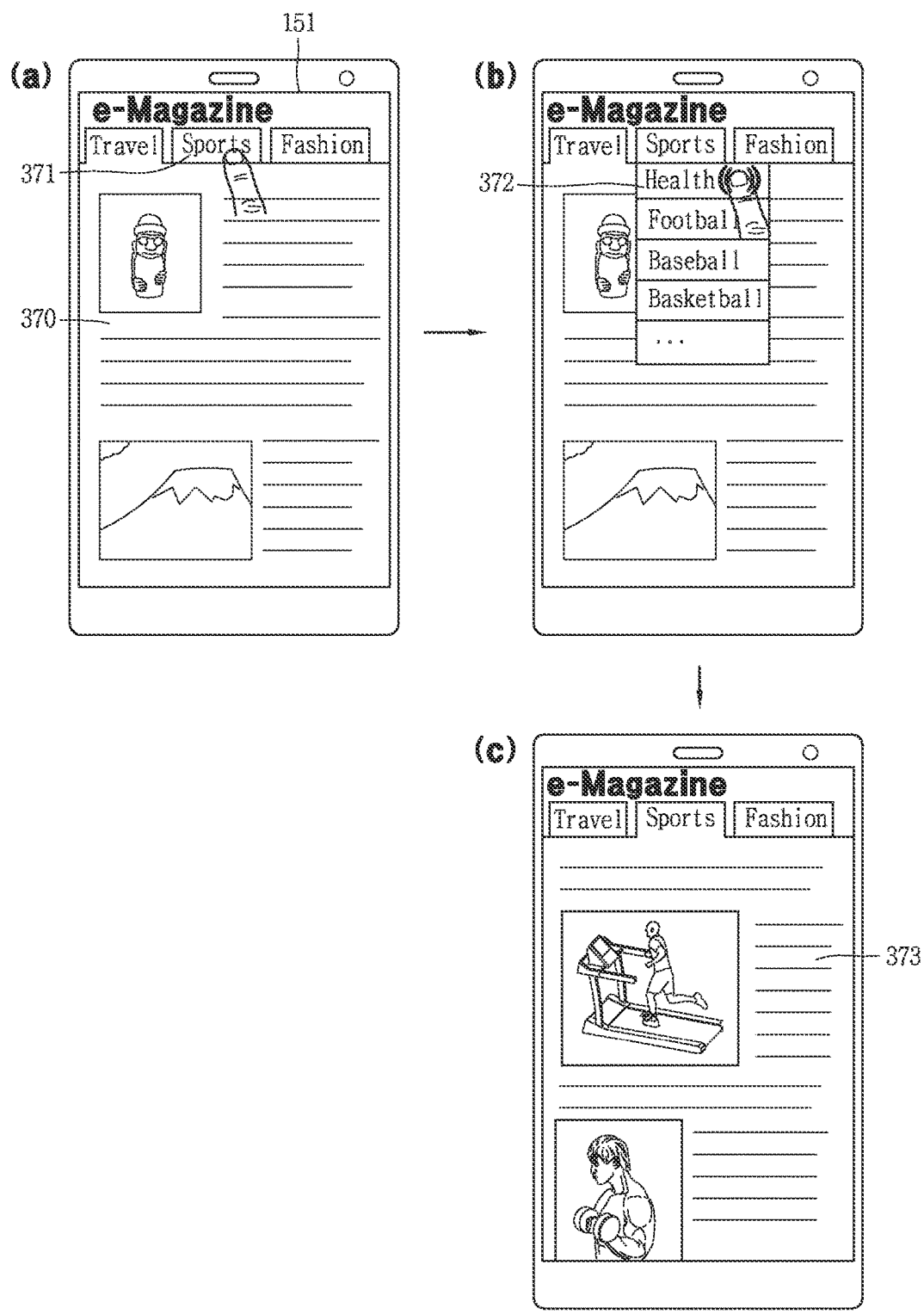
Figure 16C:
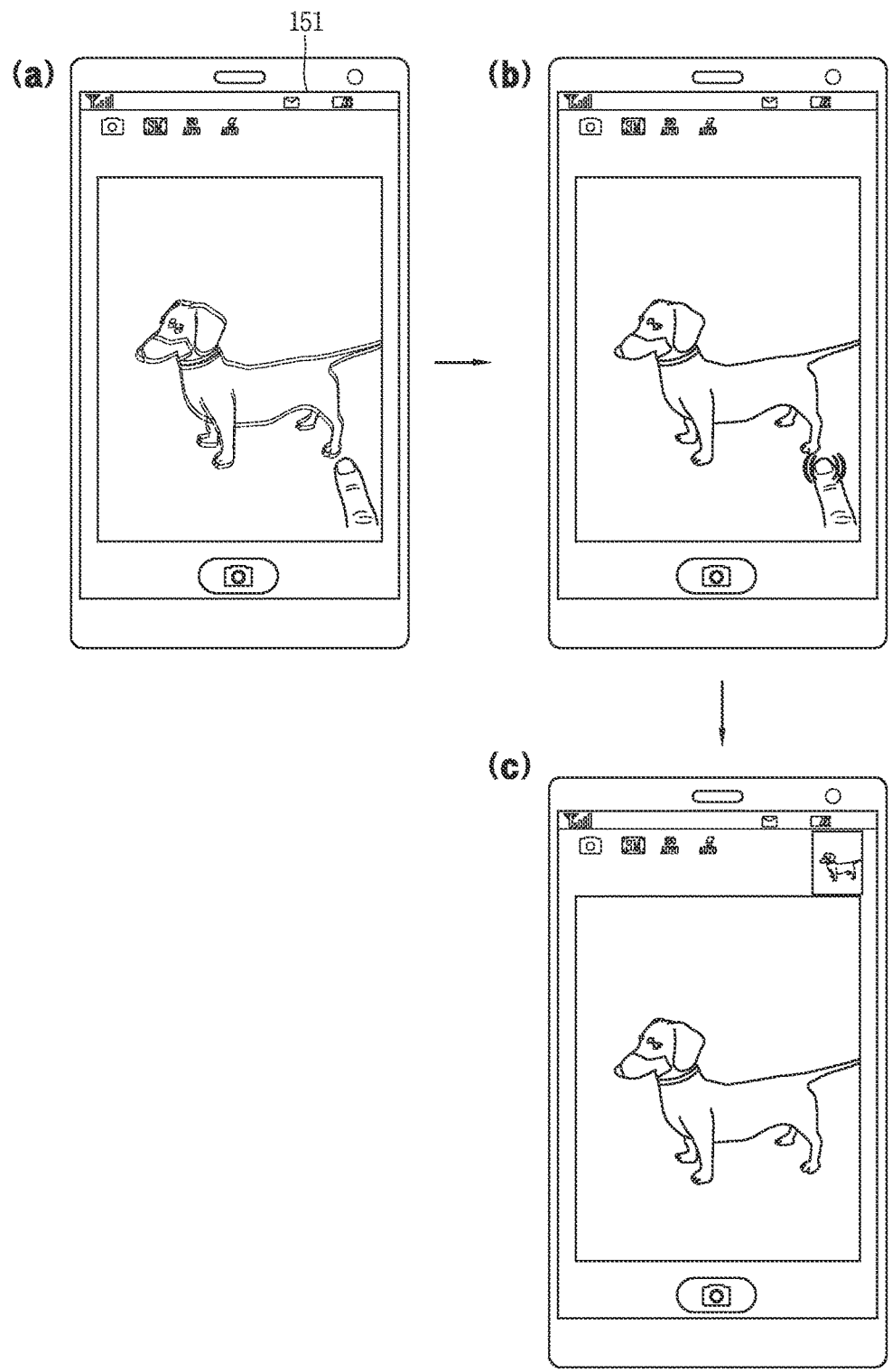

FIGS. 16A through 16C are conceptual views illustrating a control method for executing another function based on a touch pressure. FIG. 16A(*a*) is a view illustrating a display unit 151 for displaying the playback screen of a video file containing image frames arranged as time passes. The play back screen includes a play bar indicating the display status of a video file.

When a touch pressure less than a reference pressure is contained by a touch input applied to the play bar (when a touch pressure is not sensed), the controller 180 controls the display unit 151 to display a playback image 361 corresponding to the play bar based on the touch coordinates of the touch input as shown in FIG. 16A(a). The controller 180 controls the display unit 151 to move the playback pointer 362 such that the touch coordinates correspond to a change, and display the playback screen of a playback region corresponding to the moved touch coordinates of the touch input. For example, when the touch coordinates is changed by a distance "a", the controller 180 can change the playback region to one hour later.

Further, referring to FIG. 16A(b), when a touch pressure above a reference pressure is sensed for a touch input applied to the play bar, the controller 180 controls the display unit 151 to display the playback screen of a playback region corresponding to compensation coordinates compensated by a preset ratio due to a change of the touch coordinates, and display the play pointer 362 at a position corresponding to the playback region.

with reference to FIG. 16A(c) and (d), the controller 180 can set the ratio by the touch pressure. For example, the ratio may be set to ½ when a first touch pressure is sensed, and ⅓ when a second touch pressure greater than the first touch pressure is sensed. Accordingly, when the ratio is set to ½, the controller may change the playback region to 30 minutes later if the touch coordinates are changed by the distance "a".

According to the present embodiment, a method of changing a playback region has been described, but a mobile terminal according to the present embodiment may control a range of the function by varying a touch pressure in performing substantially the same function. For example, when a handwriting (outputting a shape) is performed using a hand, it may be possible to change the thickness of a shape being displayed when a larger touch pressure is sensed by applying a larger external force. Accordingly, the user can slightly control a function or form an image using a finger with a wide touch region.

Next, FIG. 16B(a) is a view illustrating a display unit 151 for displaying a webpage 370. The webpage 370 may include at least one content 371 containing low-level information 372. When the touch pressure of a touch input applied to the content 371 contains a touch pressure less than a reference pressure (when a touch pressure is not sensed), the controller 180 controls the display unit 151 to display the low-level information as shown in FIG. 16B(b).

The low-level information contains hyperlink information, and provides another screen information by the hyperlink. When the touch pressure of a touch input applied to the low-level information is sensed, the controller 180 controls the display unit to display another information 373 connected to the low-level information as shown in FIG. 16B (b).

FIG. 16C is a conceptual view illustrating a control method of controlling the function of the camera 121 based on the touch input. When the camera 121 is activated, the controller 180 controls the display unit 151 to display a preview image as shown in FIG. 16C(a).

When the touch pressure of a touch input applied to the display unit 151 contains a touch pressure less than a reference pressure (when a touch pressure is not sensed), the controller 180 controls the camera 121 to adjust focus on a subject corresponding to the touch coordinates of the touch input as shown in FIG. 16C(b). When the touch pressure is greater than the reference pressure the image is captured as shown in FIG. 16C(c)

In other words, referring to FIGS. 16A through 16C and FIG. 3A, when the deformation of the window 513 is sensed in which the first and the third sensing layer 514a, 154c draw close to each other, the controller 180 can execute a distinguished function on substantially the same touch coordinates or execute substantially the same function by applying a different range thereto.

Further, when the touch pressure of the touch input is sensed, the controller 180 controls the camera 121 to image (i.e. capture) the preview image as shown in FIG. 16C(c). On the drawing, an icon for controlling the capture is displayed, but a graphic image for controlling the capture may not be required according to the present embodiment.

Figure 17:
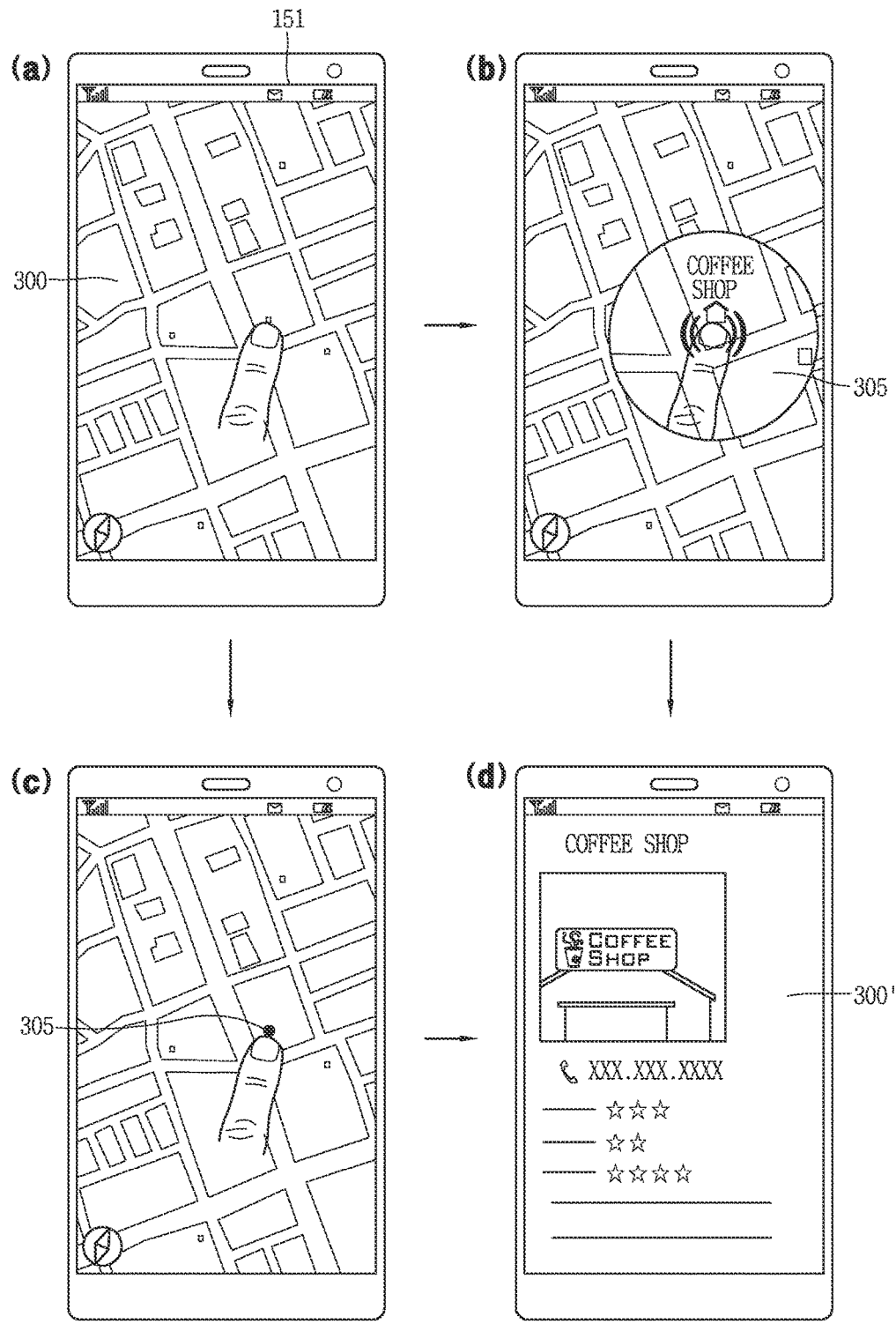
FIG. 17 is a conceptual view illustrating a control method according to the sensing of touch coordinates and the sensing of a touch pressure.

Next, FIG. 17 is a conceptual view illustrating a control method according to the sensing of touch coordinates and the sensing of a touch pressure. Referring to FIGS. 17(a) and 17(b), when the touch input is applied and the touch pressure is not sensed when the map screen 300 is displayed on the display unit 151, the controller 180 controls the display unit 151 to display the enlarged image 305 of a region corresponding to the touch coordinates.

When the touch pressure of the touch input is sensed, the controller 180 controls the display unit 151 to display relevant information 300' corresponding to the touch coordinates as shown in FIG. 17(d). Accordingly, the user can check a region to be selected by a touch input in advance when the size of an image to be selected is small.

Further, referring to FIGS. 17(a) and 17(b), when the touch input is sensed and the touch pressure of the touch input contains a touch pressure less than a reference pressure (when a touch pressure is not sensed), the controller 180 controls the display unit 151 to display a cursor 305 in a region corresponding to the touch coordinates of the touch input. Accordingly, the user can check an image to be selected when applying a touch pressure.

Figure 18A:
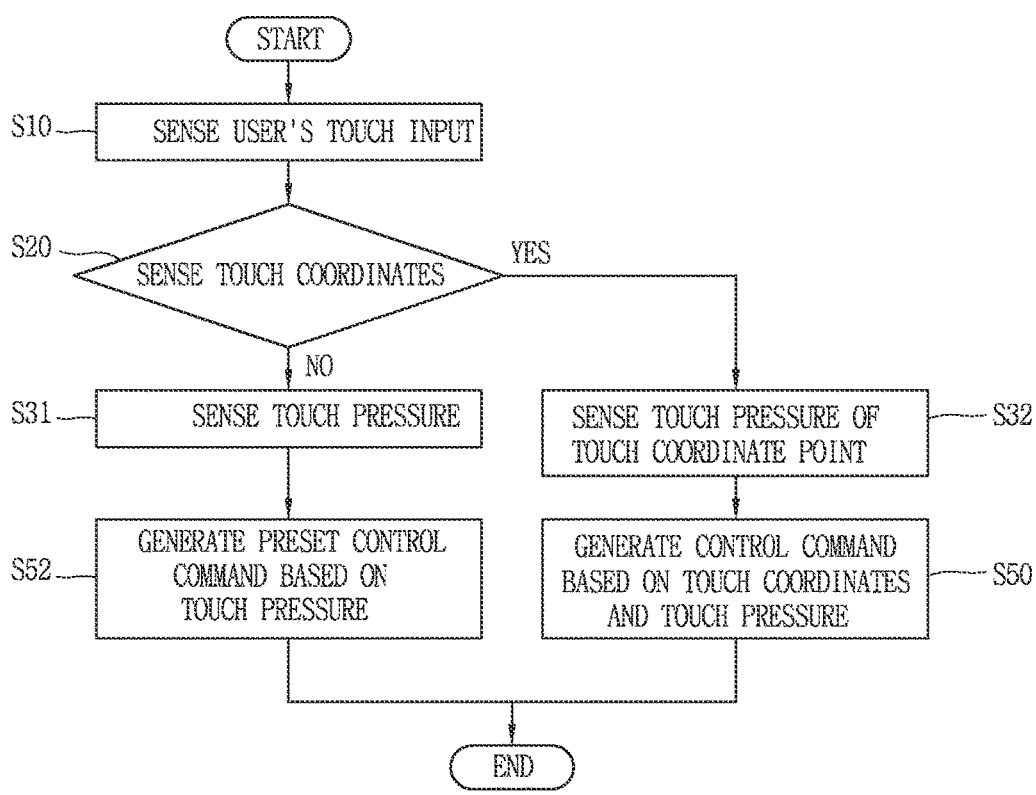
FIG. 18A through 18C are conceptual views illustrating a control method when the sensing of touch coordinates is restricted by a touch sensing unit.
Figure 18B:
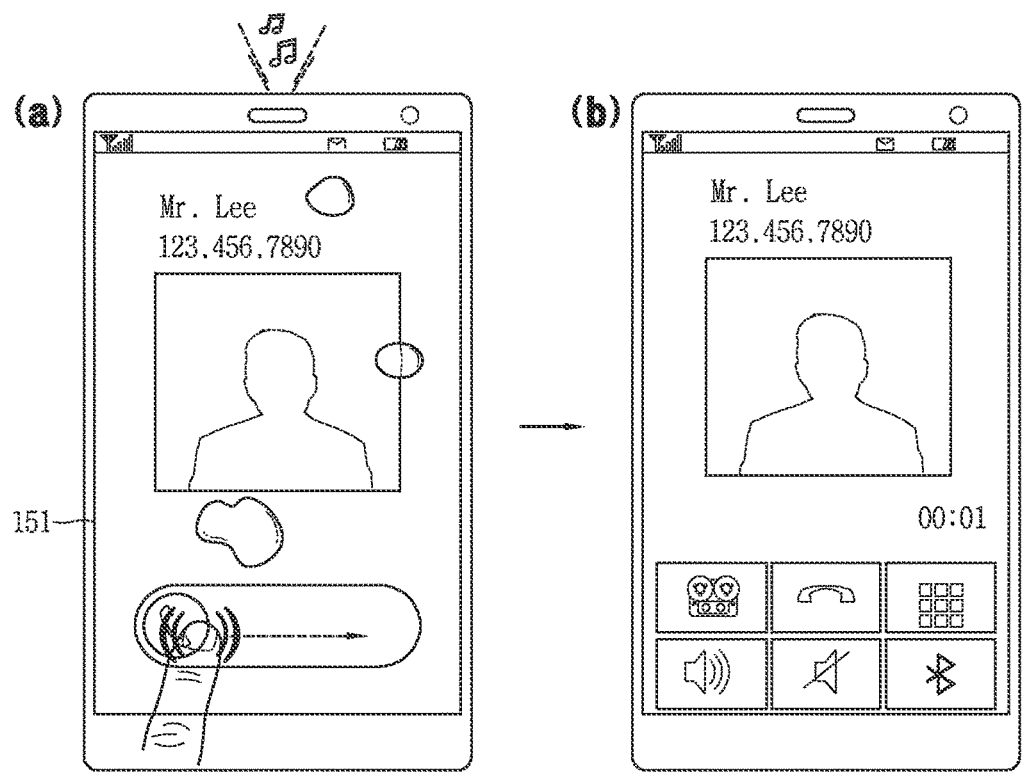
Figure 18C:
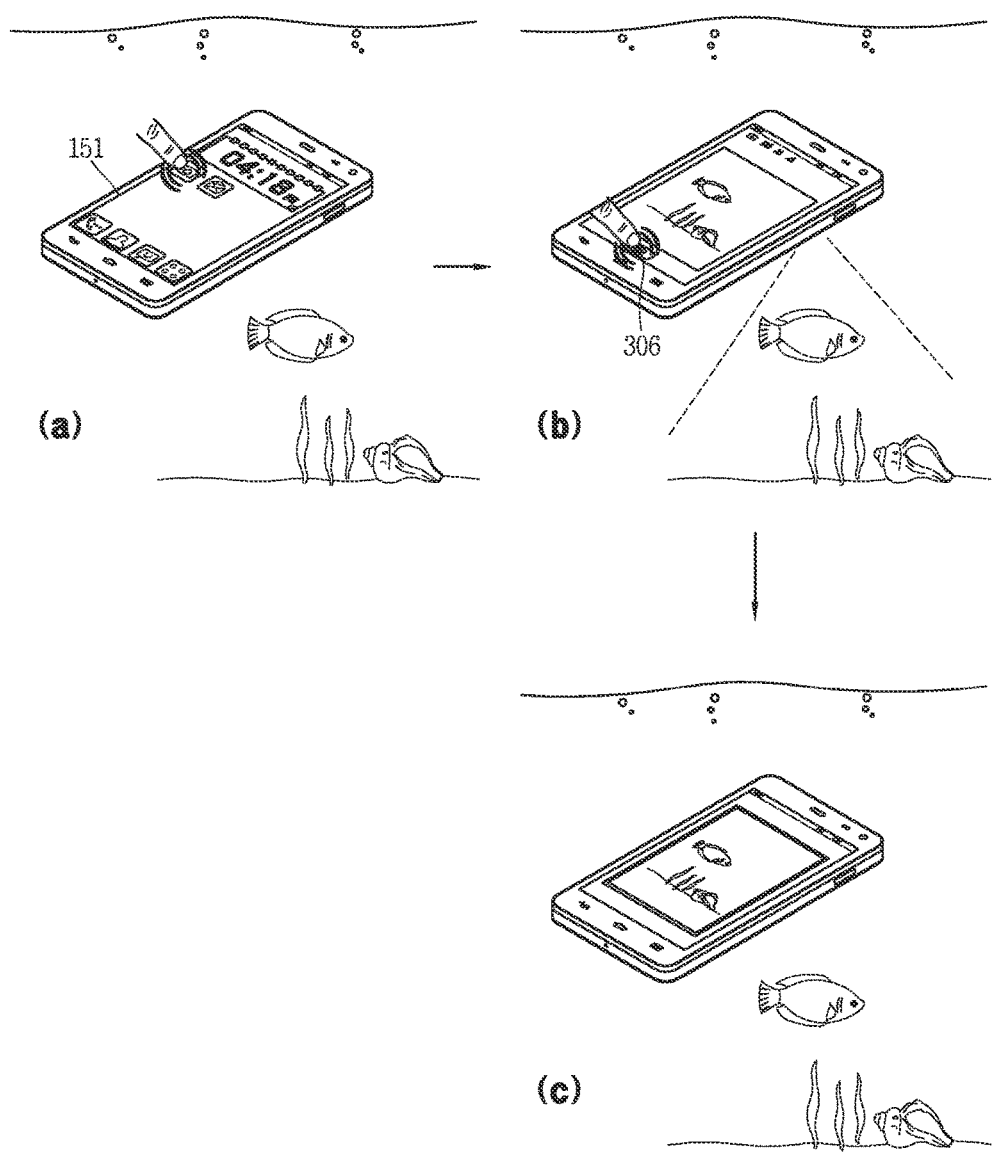

FIG. 18A is a flowchart and FIGS. 18B and 18C are conceptual views illustrating a control method when the sensing of touch coordinates is restricted by a touch sensing unit. Referring to FIG. 18A, the touch sensing unit 514 senses a user's touch input (S10). The controller 180 senses touch coordinates using the touch input (S20). Upon sensing the touch coordinates, the controller 180 senses a touch pressure of the touch coordinate point (S32). The controller 180 can compensate the touch pressure based on the touch coordinate point. The controller 180 forms a control command according to the touch coordinates and the touch pressure (S50).

Further, when the touch coordinates are not sensed, the controller 180 senses the touch pressure (S31), and generates a preset control command based on the touch pressure (S52). For example, when the touch coordinates are not sensed corresponds to a case where an electricity conducting liquid such as water or the like is smeared on the display unit 151.

Thus, when a plurality of icons are displayed and the sensing of the touch coordinates is restricted on the display unit 151, a preset function may be activated regardless of a region to which a touch input is applied on the display unit 151. However, even In this instance, a different function may be executed according to the touch pressure.

FIG. 18B is a view illustrating a situation in which a call is received when the touch coordinates are not sensed. When a call is received, the display unit 151 displays an incoming screen, and the incoming screen includes an icon for receiving a consecutive touch input to connect a call as shown in FIG. 18B(a).

However, when the touch coordinates are not sensed by the touch input, the controller 180 controls the touch sensing unit to sense a touch pressure of the touch input. In other words, upon sensing a touch pressure above a preset reference pressure, the controller 180 receives the call as shown in FIG. 18B(b).

Here, the touch input containing the touch pressure can be applied to any region of the display unit 151. In other words, it may be applied to an icon for connecting to a call, but may be also applied to any other region thereof. Accordingly, even when the touch coordinates are not sensed due to contaminants on the display unit 151, the controller 180 can control the required functions based on a touch pressure.

FIG. 18C is a conceptual view illustrating a control method based on a touch pressure when a mobile terminal is located in water. When the mobile terminal is located in water, the controller 180 controls the display unit 151 to restrict a function for sensing the touch coordinates, and receive a touch pressure of the touch input as shown in FIG. 18(*a*).

The controller 180 executes a preset function based on a touch pressure of the touch input applied to the display unit 151. For example, upon sensing a touch pressure within a preset pressure range, the controller 180 activates the camera as shown in FIG. 18C(b). Though it is illustrated that a touch input is applied to an icon on the drawing, a camera function may be activated by a touch input applied to one region of the display unit 151.

However, upon sensing a touch pressure within a different range is sensed, the controller 180 can activate a different function. When the camera function is executed and a capture application is activated, a preset function of an application corresponding to the touch pressure is executed. For example, the controller 180 controls the camera to adjust focus when a first touch pressure is sensed, and acquire the image when a second touch pressure is sensed as shown in FIG. 18C(c). As a result, the user can apply a touch pressure to control the mobile terminal even in water where touch coordinates are not sensed.

The present invention encompasses various modifications to each of the examples and embodiments discussed herein. According to the invention, one or more features described above in one embodiment or example can be equally applied to another embodiment or example described above. The features of one or more embodiments or examples described above can be combined into each of the embodiments or examples described above. Any full or partial combination of one or more embodiment or examples of the invention is also part of the invention.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A mobile terminal, comprising:
a body configured to form an external appearance of the terminal;
a touch screen including a touch sensor and disposed at a front side of the body;
a window formed on the touch screen;
a deformation region deforms with at least one region of the window where a touch input occurs on the window; and
a force sensing layer detects a force of the touch input by sensing a change of capacitance occurred on the force sensing layer and being separated from the touch sensor by interposing the deformation region between the touch sensor and the force sensing layer; and
a controller configured to:
display content in a first display region and a virtual keyboard in a second display region, and
display the content in the first display region based on the touch input applied to the second display region,
wherein the content displayed in the first display region is an indicator based on the touch input applied to the virtual keyboard, if the touch input is determined as a force touch based on the detected force of the touch input via the force sensing layer,
wherein the indicator moves in the first region based on a movement of the touch input,
wherein the content displayed in the first display region is a text entered based on the touch input applied to the virtual keyboard, if the touch input is not determined as the force touch based on the detected force of the touch input via the force sensing layer, and
wherein the indicator moves based on the movement of the touch input not necessarily maintaining the force of the force touch, after the touch input is determined as the force touch.

2. The mobile terminal of claim 1, wherein the touch screen comprises a TFT layer, a color filter layer, and a polarizer layer, and
wherein the touch screen comprises first and second touch sensing layers disposed between the polarizer and the TFT layer.

3. The mobile terminal of claim 2, wherein the first and second touch sensing layers detect a position of the touch input by sensing a change of capacitance occurred on the first touch sensing layer and second touch sensing layer.

4. The mobile terminal of claim 2, wherein one of the first touch sensing layer and the second touch sensing layer is a transmit (Tx) layer and the other one is receive (Rx) layer.

5. The mobile terminal of claim 4, wherein the first touch sensing layer comprises a plurality of first sensing lines and the second touch sensing layer comprises a plurality of second sensing lines.

6. The mobile terminal of claim 5, wherein the controller executes a specific control command based on the detected force of the touch input.

7. The mobile terminal of claim 5, further comprising:
an insulating layer formed in regions at which the plurality of first sensing lines and the plurality of second sensing lines are crossed.

8. The mobile terminal of claim 7, wherein the plurality of first sensing lines and the plurality of second sensing lines are formed on a same layer of the touch screen.

9. The mobile terminal of claim 1, wherein the force sensing layer detects the force of the touch input when at least one region of the window where the touch input is applied is deformed.

10. The mobile terminal of claim 9, wherein the deformation region includes at least one of a gas, a fluid and a gel type solid deformed by an external force applied to the window.

11. The mobile terminal of claim 1, wherein the controller is further configured to display the indicator continuously on one portion of the first display region on the touch screen, after the touch input is released.

12. The mobile terminal of claim 11, wherein the controller is further configured to select one portion of the information displayed in the first display region on the touch screen when the force of the touch input is detected again while the indicator is displayed.

13. The mobile terminal of claim 11, wherein the indicator is displayed within a limited portion of the first display region.

14. The mobile terminal of claim 1, wherein the touch screen comprises an LCD panel or an OLED panel.

* * * * *